US011596974B2

(12) United States Patent
Nishi

(10) Patent No.: US 11,596,974 B2
(45) Date of Patent: Mar. 7, 2023

(54) MIST GENERATOR, MIST FILM FORMATION METHOD AND MIST FILM FORMATION APPARATUS

(71) Applicant: NIKON CORPORATION, Tokyo (JP)

(72) Inventor: Yasutaka Nishi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 17/162,609

(22) Filed: Jan. 29, 2021

(65) Prior Publication Data

US 2021/0291222 A1 Sep. 23, 2021

Related U.S. Application Data

(63) Continuation of application No. PCT/JP2019/028198, filed on Jul. 18, 2019.

(30) Foreign Application Priority Data

Aug. 1, 2018 (JP) ............................ JP2018-144806

(51) Int. Cl.
*B05C 9/10* (2006.01)
*B05C 9/14* (2006.01)
(Continued)

(52) U.S. Cl.
CPC ................ *B05D 3/06* (2013.01); *B05B 7/228* (2013.01); *B05C 9/10* (2013.01); *B05C 9/14* (2013.01); *B05D 1/12* (2013.01); *H01L 21/6715* (2013.01)

(58) Field of Classification Search
USPC .......................... 118/300, 641-643, 612, 58
See application file for complete search history.

(56) References Cited

U.S. PATENT DOCUMENTS 4,689,247 A * 8/1987 Doty ...................... C03C 17/22 136/260
5,614,252 A * 3/1997 McMillan ........... C23C 18/1216 427/96.7

(Continued)

FOREIGN PATENT DOCUMENTS

JP 4-502939 A 5/1992
JP 2000-87249 3/2000

(Continued)

OTHER PUBLICATIONS

International Search Report, PCT/ISA/210, dated Oct. 8, 2019, in corresponding International Patent Application No. PCT/JP2019/028198.

(Continued)

*Primary Examiner* — Yewebdar T Tadesse

(57) ABSTRACT

A mist generating apparatus sprays a surface of an object (P) to be treated with a carrier gas (CGS) of mist (Mst) of a solution containing fine particles or molecules of a material substance, so that a layer of the material substance is deposited on the surface of the object (P) to be treated. The mist generating device includes a mist generator (14) for atomizing the solution to feed the carrier gas (CGS) containing the mist (Mst), and an ultraviolet irradiator (20B) for applying ultraviolet rays having a wavelength of 400 nm or lower to the mist (Mst) floating in the carrier gas (CGS) in a flow path extending from the mist generator (14) until the carrier gas (CGS) is sprayed on the surface of the object (P) to be treated.

24 Claims, 26 Drawing Sheets

(51) Int. Cl.

| | |
|---|---|
| ***B05B 7/22*** | (2006.01) |
| ***B05D 3/06*** | (2006.01) |
| ***B05D 1/12*** | (2006.01) |
| *H01L 21/67* | (2006.01) |

(56) References Cited

U.S. PATENT DOCUMENTS

| | | | |
|---|---|---|---|
| 5,962,085 | A | 10/1999 | Hayashi et al. |
| 7,913,643 | B2 | 3/2011 | Goto et al. |
| 8,268,408 | B2 | 9/2012 | Miyoshi |
| 2015/0010464 | A1 | 1/2015 | Shirahata et al. |
| 2015/0116680 | A1 | 4/2015 | Tokuhisa |
| 2017/0025644 | A1 | 1/2017 | Nishi et al. |
| 2017/0050204 | A1 | 2/2017 | Shitara et al. |
| 2017/0199463 | A1 | 7/2017 | Owada et al. |
| 2018/0066361 | A1 | 3/2018 | Nara et al. |
| 2018/0122961 | A1 | 5/2018 | Fukata et al. |

FOREIGN PATENT DOCUMENTS

| | | | |
|---|---|---|---|
| JP | 2000-215797 | | 8/2000 |
| JP | 2001-503567 | A | 3/2001 |
| JP | 2006-243306 | A | 9/2006 |
| JP | 2006-269189 | A | 10/2006 |
| JP | 2007-315922 | A | 12/2007 |
| JP | 2011-164318 | A | 8/2011 |
| JP | 2011-164318 | A | 8/2011 |
| JP | 2012-243988 | A | 12/2012 |
| JP | 2013-28480 | A | 2/2013 |
| JP | 2015-27657 | A | 2/2015 |
| JP | 2016-024904 | A | 2/2016 |
| JP | 2016-216238 | A | 12/2016 |
| KR | 10-2008-0050356 | | 6/2008 |
| KR | 10-1018738 | | 3/2011 |
| KR | 10-2018-0074852 | A | 7/2018 |
| WO | WO90/07390 | | 7/1990 |
| WO | WO 2005/010596 | A2 | 2/2005 |
| WO | WO 2013/118353 | A1 | 8/2013 |
| WO | WO 2013/133297 | A1 | 9/2013 |
| WO | WO 2013/133297 | A1 | 9/2013 |
| WO | WO 2013/150677 | A1 | 10/2013 |
| WO | WO 2013/176222 | A1 | 11/2013 |
| WO | WO 2015/159983 | A1 | 10/2015 |
| WO | WO 2016/133131 | A1 | 8/2016 |
| WO | WO 2016/185978 | A1 | 11/2016 |
| WO | WO 2017/154937 | A1 | 9/2017 |
| WO | WO2018/220756 | A1 | 12/2018 |

OTHER PUBLICATIONS

Office Action dated Oct. 5, 2021, in Japanese Application No. 2020-533413.

Office Action, dated Aug. 12, 2022, in corresponding Korean Patent Application No. 10-2021-7006201 (19 pp.).

Office Action, dated Aug. 10, 2022, in corresponding Chinese Patent Application No. 201980063513.8 (15 pp.).

Office Action, dated Nov. 24, 2022, in Japanese Patent Application No. 2022-000849 (11 pp.).

Office Action, dated Dec. 7, 2022, in Taiwan Patent Application No. 108127145 (20 pp.).

* cited by examiner

CC1. 2.45 GHz MICROWAVES, AIR ATMOSPHERE, TEMPERATURE OF 80 °C
CC2. INFRARED LAMP HEATING, Ar REPLACEMENT, TEMPERATURE OF 120 °C
CC3. ULTRAVIOLET (UV LIGHT) IRRADIATION, $N_2$ REPLACEMENT, ROOM TEMPERATURE

MEASUREMENT RESULTS OF RESISTANCE VALUE USING TWO-TERMINAL METHOD

RESISTANCE VALUE (MΩ/$m^2$)

| IRRADIATION MODE \ Ts (SECONDS) | 0 | 20 | 40 | 60 | 80 |
|---|---|---|---|---|---|
| RESISTANCE VALUE OF CHARACTERISTIC EC1 (SECOND PHASE OF SECOND STAGE ONLY) | 20 | 20 | 18 | 15 | 12 |
| RESISTANCE VALUE OF CHARACTERISTIC EC2 (FIRST STAGE ONLY) | 20 | 15 | 12 | 10 | 10 |
| RESISTANCE VALUE OF CHARACTERISTIC EC3 (FIRST STAGE AND FIRST PHASE OF SECOND STAGE) | 20 | 15 | 10 | 7 | 5 |

MIST GENERATOR, MIST FILM FORMATION METHOD AND MIST FILM FORMATION APPARATUS

CROSS-REFERENCE TO RELATED APPLICATIONS

This application is a continuation of International Patent Application No. PCT/JP2019/028198 filed on Jul. 18, 2019, which claims foreign priority benefit under 35 U.S.C. § 119 of Japanese Patent Application 2018-144806 filed on Aug. 1, 2018, in the Japanese Intellectual Property Office, the contents of both of which are incorporated herein by reference.

TECHNICAL FIELD

The present invention relates to a mist generation apparatus (mist generator) that generates mist containing fine material particles (nanoparticles) or material molecules, and to a mist deposition method (mist film formation method) and a mist deposition apparatus (mist film formation apparatus) for spraying the mist from the mist generation apparatus onto a processing target object to deposit a film of a material substance made of the fine particles or molecules on the surface of the processing target object.

BACKGROUND ART

In an electronic device manufacturing process, a film deposition step (film deposition process) is implemented to form a thin film, made of various material substances, on the surface of a substrate (processing target object) on which the electronic device is to be formed. There are various techniques for the deposition method in the deposition step, and in recent years, focus has been placed on a mist deposition method that includes spraying the surface of the substrate with mist generated from a solution containing molecules or fine particles (nanoparticles) of a material substance, reacting or evaporating a solvent component contained in the mist (solution) adhered to the substrate, and depositing a thin film formed of the material substance (metal material or the like) on the surface of the substrate.

International Publication WO 2013/118353 discloses, in order to obtain a transparent conductive film with a low resistance value, spraying a mist of a solution containing zinc (Zn) as the material substance for film deposition onto the surface of a substrate heated to approximately 200° C. in a non-vacuum (in atmosphere) to form a metal oxide film (ZnO: zinc oxide film) on the surface of the substrate, after which the ultraviolet rays with a central wavelength of 254 nm or 365 nm are radiated toward this metal oxide film for a prescribed time, thereby reducing the resistance value of the metal oxide film (zinc oxide film). In International Publication WO 2013/118353, in order to reduce the resistivity of the metal oxide film, the ultraviolet rays continue to be radiated for a relatively long time (30 minutes or 60 minutes), and there is a desire to shorten the time of the resistance reduction process that is a processing step after the deposition of the metal oxide film. As an example, in a case where metal oxide film or the like is formed continuously on the surface of a long and flexible substrate (resin sheet of plastic or the like, metal foil, ultra-thin glass plate, or the like) using the mist deposition method while this substrate is being continuously fed in the length direction, if the time spent radiating the ultraviolet rays onto the metal oxide film after film deposition is long, problems arise such as that it is necessary to use an ultraviolet irradiation furnace that spans a correspondingly long distance (feeding path length), the light source equipment such as an ultraviolet lamp becomes larger, and the amount of power used is increased.

SUMMARY OF INVENTION

A first aspect of the present invention is a mist generation apparatus that sprays a carrier gas, containing mist of a solution that contains fine particles or molecules of a material substance, onto a surface of a processing target object in order to deposit a layer made of the material substance on the surface of the processing target object, the mist generation apparatus comprising a mist generating section configured to atomize the solution and sends out the carrier gas containing the mist; and an ultraviolet irradiation section configured to irradiate the mist floating in the carrier gas with ultraviolet light having a wavelength of 400 nm or less, within a flow path up to where the carrier gas from the mist generating section is sprayed onto the surface of the processing target object.

A second aspect of the present invention is a mist deposition method for spraying a carrier gas, containing mist of a solution that contains fine particles made of a material substance, onto a surface of a processing target object to form a layer made of the material substance on the surface of the processing target object, the mist deposition method comprising a first light irradiation step of irradiating the mist floating and flowing in the carrier gas with first ultraviolet light having a wavelength of 400 nm or less, within a flow path from the mist generating section to before the carrier gas reaches the surface of the processing target object; a spraying step of adhering the mist that has been irradiated with the first ultraviolet light onto the surface of the processing target object; and a second light irradiation step of irradiating a surface region of the processing target object where the fine particles made of the material substance have been deposited due to adhesion of the mist, with second ultraviolet light having a wavelength of 400 nm or less.

A third aspect of the present invention is a mist deposition apparatus that sprays a mist of a solution that contains fine particles made of a material substance onto a surface of a processing target substrate to form a layer made of the material substance on the surface of the processing target substrate, the mist deposition apparatus comprising a mist generating section configured to send out a carrier gas containing the mist generated by atomizing the solution; a mist spouting section configured to spout the carrier gas toward the surface of the processing target substrate; a movement mechanism configured to move the processing target substrate and the mist spouting section relative to each other in a direction along the surface of the processing target substrate; a flow path forming section that includes a surrounding wall surface that forms a flow path of the carrier gas from the mist generating section to the mist spouting section, with at least a portion of the wall surface being formed by a light-transmitting member; and a first ultraviolet irradiation section configured to radiate ultraviolet light having a wavelength of 400 nm or less toward the carrier gas flowing inside the flow path forming section, via the light-transmitting member of the flow path forming section.

A fourth aspect of the present invention is a fine particle deposition apparatus that coats a surface of a processing target substrate with a solution containing fine particles made of a material substance so as to obtain a liquid film with a prescribed thickness, and forms a layer made of the fine particles on the surface of the processing target substrate by drying the liquid film, the fine particle deposition apparatus comprising a coating mechanism configured to coat the surface of the processing target substrate with a liquid film formed of the solution and having a prescribed thickness; a movement mechanism configured to feed the processing target substrate at a prescribed velocity relative to the coating mechanism, in a direction along the surface of the processing target substrate; and a vibrating mechanism configured to minutely vibrate the processing target substrate from when the liquid film starts being formed by the coating mechanism to when a solvent of the liquid film is evaporated or volatilized.

BRIEF DESCRIPTION OF DRAWINGS

FIG. 21 is a perspective view according to a fifth modification, showing a partial internal configuration of a quartz pipe 250 in the mist modifying section 20 of the fourth modification and the like;

DESCRIPTION OF EMBODIMENTS

The following describes in detail preferred embodiments of a mist generation apparatus and a mist deposition apparatus according to aspects of the present invention, while referencing the accompanying drawings. The present invention is not limited to these embodiments, and various modifications and improvements could be adopted therein without departing from the essence and gist of the present invention. That is, the configurational elements mentioned below include components that could be easily envisioned by a person skilled in the art and components substantially identical thereto, and it is possible to combine the configurational elements described below as desired. Furthermore, the various configurational elements can be omitted, replaced, or changed without deviating from the scope of the present invention.

First Embodiment

Figure 1:
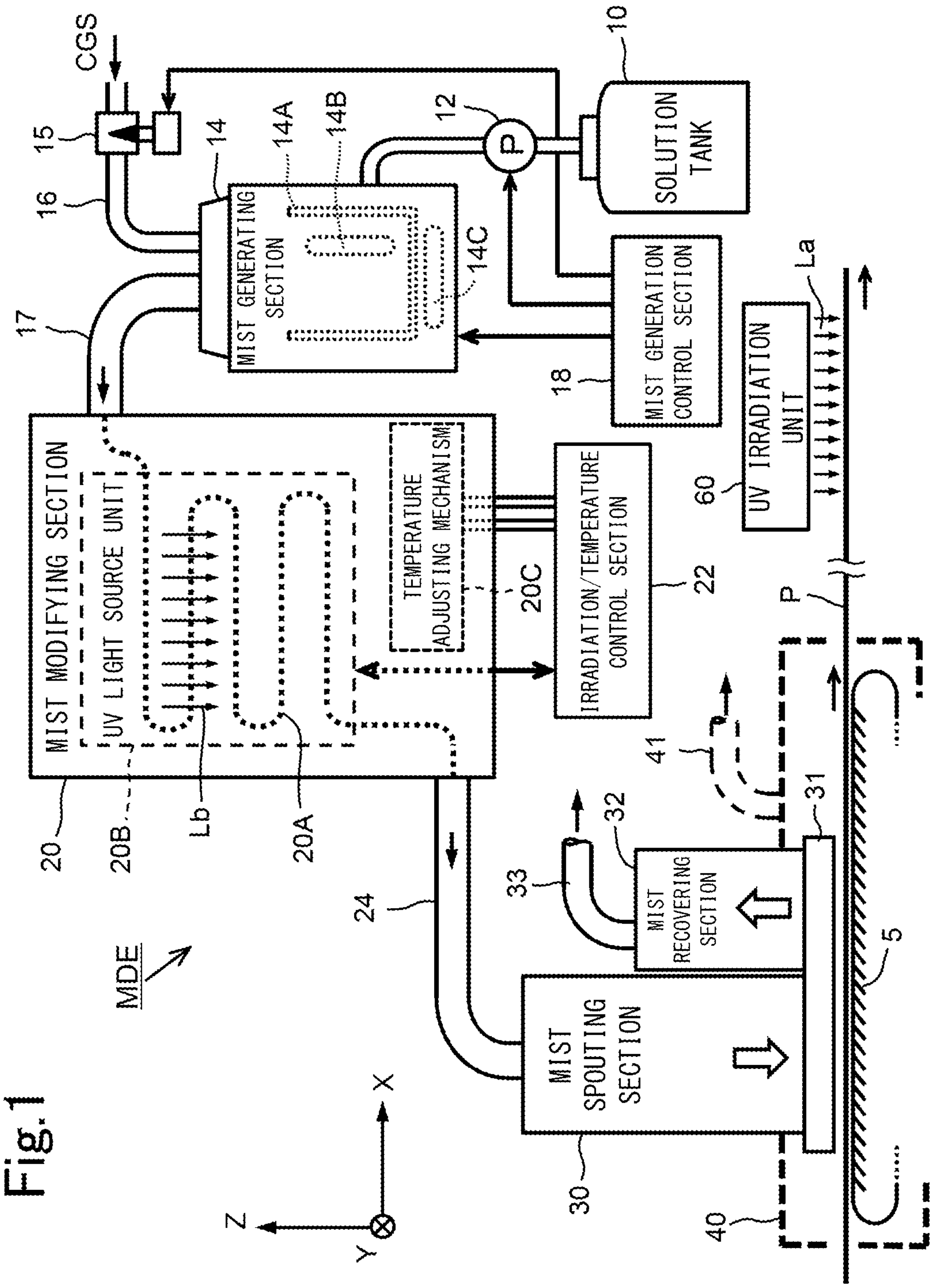
FIG. 1 shows a schematic overall configuration of a mist deposition apparatus MDE in which is loaded a mist generation apparatus according to a first embodiment.

FIG. 1 shows a schematic overall configuration of a mist deposition apparatus MDE in which is loaded a mist generation apparatus according to a first embodiment. In FIG. 1, unless otherwise specified, an XYZ orthogonal coordinate system is established in which the direction of gravity is the Z-direction; the feeding direction, indicated by the arrow shown in FIG. 1, of a flexible sheet substrate P (sometimes referred to simply as the substrate P) serving as a processing target substrate is the X-direction; the width direction of the sheet substrate P, which is orthogonal to the feeding direction, is the Y-direction; and the surface of the sheet substrate P during the mist deposition is in a horizontal plane that is parallel to the XY-plane in the present embodiment. In the present embodiment, the sheet substrate P is a flexible sheet which is long in the X-direction and has a thickness approximately from hundreds of micrometers to tens of micrometers, with a resin such as PET (polyethylene terephthalate), PEN (polyethylene naphthalate), or polyimide as the base material, but the sheet substrate P may be made of other materials, and may be, for example, a metal foil formed by thinly rolling metal materials such as stainless steel, aluminum, brass, and copper; an ultra-thin glass sheet with a thickness of 100 μm or less to give flexibility; or a plastic sheet containing cellulose nanofibers. The sheet substrate P does not necessarily need to be long, and may be a sheet substrate with standardized long-side and short-side dimensions such as A4 size, A3 size, B4 size, and B3 size, or a sheet substrate with a non-standard size.

As shown in FIG. 1, the mist deposition apparatus (coating mechanism) MDE according to the present embodiment is schematically formed by a feeding unit (feeding mechanism) 5 that supports the sheet substrate P and feeds the sheet substrate P in the X-direction; a solution tank 10 that stores a solution containing nanoparticles serving as the material substance of the film deposition; a mist generating section 14 that efficiently generates mist with a particle size of approximately several micrometers to a dozen micrometers from the solution; a mist modifying section 20 that modifies the chemical or physical state of the generated mist using ultraviolet rays (UV light); a mist spouting section 30 that sprays, toward the sheet substrate P, a gas (carrier gas) containing the modified mist supplied via a pipe 24; a mist recovering section 32 that recovers the carrier gas containing the mist that is floating without being adhered to the sheet substrate P; and a chamber section 40 provided in a manner to cover the mist spouting section 30, the mist recovering section 32, and the feeding unit 5 in order to restrict leakage of the carrier gas containing the mist to the outside atmosphere (outside the apparatus). In the present embodiment, the mist generation apparatus is formed by the solution tank 10, the mist generating section 14, and the mist modifying section 20. The configuration of each section is described in detail below.

The solvent of the solution stored in the solution tank 10 is pure water that is easy to handle and highly safe, and ITO (Indium Tin Oxide) nanoparticles, as an example of the material substance, are mixed into this solvent (pure water) with a desired concentration. The solution inside the solution tank 10 is supplied to the mist generating section 14, intermittently or continuously, by a precision pump 12. The mist generating section 14 includes, inside a sealed external container, an inner container (cup) 14A that stores the solution, a first ultrasonic oscillator 14B that applies a vibration of approximately 20 KHz to the solution inside the inner container 14A to restrict the aggregation of nanoparticles (ITO) in the solution, and a second ultrasonic oscillator 14C that applies a vibration of approximately 2.4 MHz to the solution via the inner container 14A to generate the mist from the liquid surface of the solution. Furthermore, the carrier gas CGS is supplied to the inside of the mist generating section 14 at a prescribed flow rate (or pressure) by a pipe 16 having an opening arranged in the space above the inner container 14A and a flow rate adjusting valve 15 that adjusts the flow rate of the carrier gas CGS passing through the pipe 16. In the above configuration, the precision pump 12, the ultrasonic oscillators 14B and 14C, and the flow rate adjusting valve 15 are each driven with a suitable drive amount, timing, interval, and the like by a mist generation control section 18 that receives instructions from a higher-level controller (computer for integrated control or the like).

An example of the mist generating section 14 that is provided with the first ultrasonic oscillator 14B and the second ultrasonic oscillator 14C and efficiently generates the mist from the liquid surface of the solution while restricting aggregation of the nanoparticles is disclosed in International Publication WO 2017/154937, for example. In general, since this type of nanoparticle tends to aggregate in pure water, the first ultrasonic oscillator 14B can be omitted in a case where a surfactant is mixed with pure water at an appropriate concentration to obtain a solution that restricts aggregation. In such a case, a process of heating the substrate P to a high temperature (100° C. or more) after the mist deposition, and decomposing and removing the surfactant components remaining in the film of the deposited material substance is necessary.

There are cases where, depending on the physical characteristics of the nanoparticles themselves, a good dispersion state can be maintained without aggregation over a long period of time even in a solvent (pure water or the like) that does not include a surfactant, and the first ultrasonic oscillator 14B used for dispersion can be omitted in such cases.

The mist generated by the mist generating section 14 is sent to the mist modifying section 20, along with the flow of the carrier gas CGS through a pipe 17. The carrier gas CGS used here can be pure atmosphere (clean air) from which dust (particulates) has been removed, pure nitrogen ($N_2$) gas, argon (Ar) gas, or the like. In the present embodiment, in a case where the mist deposition is performed simply in atmospheric pressure at room temperature, the carrier gas CGS can be clean air or nitrogen gas, and as disclosed in International Publication WO 2016/133131, for example, in a case where a configuration (plasma assistance and mist generation method) where the mist sprayed onto the substrate P from the mist spouting section 30 is irradiated with atmospheric pressure plasma in non-thermal equilibrium, the carrier gas CGS can be argon gas. In a case where it is necessary to set the temperature of the carrier gas CGS containing the mist sprayed from the mist spouting section 30 to a temperature higher (or lower) than room temperature, a temperature adjusting mechanism (heater, cooler, or the like) is provided to adjust the temperature of the carrier gas CGS, the temperature inside the mist generating section 14, or the temperature inside the pipe 17 to a set value as needed.

As described in detail further below, the mist modifying section 20 is schematically formed by a flow path section (flow path forming section) 20A formed of a quartz pipe or the like and causing the carrier gas CGS (also referred to as the mist gas CGS) containing the mist supplied from the pipe 17 to flow a prescribed length therethrough; a UV light source unit (ultraviolet irradiation section) 20B that irradiates the mist flowing inside the quartz pipe of the flow path section 20A with UV light Lb in the ultraviolet wavelength range; a temperature adjusting mechanism 20C that restricts a temperature increase of the quartz pipe or the like in the flow path section 20A caused by the UV light source unit 20B; and an irradiation/temperature control section 22 that performs control of the radiation of the UV light Lb performed by the UV light source unit 20B and control of the temperature adjustment performed by the temperature adjusting mechanism 20C. The flow path section 20A is formed by connecting quartz pipes with a diameter of approximately several centimeters in a winding shape, for example, and the UV light source unit 20B is formed by a long arc rod-shaped low-pressure mercury discharge lamp (preferably a plurality of these lamps) arranged parallel to the quartz pipe near the outer circumference of the quartz pipe. The low-pressure mercury discharge lamp, with the mercury vapor pressure in the discharge tube set to 1000 Pa (Pascal) or less, generates the UV light Lb including a strong bright line spectrum with a wavelength of 200 nm or less, but at positions closer to the outer circumferential surface of the quartz pipe, the energy (light amount) of the UV light Lb irradiating the mist inside the quartz pipe increases, and it is possible to shorten the time needed to modify the mist.

However, since the low-pressure mercury discharge lamp itself is a heat source with a considerably high temperature and is arranged near the quartz pipe, the temperature of the pipe wall (particularly the inner wall surface) of the quartz pipe also increases. Due to this, the temperature of the mist itself increases along with the temperature of the carrier gas CGS passing inside the quartz pipe over the length of the flow path section 20A, and the evaporation of the mist causes the particle size of the mist to become so small that the mist cannot float while holding the nanoparticles (ITO nanoparticles). Furthermore, in a case where the temperature of the inner wall surface of the quartz pipe is considerably higher than the temperature of the carrier gas CGS containing the mist supplied from the pipe 17, the mist evaporates (disappears) as soon as it contacts the inner wall of the quartz pipe that has a high temperature, and there are cases where the mist concentration reaching the pipe 24 connected to the mist spouting section 30 drops significantly. Therefore, in the present invention, the temperature adjusting mechanism 20C adjusts the temperature of the members forming the flow path (preferably the temperature of the inner wall surfaces thereof), such as the quartz pipe forming the flow path section 20A, to be approximately the same as the temperature of the carrier gas CGS containing the mist. The details of a configuration for achieving this are described further below.

The carrier gas CGS containing the modified mist that has passed through the flow path section 20A of the mist modifying section 20 is supplied through the top portion of the mist spouting section 30 via the pipe 24, and is sprayed onto the substrate P at a prescribed flow rate (wind speed) from a slit-shaped nozzle formed in the bottom portion of the mist spouting section 30 facing the substrate P. The slit-shaped nozzle is formed having a Y-direction length approximately the same as the width-direction dimension of the substrate P (or a Y-direction length less than the width-direction dimension of the substrate P), and is formed with a width of approximately several millimeters (1 mm to 6 mm) in the X-direction. When the feeding (movement) direction along the length direction of the substrate P is the +X-direction, the mist recovering section 32 is arranged downstream from the mist spouting section 30 in the substrate P feeding direction. The mist sprayed downward (−Z-direction) from the slit-shaped nozzle on the bottom portion of the mist spouting section 30 is adhered to the surface of the substrate P while flowing in the +X-direction along the surface of the substrate P toward a negative pressure (reduced pressure) formed in a recovery port section formed in the bottom portion of the mist recovering section 32 on the downstream side. The recovery port section in the bottom portion of the mist recovering section 32 is formed in a slot shape extending in the Y-direction, and the carrier gas CGS and mist that have not adhered to the substrate P are recovered by a vacuum pump (reduced pressure source) (not shown in the drawings), via a pipe 33 connected to the top portion of the mist recovering section 32.

An air guiding member (also referred to as a skirt member or rectifying member) 31, for causing the carrier gas CGS containing the mist to flow smoothly from the slit-shaped nozzle of the mist spouting section 30 toward the recovery port section of the mist recovering section 32, is provided between the substrate P and the bottom portions of the mist spouting section 30 and mist recovering section 32. As made clear from the configuration of FIG. 1, the surface of the substrate P can move in the +X-direction while being exposed to the laminar flow of the carrier gas CGS containing the mist sprayed from the mist spouting section 30 and recovered by the mist recovering section 32, and it is possible to change the thickness of the film made of the nanoparticles (ITO) deposited on the surface of the substrate P by adjusting the relationship between the movement velocity of the substrate P caused by the feeding unit 5 and the flow velocity of the carrier gas CGS flowing along the surface of the substrate P. At this time, by setting the inside of the chamber section 40 to a negative pressure via a pipe 41 connected to a vacuum decompression source, it is possible to prevent the carrier gas CGS that has leaked from the space covered by the air guiding member 31 from leaking outside the chamber section 40. In the present embodiment, the mist deposition mechanism is formed by the mist spouting section 30, the air guiding member 31, and the mist recovering section 32.

In the configuration of FIG. 1, with the total discharge flow rate of the carrier gas CGS containing the mist spouted from the slit-shaped nozzle of the mist spouting section 30 being Qf and the total exhaust flow rate at the recovery port section of the mist recovering section 32 being Qv, it is preferable to set a relationship of $Qf \approx Qv$ or a relationship of $Qf < Qv$. However, within the range of the exhaust capability of the chamber section 40, a relationship of $Qf > Qv$ may be intentionally set to realize a configuration in which excess carrier gas CGS leaks from the inner side of the air guiding member 31, so that a greater amount of mist is adhered to the surface of the substrate P. The balance between the total discharge flow rate Qf and the total exhaust flow rate Qv can be easily set by the flow rate adjusting valve 15 and the flow rate adjustment of the vacuum decompression source connected to the pipe 33 shown in FIG. 1.

Although not shown in FIG. 1, the surface of the substrate P immediately after the mist deposition within the chamber section 40 is in a state of being wet and covered by a thin liquid film (water film) with a thickness of approximately several micrometers to tens of micrometers, for example, due to the mist adhesion, and therefore a drying unit (heating mechanism) that evaporates and dries this liquid film is provided downstream from the chamber section 40. The drying unit includes an infrared lamp, an electric heater and air blowing mechanism (blower), or the like for heating the substrate P at a temperature that is higher than room temperature (23° C. to 25° C.) and lower than 100° C., e.g. a temperature from approximately 40° C. to 80° C. In this case, since the liquid film on the surface of the substrate P is thin, it is possible to evaporate and dry the liquid film in a short time even at a low temperature of approximately 40° C. to 80° C. A thin film formed by densely deposited nanoparticles, which is an ITO film in the present embodiment, is formed on the surface of the substrate P after the drying process, but the resistivity (Ω·m) of the ITO film at this stage remains at a relatively large value.

Due to this, as shown in FIG. 1, a UV irradiation unit 60, which irradiates the surface of the substrate P after mist deposition (in a wet state or after being dried) with UV light La in the ultraviolet wavelength range, is provided downstream from the chamber section 40 (or the drying unit). That is, in the present embodiment, when using the mist deposition technique to form the deposition film (ITO film) of nanoparticles (ITO crystal bodies) on the surface of the substrate P, a first-stage ultraviolet irradiation process of irradiating and modifying (ultraviolet cleaning) the mist itself before being adhered to the substrate P with the UV light Lb and a second-stage ultraviolet irradiation process of irradiating the ITO film layer deposited on the substrate P with the UV light La are performed. It was found that, by using this 2-step ultraviolet irradiation process, the resistivity of the ITO film layer formed on the surface of the substrate P is significantly lowered in a short time. The details of this are described further below.

Figure 2:
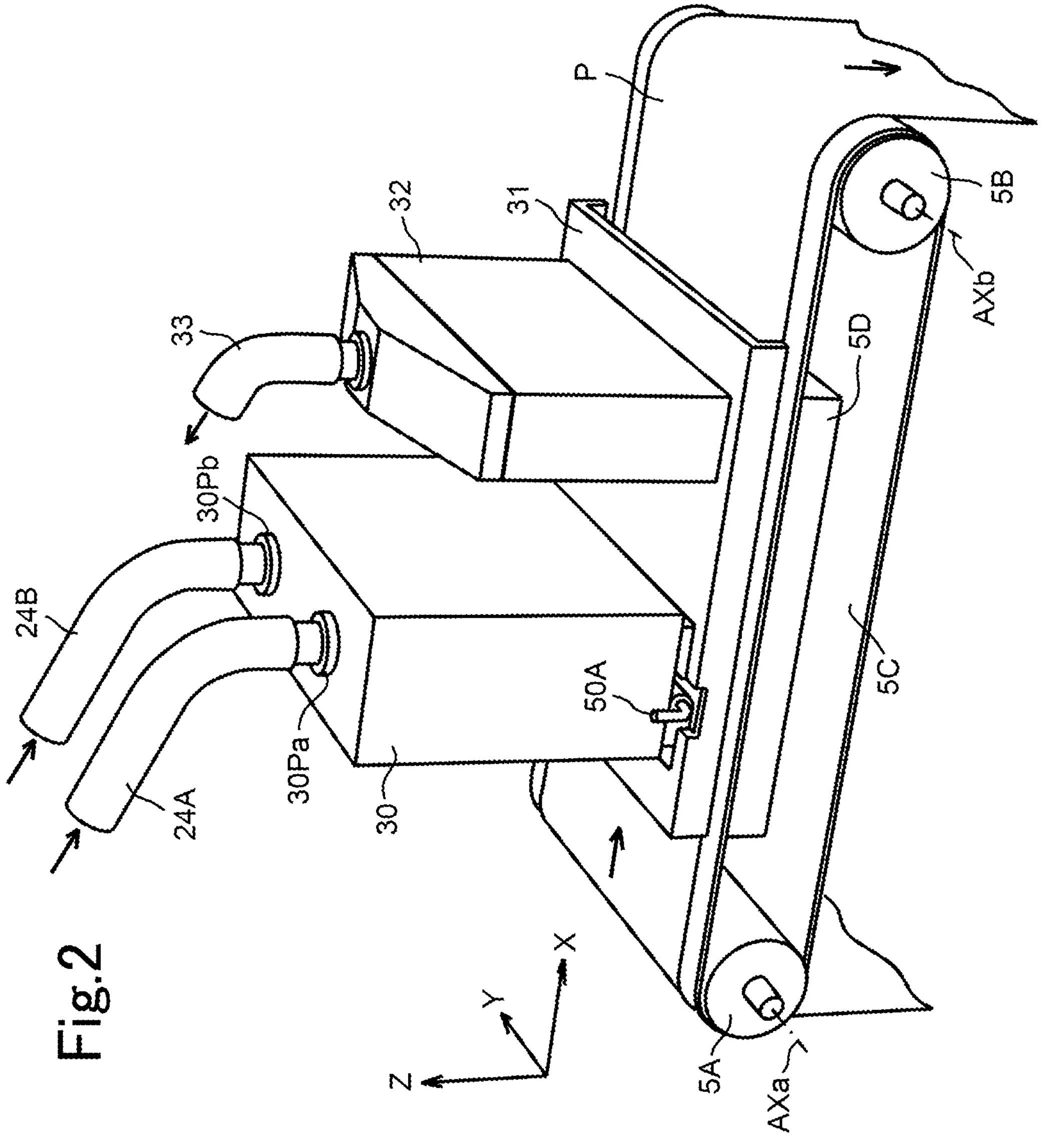
FIG. 2 is a perspective view of a detailed outer appearance of a mist depositing section of the mist deposition apparatus shown in FIG. 1.
Figure 3:
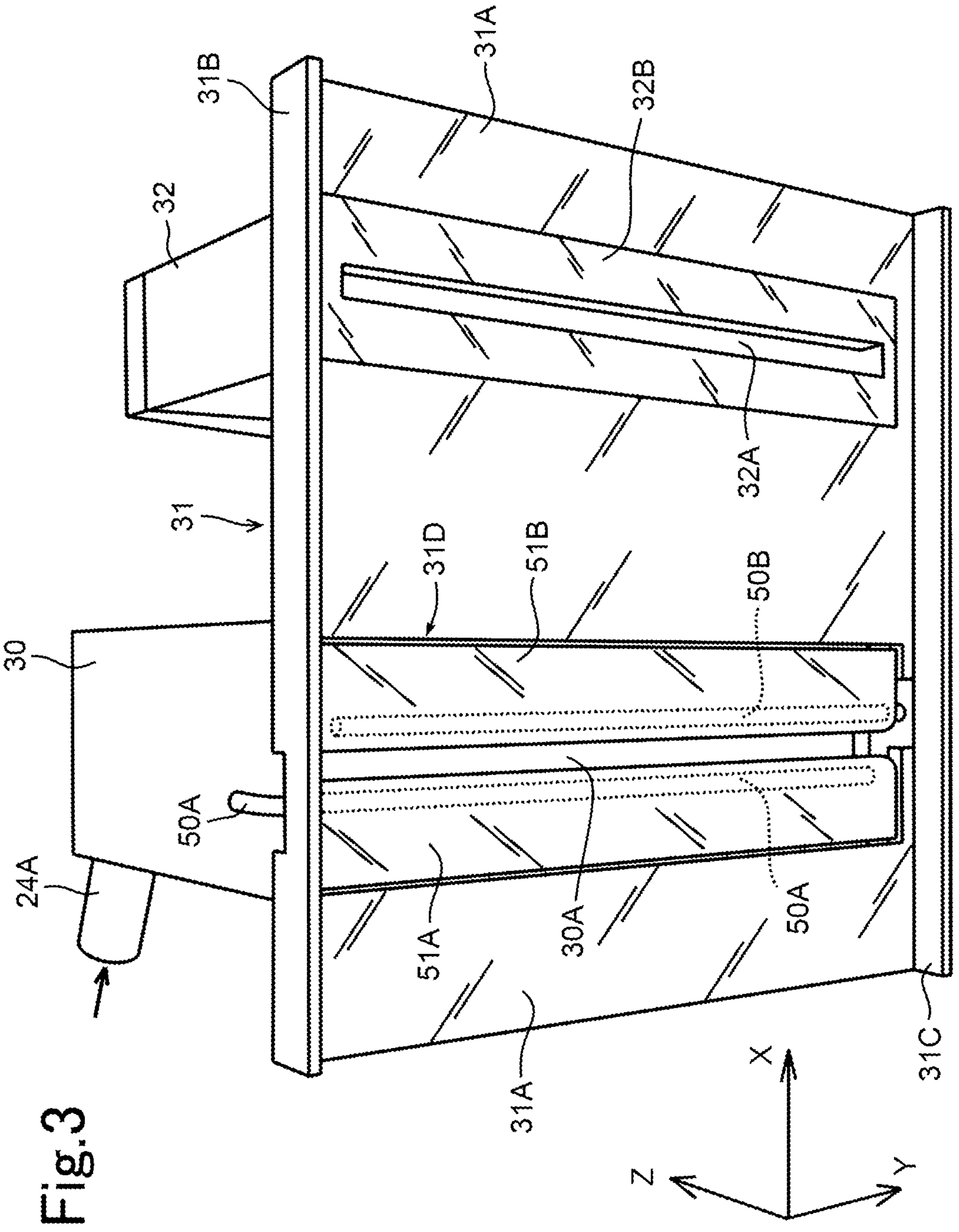
FIG. 3 is a perspective view of a detailed configuration of the back side (side facing a substrate P) of an air guiding member 31 provided to the mist depositing section shown in FIG. 2.

FIG. 2 is a perspective view of a detailed configuration of the depositing section of the mist deposition apparatus MDE shown in FIG. 1, FIG. 3 is a perspective view, seen from the −Z-direction side, of a detailed configuration of the back side (side facing the substrate P) of the air guiding member 31 provided to the depositing section shown in FIG. 2, and the XYZ orthogonal coordinate systems of FIGS. 2 and 3 are set with the same orientation as in FIG. 1. In FIG. 2, the feeding unit 5 shown in FIG. 1 includes a roller 5A that rotates on a central axis AXa parallel to the Y-axis; a roller 5B that rotates on a central axis AXb, which is a prescribed distance away from the central axis AXa in the X-direction and arranged parallel to the central axis AXa; an endless belt 5C that spans between the two rollers 5A and 5B and supports the sheet substrate P in a flat state on the top surface of the flat portion thereof; and a support table 5D that is arranged on the back surface side of the flat portion of the belt 5C supporting the sheet substrate P, and supports the belt 5C in a flat state. The Y-direction width of the belt 5C is set to be slightly greater than the Y-direction width (short dimension) of the substrate P, and the belt 5C sucks by vacuum the substrate P in a region corresponding to the top surface of the support table 5D and is also feed-driven in a non-contact state (or a low friction state) with the top surface of the support table 5D by a static pressure gas layer (air bearing) generated between the top surface of the support table 5D and the back surface of the belt 5C. The feeding unit 5 having such a configuration is disclosed in International Publication WO 2013/150677, for example, and the belt 5C is preferably made of metal, such as stainless steel, that has high rigidity and can achieve flatness. However, in a case where mist deposition is performed with plasma assistance, the belt 5C and the support table 5D may preferably be made of a non-conductive material (non-metal material) with high insulation.

As shown in FIG. 2, the sheet substrate P is supported on the flat portion of the belt 5C and fed at a prescribed velocity in the +X-direction by the rotational drive of the rollers 5A and 5B. In the space above the substrate P facing the top surface (flat surface) of the support table 5D, as shown in FIG. 1, the mist spouting section 30 and the mist recovering section 32 are provided on the air guiding member 31 that has a Y-direction width covering the short dimension of the substrate P. The mist spouting section 30 is provided at an opening of the air guiding member 31 on the −X-direction side (upstream side), and the mist recovering section 32 is provided at an opening of the air guiding member 31 on the +X-direction side (downstream side). Supply ports 30Pa and 30Pb, which are respectively connected to pipes 24A and 24B formed by bifurcating the pipe 24 shown in FIG. 1, are formed in the upper ceiling board of the mist spouting section 30. The internal space of the mist spouting section 30 is formed in a rectangular shape extending in the Y-direction when viewed in the XY-plane. Therefore, in order to make the mist concentration as uniform as possible in the Y-direction in this internal space, the two supply ports 30Pa and 30Pb are provided along the Y-direction. Furthermore, near a slit-shaped nozzle section (slit opening) 30A of the bottom end portion of the mist spouting section 30, a pair of electrode rods 50A and 50B (50B is not shown in FIG. 2) for applying a high voltage for plasma assistance to the mist (carrier gas CGS) sprayed from the nozzle are installed with a certain interval in the X-direction maintained therebetween.

As shown in FIG. 3, the bottom end portions (sides facing the substrate P) of the air guiding member 31, the mist spouting section 30, and the mist recovering section 32 are formed to have flat shapes approximately parallel to the flat surface of the substrate P, such that the flow of the carrier gas CGS containing the mist is not disturbed. The board-shaped air guiding member 31 includes a bottom surface 31A that is parallel to the XY plane (surface of the substrate P) and side boards 31B and 31C that protrude by a prescribed amount in the −Z-direction and extend in the X-direction, at the respective sides in the Y-direction. The −Z-direction side end portion (bottom end surface) of each side board 31B and 31C is arranged facing the surface of the flat portion of the belt 5C shown in FIG. 2, with a prescribed gap therebetween. This gap is preferably made as small as possible, so that the carrier gas CGS containing the mist flowing through the space between the bottom surface 31A of the air guiding member 31 and the surface of the substrate P leaks as little as possible through this gap. Furthermore, as made clear from FIGS. 2 and 3, side boards similar to the side boards 31B and 31C are not provided at the respective ends of the air guiding member 31 in the X-direction (feeding direction of the substrate P), but side boards protruding from the bottom surface 31A at the respective ends of the air guiding member 31 in the X-direction toward the substrate P may be provided, if necessary.

On the bottom end portion of the mist spouting section 30, the nozzle section (slit opening) 30A extending in a slit shape in the Y-direction for spraying the mist; a pair of electrode rods 50A and 50B for plasma assistance, which extend parallel in the Y-direction in a manner to sandwich this nozzle section 30A in the X-direction; and insulating electrode holding members 51A and 51B (quartz, ceramics, and the like that are resistant to chemical effects and also resistant to plasma) that respectively hermetically seal and stably support the electrode rods 50A and 50B at a prescribed interval from each other, are provided. The nozzle section 30A and the electrode holding members 51A and 51B are arranged inside a rectangular opening 31D formed in the board-shaped air guiding member 31. The arrangement conditions for the electrode rods 50A and 50B and the electrode holding members 51A and 51B and the conditions (voltage, frequency, and the like) for the high voltage pulses applied between the electrodes are disclosed in International Publication WO 2016/133131, for example. In the case of plasma-assisted mist deposition, the mist spouting section 30 and the air guiding member 31 are each formed of an insulating material such as glass (quartz), ceramics, or synthetic resin (acrylic or the like), and components such as bolts, screws, and nuts that are made of metal (that are conductive) should not be provided at least near the bottom end portion (nozzle section 30A) of the mist spouting section 30.

Figure 4:
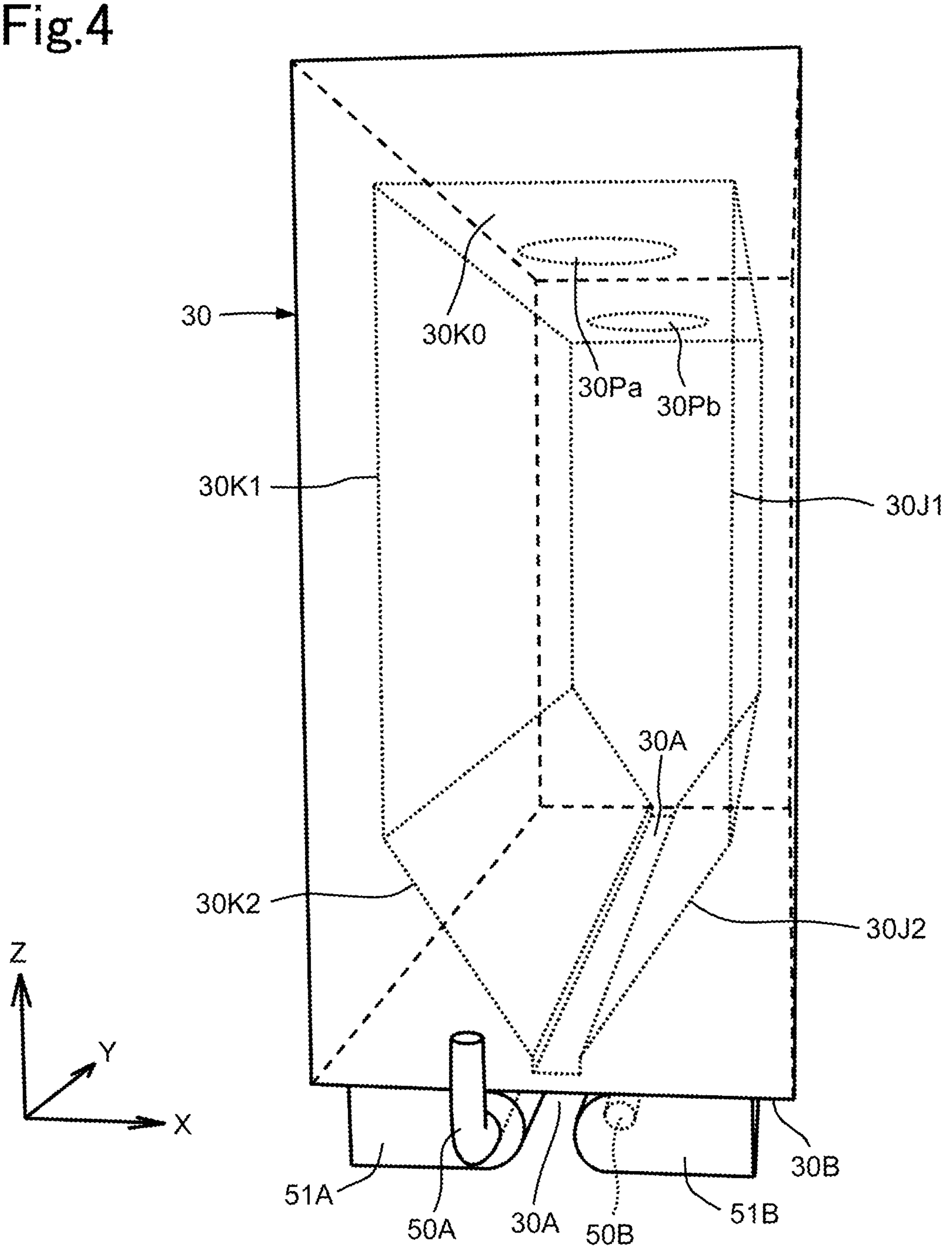
FIG. 4 is a perspective view of an arrangement state of a mist spouting section 30 shown in FIGS. 2 and 3 and electrode holding members 51A and 51B.

Here, an example of an arrangement relationship between the mist spouting section 30 and the electrode holding members 51A and 51B (both of which can be referred to collectively simply as the electrode holding members 51) arranged on the bottom end portion thereof is described, with reference to FIG. 4. FIG. 4 is a perspective view of an arrangement state of the mist spouting section 30 and the electrode holding members 51A and 51B, and the XYZ orthogonal coordinate system is set with the same orientation as in FIGS. 1 to 3. As shown in FIG. 4, the mist spouting section 30 is formed of acrylic resin or the like to have an outer shape that is rectangular and long in the Y-direction, and the internal space thereof is surrounded by vertical inner wall surfaces 30K1 and 30J1, which are arranged parallel to the YZ-plane and with a space therebetween in the X-direction; inner wall surfaces 30K2 and 30J2, which are inclined relative to the YZ-plane in a manner to be continuous respectively from the inner wall surfaces 30K1 and 30J1 toward the slit-shaped nozzle section 30A of the bottom portion of the mist spouting section 30; and the like, and this internal space temporarily stores the carrier gas CGS containing the mist. The supply ports 30Pa and 30Pb are formed in communication with the internal space, as shown in FIG. 2, in an ceiling inner wall surface (ceiling board inner wall surface) 30K0 (parallel to the XY-plane) of the upper portion defining the internal space of the mist spouting section 30. Although the reference numerals are not shown in FIG. 4, vertical inner wall surfaces are also formed respectively at the Y-direction sides of the internal space of the mist spouting section 30. Furthermore, the electrode holding members 51A and 51B arranged in a manner to sandwich the nozzle section 30A in the Y-direction are provided in parallel at a bottom surface portion 30B of the mist spouting section 30. The respective surfaces of the electrode holding members 51A and 51B facing each other with the nozzle section 30A sandwiched therebetween are each formed with a cross section that is approximately semicircular when viewed in the XZ-plane, and the electrode rods 50A and 50B (both of which can be referred to collectively simply as the electrode rods 50), which are shaped as circular pillars, are embedded in parallel respectively at the positions of the center lines (parallel to the Y-axis) of these semicircular shapes.

Furthermore, as shown in FIG. 3, a bottom surface 32B, molded to be approximately flush with the bottom surface 31A of the air guiding member 31, is provided at the bottom end portion of the mist recovering section 32, and a recovery port section 32A extending in a slot shape in the Y-direction is formed in this bottom surface 32B. This recovery port section 32A is in communication with the internal space of the mist recovering section 32, and by uniformly decompressing this internal space via the pipe 33 shown in FIG. 2, it is possible to make the Y-direction distribution of the exhaust flow rate of the recovery port section 32A approximately uniform. The Y-direction dimension of the recovery port section 32A extending in a slot shape is preferably as long as possible and, in the present embodiment, is preferably set to be longer than the Y-direction dimension of the nozzle section 30A of the bottom end portion of the mist spouting section 30 and approximately the same length as the Y-direction interval between the side boards 31B and 31C provided protruding on the bottom surface 31A of the air guiding member 31. In order to make the Y-direction distribution of the exhaust flow rate in the recovery port section 32A uniform, it is possible to provide a rectifier board (fin) or punched plate (thin plate with many opening holes) inside the internal space of the recovery port section 32A.

As shown in FIG. 3, in the present embodiment, the bottom surface 31A of the air guiding member 31, the bottom surface 32B of the mist recovering section 32, and the respective bottom surfaces of the electrode holding members 51A and 51B are set to be as flat as possible and to be flush with one another (in a flush surface state) in the Z-direction. Furthermore, the bottom surface 31A of the air guiding member 31, the bottom surface 32B of the mist recovering section 32, the bottom surfaces of the electrode holding members 51, and the respective inner side surfaces of the side boards 31B and 31C undergo liquid repellent processing to restrict the adhesion of mist. This liquid repellent processing is applied by coating with a fluorine-based coating agent or attaching a liquid-repellent sheet material, and preferably achieves liquid repellence by which the contact angle when pure water, which is the main component of the mist, gathers and forms droplets is 90 degrees or more, preferably 120 degrees or more. This contact angle is the angle, from the substrate surface, of the liquid surface at a region of an outer circumferential liquid surface of a droplet contacting the substrate surface, when the droplet is dropped onto the flat substrate surface. Accordingly, when the contact angle is 90 degrees, the droplet has a shape appearing as a sphere cut in half with one side laid down on the substrate surface, and as the contact angle becomes larger, the shape of the droplet approaches a flat sphere on the substrate surface, making it easier to roll on the substrate surface.

Figure 5:
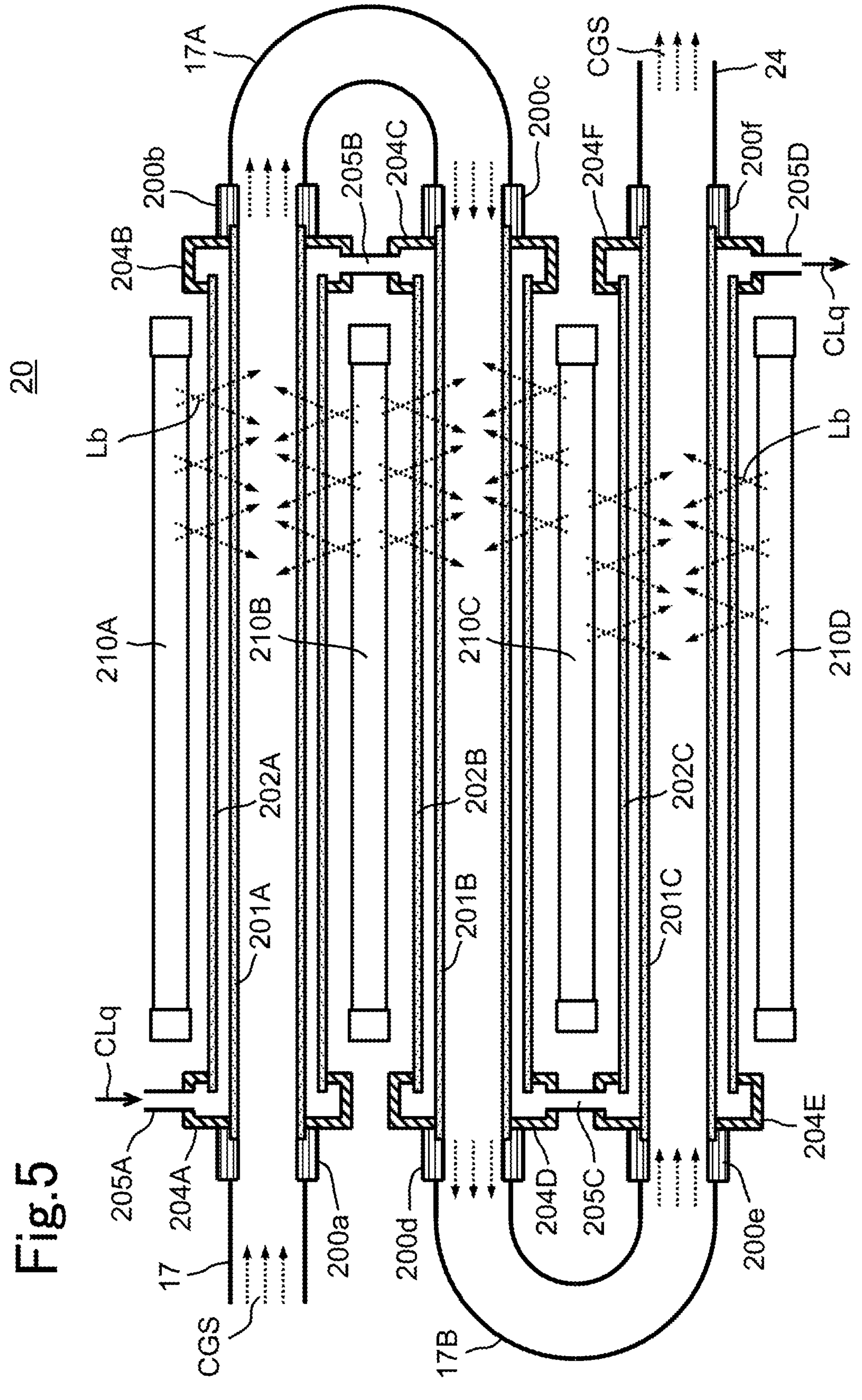
FIG. 5 is a partial cross-sectional view of an example of detailed configurations of a flow path section 20A and a UV light source unit 20B provided inside a mist modifying section 20 of FIG. 1.

Next, a configuration of the mist modifying section 20 shown in FIG. 1 according to the first embodiment is described, with reference to FIG. 5. FIG. 5 is a partial cross-sectional view of an example of detailed configurations of the flow path section 20A and the UV light source unit 20B provided inside the mist modifying section 20 of FIG. 1. In the present embodiment, the flow path section 20A is formed by three parallel tubular quartz pipes 201A, 201B, and 201C for passing the carrier gas CGS containing the mist via the pipe 17 from the mist generating section (mist generator) 14; a U-shaped pipe 17A connecting an outlet (side from which the mist flows out) of the quartz pipe 201A and an inlet (side to which the mist flows in) of the quartz pipe 201B; and a U-shaped pipe 17B connecting an outlet of the quartz pipe 201B and an inlet of the quartz pipe 201C, and an outlet of the quartz pipe 201C is connected to the pipe 24 leading to the mist spouting section 30. An inlet of the quartz pipe 201A and the pipe 17 are connected by a joint portion 200*a*, the outlet of the quartz pipe 201A and an inlet of the pipe 17A are connected by a joint portion 200*b*, the outlet of the pipe 17A and an inlet of the quartz pipe 201B are connected by a joint portion 200*c*, the outlet of the quartz pipe 201B and an inlet of the pipe 17B are connected by a joint portion 200*d*, the outlet of the pipe 17B and the inlet of the quartz pipe 201C are connected by a joint portion 200*e*, and the outlet of the quartz pipe 201C and the pipe 24 are connected by a joint portion 200*f*.

Due to this, the carrier gas CGS containing the mist supplied from the pipe 17 flows in a winding shape in the order of the quartz pipe 201A, the U-shaped pipe 17A, the quartz pipe 201B, the U-shaped pipe 17B, and the quartz pipe 201C, to be sent out to the pipe 24. Furthermore, outer quartz pipes 202A, 202B, and 202C, which have inner diameters at least several millimeters larger than the outer diameters of the quartz pipes 201A to 201C, are provided approximately coaxially on the outer circumferences of the respective quartz pipes 201A, 201B, and 201C. In the present embodiment, a gap between the outer circumferential surface of the quartz pipe 201A and the inner circumferential surface of the outer quartz pipe 202A, a gap between the outer circumferential surface of the quartz pipe 201B and the inner circumferential surface of the outer quartz pipe 202B, and a gap between the outer circumferential surface of the quartz pipe 201C and the inner circumferential surface of the outer quartz pipe 202C are configured to have temperature-adjusted pure water, serving as coolant (coolant liquid) CLq for cooling, flow therethrough. Therefore, sealing plugs 204A and 204B, which support the quartz pipe 201A and the outer quartz pipe 202A to be approximately coaxial and provide sealing such that the coolant (pure water) CLq flows through the gap therebetween, are provided at respective ends of each of the quartz pipe 201A and the outer quartz pipe 202A, and a coolant CLq supply port (pipe) 205A is provided to the sealing plug 204A positioned on the pipe 17 side.

Similarly, sealing plugs 204C and 204D, which support the quartz pipe 201B and the outer quartz pipe 202B to be approximately coaxial and provide sealing such that the coolant (pure water) CLq flows through the gap therebetween, are provided at respective ends of each of the quartz pipe 201B and the outer quartz pipe 202B, and sealing plugs 204E and 204F, which support the quartz pipe 201C and the outer quartz pipe 202C to be approximately coaxial and provide sealing such that the coolant (pure water) CLq flows through the gap therebetween, are provided at respective ends of each of the quartz pipe 201C and the outer quartz pipe 202C. Furthermore, ports (pipes) 205B and 205C for passing the coolant CLq are provided respectively between the sealing plug 204B and the sealing plug 204C and between the sealing plug 204D and the sealing plug 204E, and a discharge port (pipe) 205D for discharging the coolant CLq is provided to the sealing plug 204F positioned on the pipe 24 side.

Furthermore, long arc pipe-shaped low-pressure mercury discharge lamps (UV light sources) 210A, 210B, 210C, and 210D are arranged in parallel, respectively on both sides of each of the three outer quartz pipes 202A to 202C. In the present embodiment, in order for the mist contained in the carrier gas CGS passing through each of the three quartz pipes 201A, 201B, and 201C to be irradiated with strong ultraviolet rays (UV light Lb), the four UV light sources 210A to 210D are provided, but the number of UV light sources may be three or less or may be five or more, depending on the power of a single UV light source. Each low-pressure mercury discharge lamp has a strong bright line spectrum in the ultraviolet wavelength range with a wavelength of 300 nm or less, and by using, in particular, at least one of two spectral components that respectively have a central wavelength of 253.7 nm (approximately 254 nm) and a central wavelength of 184.9 nm (approximately 185 nm), the fine particles, molecules bacteria, and the like of the organic substance contained in the mist and adhered to the surface of the nanoparticles are decomposed and cleansed. Furthermore, the entire mist modifying section 20 formed by the quartz pipes 201A to 201C, the outer quartz pipes 202A to 202C, the U-shaped pipes 17A and 17B, the UV light sources 210A to 210D, and the like shown in FIG. 5 is housed inside a light-shielding housing (dark box), in order to prevent the UV light Lb from being released to the outside.

With the above configuration, the mist within the carrier gas CGS passing through the inside of each of the quartz pipes 201A to 201C is irradiated with the strong UV light Lb in the ultraviolet wavelength range generated from each of the UV light sources 210A to 210D, via each of the pipe walls of the outer quartz pipes 202A to 202C, the coolant (pure water) CLq filling the gaps between each of the inner circumferential surfaces of the outer quartz pipes 202A to 202C and each of the outer circumferential surfaces of the quartz pipes 201A to 201C, and each of the pipe walls of the quartz pipes 201A to 201C. In this case, due to the coolant CLq filling the gaps being pure water, it is possible to reduce the absorption of the ultraviolet spectra having central wavelengths of 185 nm and 254 nm and ensure high transmittance. When the UV light sources 210A to 210D are arranged near the respective quartz pipes 201A to 201C, as in FIG. 5, the UV light sources 210A to 210D themselves become heat sources and heat each of the pipe walls of the quartz pipes 201A to 201C. When the carrier gas CGS containing the mist supplied from the pipe 17 passes through the inside of the heated quartz pipes 201A to 201C, the mist particle size (several micrometers to tens of micrometers) rapidly decreases due to evaporation, and eventually it becomes impossible to hold the ITO nanoparticles, which are the deposition substance, and ITO nanoparticles are deposited on the inner wall surfaces of the quartz pipes 201A to 201C and the U-shaped pipes 17A and 17B of the flow path section 20A. Due to this, until reaching the pipe 24, most of the mist contained in the carrier gas CGS is eliminated.

Therefore, in the present embodiment, the configuration in which the coolant CLq fills and flows through the gaps of the double pipe structure formed by the quartz pipes 201A to 201C and the outer quartz pipes 202A to 202C is provided as the temperature adjusting mechanism 20C shown in FIG. 1, and the temperature of the pipe walls (inner wall surfaces) of the quartz pipes 201A to 201C are adjusted to be approximately the same as the temperature of the carrier gas CGS. The pure water serving as the coolant CLq flows into the sealing plug 204A through the supply port 205A of FIG. 5, fills the gap between the outer quartz pipe 202A and the quartz pipe 201A, and reaches the sealing plug 204B. The pure water within the sealing plug 204B flows into the sealing plug 204C through the port 205B, fills the gap between the outer quartz pipe 202B and the quartz pipe 201B, and reaches the sealing plug 204D. The pure water within the sealing plug 204D flows into the sealing plug 204E through the port 205C, fills the gap between the outer quartz pipe 202C and the quartz pipe 201C, reaches the sealing plug 204F, and is discharged from the discharge port 205D. The irradiation/temperature control section 22 shown in FIG. 1 performs control causing the CLq discharged from the discharge port 205D to be adjusted to a prescribed temperature and to then be circulated to the supply port 205A. The lighting up of the UV light sources (low-pressure mercury discharge lamps) 210A to 210D is also controlled by the irradiation/temperature control section 22 shown in FIG. 1.

Although not shown in the drawings, a plurality of temperature sensors that respectively measure the temperature of the coolant CLq supplied to the supply port 205A shown in FIG. 5, the temperature of the coolant CLq discharged from the discharge port 205D, the temperature of the carrier gas CGS (containing the mist) sent from the pipe 17, and the temperature of the carrier gas CGS sent out to the pipe 24 are provided inside the mist modifying section 20 of FIG. 1, and the irradiation/temperature control section 22 controls the temperature and flow rate of the coolant within the temperature adjusting mechanism 20C based on the temperatures measured by these temperature sensors. Furthermore, an illuminance monitor (photoelectric detector) that measures the luminous intensity (illuminance) of the UV light Lb may be provided near the UV light sources 210A to 210D, and the lighting power of the UV light sources 210A to 210D may be controlled by the irradiation/temperature control section 22 of FIG. 1 to keep the luminous intensity within a prescribed illuminance range.

In FIG. 5, a configuration in which the double pipe structures of the quartz pipes 201A to 201C and the outer quartz pipes 202A to 202C are connected in three stages, with the coolant (pure water) CLq filling and flowing through the gaps in the two-layer pipes, is used as the temperature adjusting mechanism 20C in the mist modifying section 20 shown in FIG. 1, but the number of stages may be any number according to the flow velocity of the carrier gas CGS containing the mist. Furthermore, all of the quartz pipes 201A to 201C and the U-shaped pipes 17A and 17B may be provided within the coolant (pure water) filling a reservoir surrounded by quartz plate material, and the ultraviolet rays (wavelength of 300 nm or less) of the UV light sources may be radiated from outside the reservoir. In this case, the reservoir surrounded by the quartz plate material and filled with the coolant functions as the temperature adjusting mechanism 20C. Furthermore, although the liquid repellent processing for avoiding adhesion of the mist is applied to the inner wall surfaces of the quartz pipes 201A to 201C and the U-shaped pipes 17A and 17B, it is still necessary for the inner wall surfaces to have a resistance to the ultraviolet wavelength band (including the spectra of 185 nm and 254 nm). For example, when using a liquid repellent coating agent made of a fluorine compound obtained by bonding fluorine and carbon atoms, for example, it is possible to restrict the degradation (decrease in the water repellent capability) caused by the ultraviolet rays.

The present embodiment has a configuration in which, as shown in FIGS. 1 and 2, the sheet substrate P serving as the processing target object is fed at a constant velocity in the +X-direction by the feeding unit 5 (belt 5C and the like) and, at the same time, the mist carried in the carrier gas CGS sprayed from the nozzle section 30A of the mist spouting section 30 and flowing toward the recovery port section 32A of the mist recovering section 32 distanced from the nozzle section 30A in the +X-direction, is adhered to the surface of the substrate P while flowing in the space between the substrate P and the bottom surface 31A of the air guiding member 31. Such a configuration is disclosed in International Publication WO 2013/176222, for example, and with the feeding velocity of the substrate P being Vf (mm/s) and the flow velocity of the carrier gas CGS (mist) flowing above the substrate P being Vg (mm/s), the feeding velocity Vf and the flow velocity Vg are set to have a relationship of $Vf \approx Vg$ or a relationship of $Vf < Vg$. In this case, with the X-direction distance (mist contact flow path length) from the nozzle section (slit opening) 30A to the recovery port section 32A being Lx (mm), the contact time tcc during which any one location on the surface of the substrate P contacts the carrier gas CGS (mist) is $tcc = Lx/Vf$ (seconds), and the flow velocity Vg of the carrier gas CGS or the concentration of mist in the carrier gas CGS is adjusted such that, during this contact time tcc, the liquid film is formed with a uniform thickness on the surface of the substrate P due to the adhesion of the mist in the carrier gas CGS. When the air guiding member 31 or the like is provided with a variable mist contact flow path length, enabling the adjustment of the X-direction distance Lx (mm) from the nozzle section 30A to the recovery port section 32A, it is possible to adjust the contact time tcc without depending solely on the adjustment of the feeding velocity Vf of the substrate P using this mechanism.

First Preliminary Experiment with Experimental Setup

Figure 6:
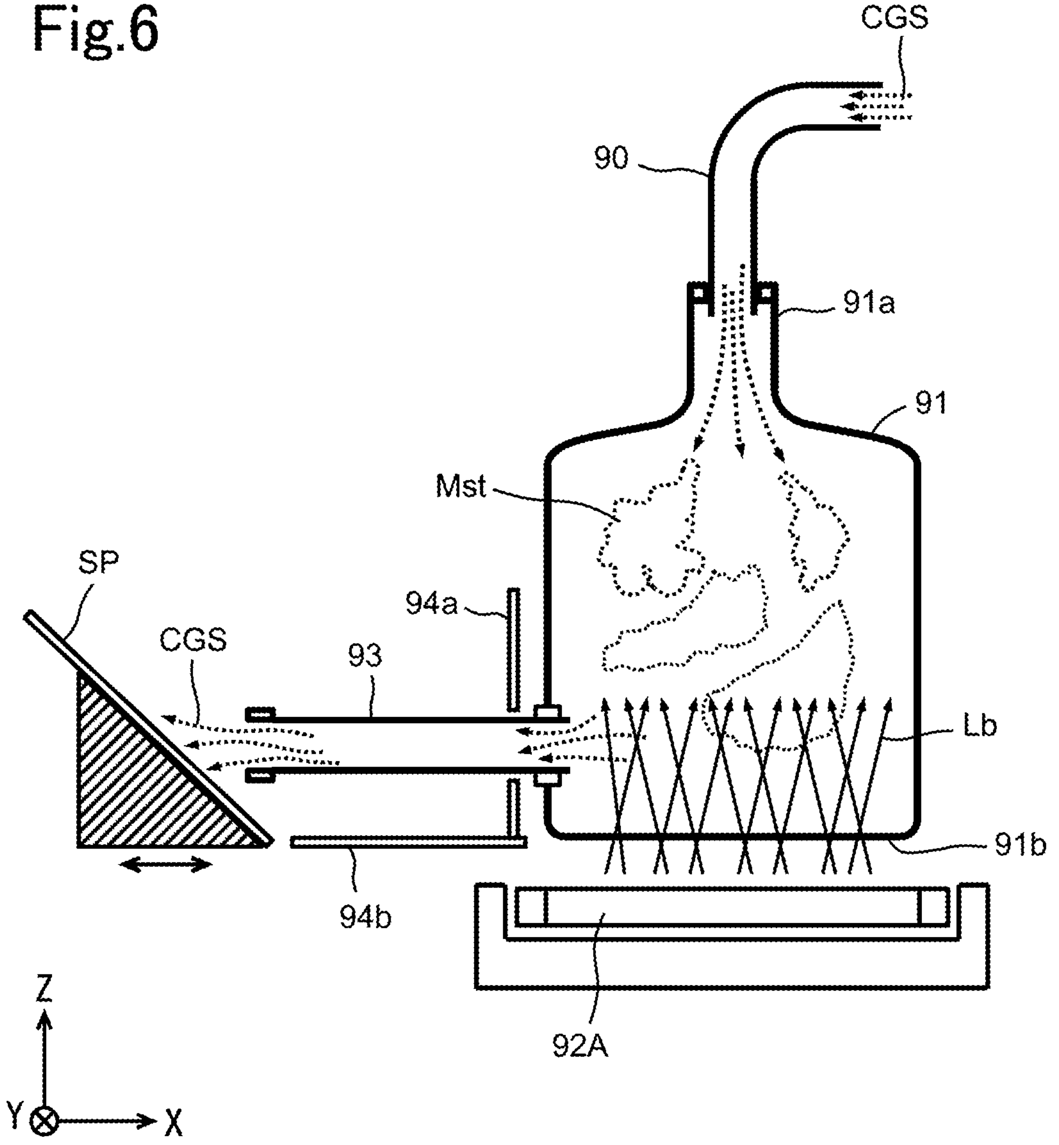
FIG. 6 schematically shows a configuration of an experimental setup for a first preliminary experiment of irradiating the mist in the carrier gas CGS with ultraviolet rays.

The following describes actions and effects in a case where the mist in the carrier gas CGS is irradiated with ultraviolet rays (UV light Lb from a low-pressure mercury discharge lamp). FIG. 6 schematically shows a configuration of an experimental setup for a first preliminary experiment of irradiating the mist in the carrier gas CGS with ultraviolet rays. In FIG. 6, the carrier gas CGS containing the mist is sprayed downward (−Z-direction) at a prescribed flow rate, via a pipe 90 through an inflow port 91*a* of a large flask 91 made of quartz, to fill the flask 91 with mist (particles) Mst. The UV light Lb (including spectra with wavelengths of 254 nm and 185 nm) from the UV light source (low-pressure mercury discharge lamp) 92A is radiated toward the mist Mst from a bottom portion (bottom surface) 91*b* of the flask 91. The carrier gas CGS containing the mist Mst that is irradiated with the UV light Lb over a prescribed time within the flask 91 is sprayed, via a quartz pipe 93 provided horizontally (parallel to the XY plane) in the side wall of the flask 91, onto a sample substrate SP (here, a glass plate or semiconductor wafer substrate) arranged inclined at an angle of 45° relative to the horizontal plane. Light-shielding boards 94*a* and 94*b*, which block the UV light Lb from the UV light source 92A from being radiated into the quartz pipe 93, are provided at a position of the quartz pipe 93 near the outer wall of the flask 91 and a position below the quartz pipe 93.

With the experimental setup of FIG. 6, it is possible to investigate the relationship between the irradiation time (seconds) during which the UV light Lb irradiates the mist in the carrier gas CGS and the resistance value (resistivity) of the thin film formed by the ITO nanoparticles deposited on the sample substrate SP.

Therefore, the time from the timing at which the carrier gas CGS (mist) starts being spouted from the inflow port 91*a* of the flask 91 to the timing at which this carrier gas CGS flows into the quartz pipe 93 was set as the irradiation time Ts (seconds), and the experiment was performed by adjusting the flow rate (flow velocity) of the carrier gas CGS supplied from the pipe 90 to the flask 91 in a manner to adjust the irradiation time Ts to several stages. In this experiment, the X-direction interval between the outlet of the quartz pipe 93 and the sample substrate SP was adjusted according to the flow rate (flow velocity) of the carrier gas CGS, such that the thickness of the ITO thin film deposited on the surface of the sample substrate SP became approximately 50 nm. Furthermore, the sample substrate SP immediately after the mist deposition in the experimental setup of FIG. 6 was heat-dried for a certain time, and then the resistance value (resistivity) of the ITO thin film was measured using the two-terminal method. In the experiment, the ITO nanoparticles were mist-deposited to form a film thickness of 50 nm on each of five sample substrates SP, with the irradiation time Ts of the UV light Lb irradiating the mist Mst being respectively 0 seconds, 20 seconds, 40 seconds, 60 seconds, and 80 seconds. The experiment using this experimental setup was performed in a room temperature environment.

Figure 7:
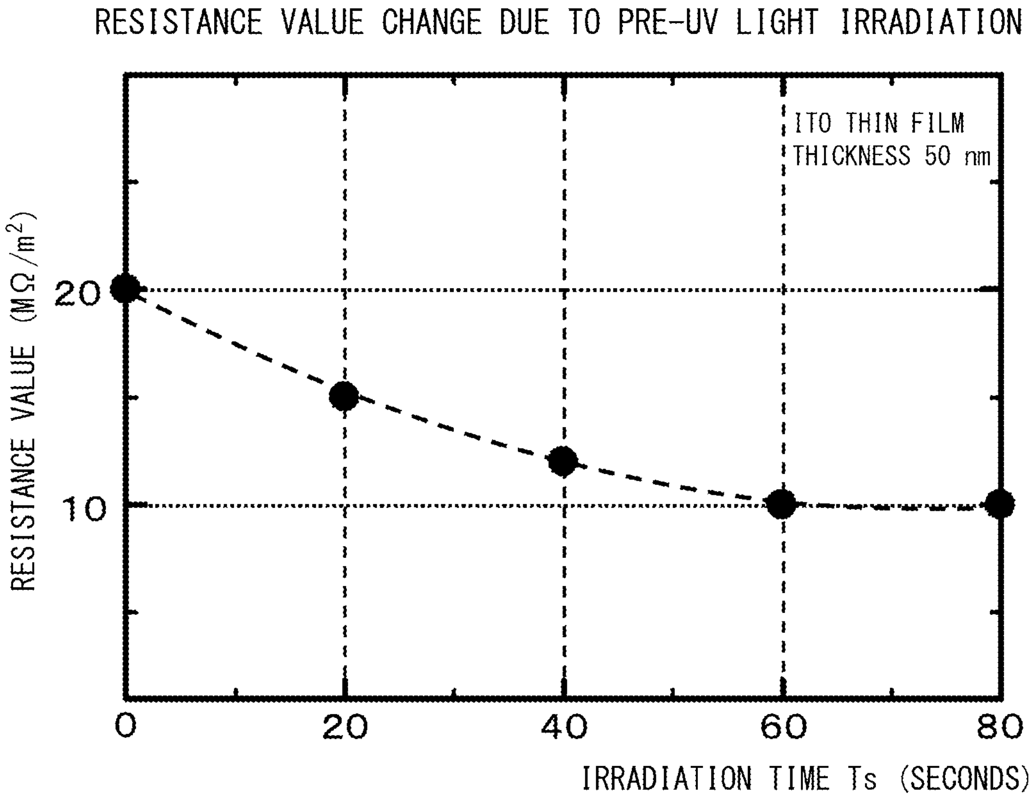
FIG. 7 is a graph showing the measurement results of the resistance value of an ITO thin film deposited while differing the irradiation time of the mist with the ultraviolet rays (UV light), by the experimental setup of FIG. 6.

FIG. 7 is a graph showing measurement results of the resistance value of the ITO thin film deposited on each of the five sample substrates SP using different UV light Lb irradiation times Ts, with the horizontal axis representing the irradiation time Ts (seconds) and the vertical axis representing the resistance value (MΩ/m$^2$) of the ITO thin film. As shown by FIG. 7, it was found that, in a case where the process (pre-UV light irradiation step) of irradiating the mist Mst itself with the ultraviolet rays (UV light Lb) before the mist deposition is performed, the resistance value of the ITO thin film with a film thickness of approximately 50 nm exhibited a high value of approximately 20 MΩ/m$^2$ when the irradiation time Ts was 0 seconds (no irradiation), and when the radiation time Ts became 60 seconds or more, the resistance value dropped by approximately half to a value of approximately 10 MΩ/m$^2$. In the experimental setup of FIG. 6, the space between the UV light source (low-pressure mercury discharge lamp) 92A and the bottom portion 91*b* of the flask 91 was increased so that the bottom portion 91*b* of the flask 91 would not rapidly increase in temperature due to the radiant heat from the UV light source (low-pressure mercury discharge lamp) 92A serving as the heat source. Due to this, the intensity (light amount) of the UV light Lb irradiating the mist Mst within the flask 91 decreased slightly.

Furthermore, it is conceivable that there could be a decrease in the irradiation efficiency (the ratio of the number of mist particles irradiated with the UV light Lb over a prescribed time or longer) due to the UV light Lb being radiated from a vertical direction (Z-direction) that is the same as the direction of the main flow of the mist Mst within the flask 91, and therefore it was speculated that, if the UV light Lb irradiation of the mist Mst in the carrier gas CGS were made efficient, the irradiation time Ts (seconds) needed to reduce the resistance value by approximately half could be shortened, as shown in FIG. 7. Therefore, as shown in FIG. 5, the first embodiment has a configuration in which the UV light Lb from the UV-light sources 210A to 210D arranged very near the outer sides of the quartz pipes 201A to 201C is radiated from a direction (transverse direction) intersecting the direction in which the carrier gas CGS (mist) flows inside the quartz pipes 201A to 201C, via the thermal insulation layer formed by the coolant (pure water) CLq, and therefore it is possible to increase the irradiation efficiency, which in turn makes it possible to shorten the pre-UV light irradiation time Ts compared to the experimental results of FIGS. 6 and 7.

In the present embodiment, the mist deposition is performed in a state where the impurities (organic substances and the like) adhered to the surfaces of the mist particles, the surfaces of the nanoparticles in the mist, and the like in the carrier gas CGS have been efficiently decomposed/removed by the pre-UV light irradiation step performed by the mist modifying section 20 such as shown in FIG. 5, and therefore it is possible to reduce the electrical resistance of the thin film formed by depositing the conductive nanoparticles such as ITO contained in the mist. Furthermore, in the same manner as in the conventional International Publication WO 2013/118353, after having deposited the ITO thin film on the substrate P using mist deposition, when the step (also referred to as the post-UV light irradiation step) of radiating the UV light La having a wavelength of 300 nm or less from the UV irradiation unit 60 shown in FIG. 1 toward this ITO thin film is performed, it is possible to more efficiently decrease the resistance value of the ITO film. Yet further, in a case where it is possible to heat the substrate P to approximately 100° C., after the formation of the ITO thin film on the substrate P, when the ITO thin film is irradiated with the UV light La from the UV irradiation unit 60 while the temperature of the substrate P is increased to 80° C. to 100° C., it is possible to lower the resistance value to approximately several KΩ/m$^2$ to several hundred Ω/m$^2$ in a relatively short time. [ITO Thin Film Electrical Resistance Reduction Process]

Figure 8:
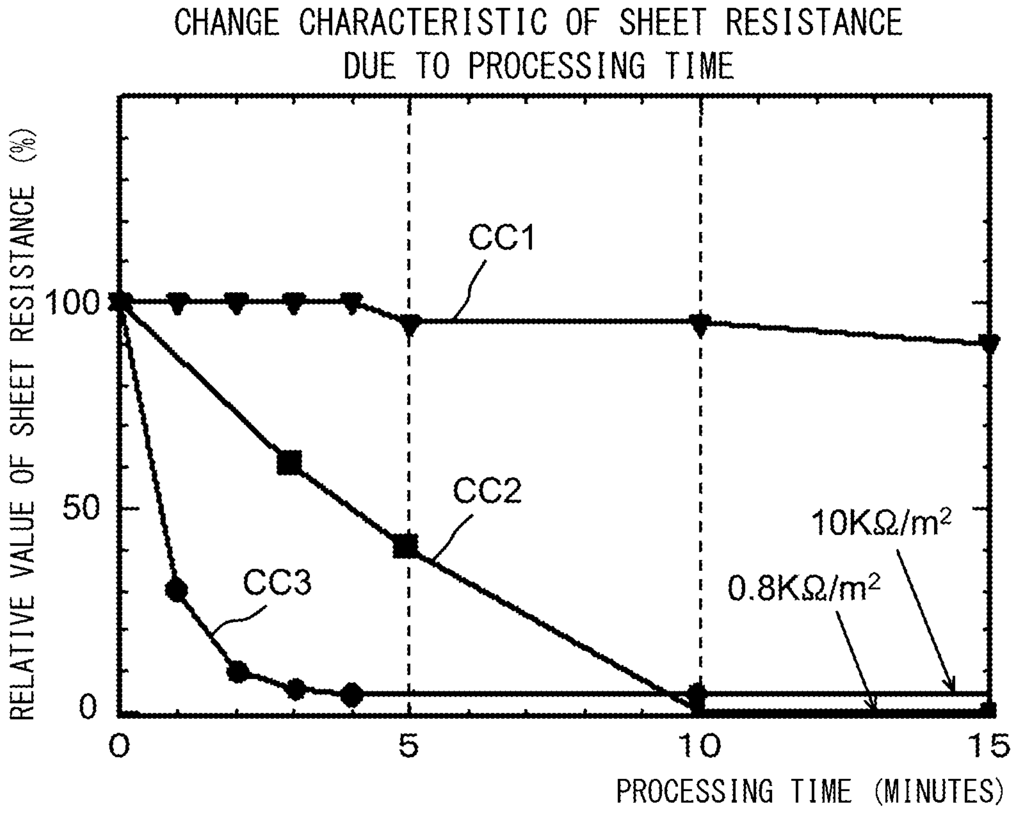
FIG. 8 is a graph of experimental results showing the trend of changes in the resistance value when the ITO thin film deposited on the sample substrate is irradiated with or affected by various types of energy.

Here, a comparison is made among several techniques for reducing the electrical resistance of the ITO thin film formed of ITO nanoparticles deposited using the mist deposition method. FIG. 8 is a graph of experimental results showing the trend of changes in the resistance value when the ITO thin film formed on the sample substrate SP is irradiated with or affected by various types of energy, with the horizontal axis representing the processing time during which the irradiation or effect of the energy continues and the vertical axis representing the relative value (%) of the resistance value using the sheet resistance value when the processing time is zero as a reference (100%). The characteristic CC1 in FIG. 8 represents the relative change of the resistance value of the ITO thin film when the sample substrate SP has been irradiated with 2.45 GHz microwaves in an air atmosphere, in a state of having been heated to approximately 80° C., the characteristic CC2 in FIG. 8 represents the relative change of the resistance value of the ITO thin film when the sample substrate SP has been heated to approximately 120° C. by an infrared lamp in an argon gas atmosphere, and the characteristic CC3 in FIG. 8 represents the relative change of the resistance value of the ITO thin film when the sample substrate SP has been irradiated with ultraviolet rays (UV light Lb) from a low-pressure mercury discharge lamp, in a nitrogen gas atmosphere and a room temperature (unheated) state. In this experiment, the pre-UV light irradiation process is not performed on the mist Mst before the mist deposition.

As shown by the characteristic CC2 of FIG. 8, if the sample substrate SP can be heated to a high temperature, it is possible to significantly reduce (0.8 KΩ/m$^2$) the resistance value of the ITO film, but this requires approximately 10 minutes of heating. In contrast to this, as shown by the characteristic CC3, when the sample substrate SP (ITO thin film) is irradiated with the UV light from the low-pressure mercury discharge lamp in a room temperature environment, it is possible to significantly reduce (10 KΩ/m$^2$) the resistance value of the ITO film in approximately 5 minutes. However, as shown by the characteristic CC3, the resistance value of the ITO film stops decreasing at around 10 KΩ/m$^2$, even when the UV light irradiation time is made greater than approximately 5 minutes, and no further resistance reduction was seen. It is speculated that this was because the molecules and the like of organic substances (carbon-based and amino-based organic substances) were included as impurities in the mist particles adhered to the surface of the sample substrate SP during the mist deposition, these impurities remained within the film when the ITO nanoparticles had been deposited with a prescribed film thickness on the sample substrate SP, and even though the decomposition/removal of the impurities by the UV light irradiation affected the surface layer of the ITO thin film, this decomposition/removal of the impurities did not effectively act on the inside of the film (film bottom portion).

Second Preliminary Experiment with Experimental Setup

Figure 9:
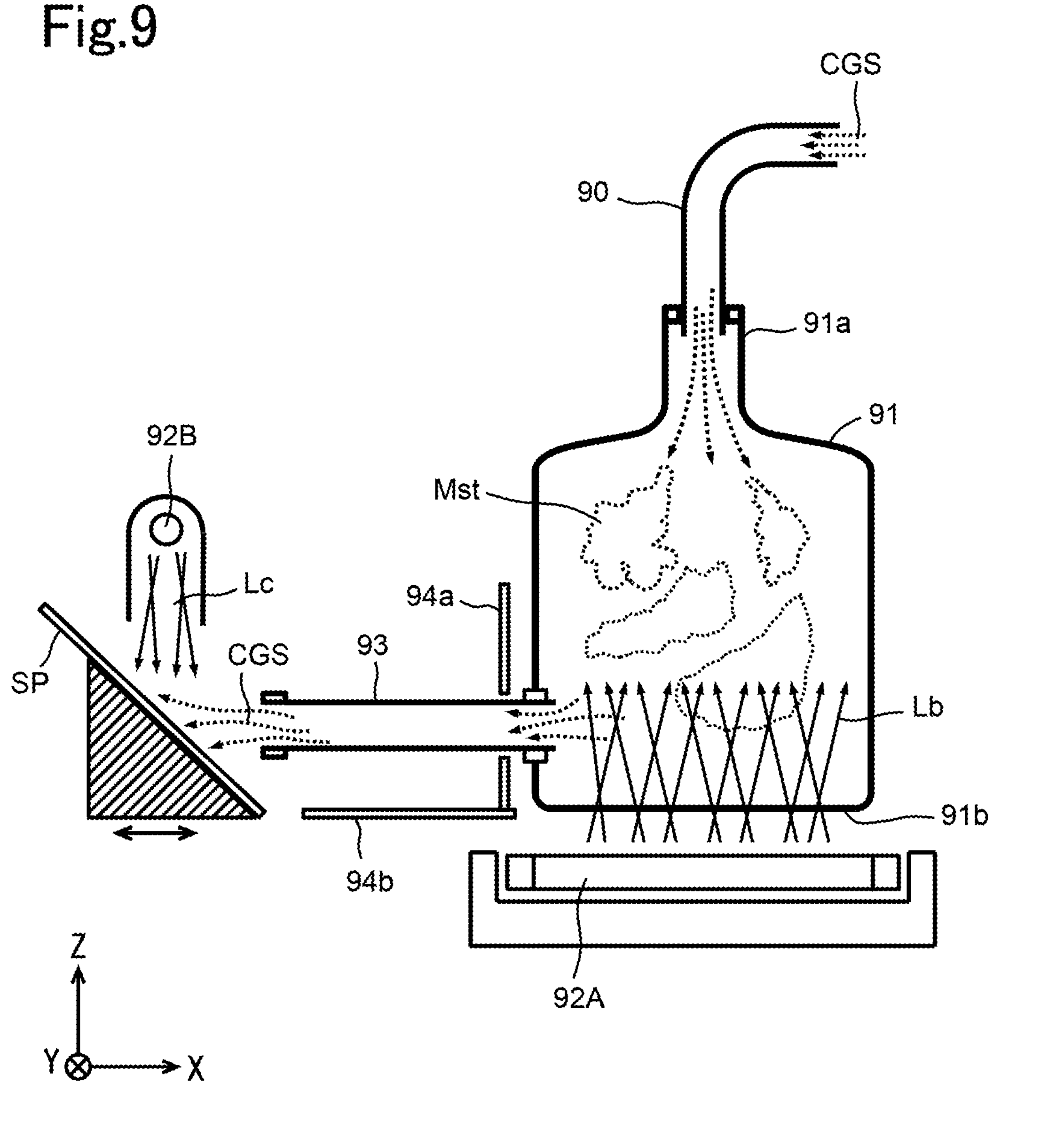
FIG. 9 schematically shows a configuration of the experimental setup for the second preliminary experiment of irradiating the mist in the carrier gas CGS and the deposited ITO film with ultraviolet rays.

The second preliminary experiment was performed to see how the resistance value of the ITO thin film changes according to whether or not the pre-UV light irradiation process (first-stage UV irradiation process) of irradiating the mist particles (Mst) with the UV light Lb before the mist deposition, as in the present embodiment, is performed before the post-UV light irradiation process (second-stage ultraviolet irradiation process) of irradiating the sample substrate SP with UV light after the mist deposition. FIG. 9 shows a configuration of the experimental setup for the second preliminary experiment, in which a UV light source 92B for radiating UV light Lc toward the sample substrate SP during mist deposition has been added to the experimental setup of FIG. 6. The UV light source 92B is a rod-shaped low-pressure mercury discharge lamp in the same manner as the UV light source 92A, is arranged extending in the Y-direction in FIG. 9, and is oriented such that the flask 91 and the quartz pipe 93 are not irradiated with the UV light Lc.

In the second preliminary experiment, the second-stage ultraviolet irradiation process (irradiation of the ITO thin film deposited on the sample substrate SP with the UV light Lc) is performed using the UV light source 92B while spraying (during mist deposition) the carrier gas CGS containing the mist Mst spouted from the quartz pipe 93 onto the sample substrate SP. Accordingly, the second-stage ultraviolet irradiation process includes a first phase in which, during a period (during mist deposition) when the mist can be adhered to the sample substrate SP (or substrate P), the substrate surface is irradiated with the UV light Lc, and a second phase in which the thin film deposited with a prescribed thickness on the substrate surface after the mist deposition period has ended is irradiated with the UV light La from the UV irradiation unit 60 shown in FIG. 1. Furthermore, the time (i.e. the irradiation time Ts) of the first-stage ultraviolet irradiation process (irradiation of the mist Mst with the UV light Lb) performed by the UV light source 92A is set to 0 seconds, 20 seconds, 40 seconds, 60 seconds, and 80 seconds by changing the carrier gas CGS flow rate (flow velocity) in the same manner as in the first preliminary experiment, and this time is set to the time from the timing at which the carrier gas CGS (mist) starts being spouted from the inflow port 91*a* of the flask 91 to the timing at which this carrier gas CGS flows into the quartz pipe 93 as shown in FIG. 9. Furthermore, in the second preliminary experiment, the processing time of the first phase in the second-stage ultraviolet irradiation process performed by the UV light source 92B was set to be the same as the irradiation time Ts in the first-stage ultraviolet irradiation process, and the X-direction distance from the outlet of the quartz pipe 93 to the sample substrate SP was adjusted such that the ITO thin film with a thickness of approximately 50 nm was deposited on the sample substrate SP during the designated irradiation time Ts.

Figure 10:
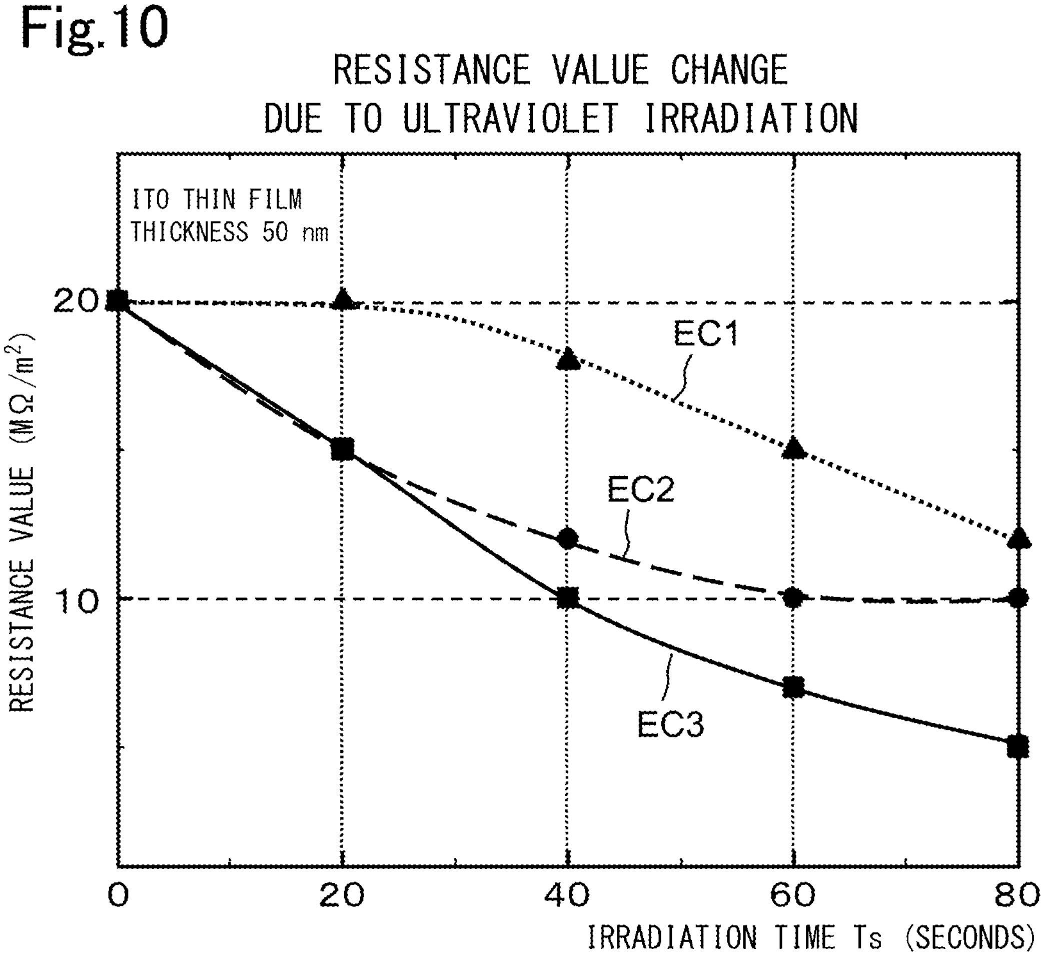
FIG. 10 is a graph showing measurement results of the resistance value of the ITO thin film obtained using different ultraviolet ray (UV light) irradiation times in the second preliminary experiment using the experimental setup of FIG. 9.

FIG. 10 is a graph showing measurement results of the resistance value of the ITO thin film deposited on each of the five sample substrates SP using different irradiation times Ts in the second preliminary experiment, with the horizontal axis representing the irradiation time Ts (seconds) and the vertical axis representing the resistance value (MΩ/m$^2$) of the ITO thin film. In FIG. 10, the characteristic EC1 represents the change of the resistance value of the ITO thin film when, without performing the first-stage ultraviolet irradiation process and without performing the ultraviolet irradiation process (first phase) during the mist deposition, only the second phase of the second-stage ultraviolet irradiation process of radiating the UV light La from the UV irradiation unit 60 such as shown in FIG. 1 for the designated time (0, 20, 40, 60, or 80 seconds) after the ITO thin film with a film thickness of approximately 50 nm has been deposited on the sample substrate SP was performed. The characteristic EC2 of FIG. 10 represents the change of the resistance value of the ITO thin film deposited with a film thickness of approximately 50 nm by spraying the mist Mst that has been irradiated with the UV light Lb onto the sample substrate SP using only the first-stage ultraviolet irradiation process, and this characteristic is the same as in FIG. 7 above. The characteristic EC3 in FIG. 10 represents the change of the resistance value of the ITO thin film deposited with a film thickness of approximately 50 nm on the sample substrate SP by applying, in parallel, the first-stage ultraviolet irradiation process performed using the UV light source 92A and the first phase of the second-stage ultraviolet irradiation process performed using the UV light source 92B.

From the results of this second preliminary experiment, an ultraviolet (UV light La) irradiation time of approximately 30 seconds is necessary until the resistance value starts to decrease in the characteristic EC1 (where only the second phase of the second-stage ultraviolet irradiation process is performed), while in contrast, the resistance value exhibits a tendency of decreasing gradually from the start of the ultraviolet (UV light Lb or UV light Lc) irradiation in the characteristic EC2 (where only the first-stage ultraviolet irradiation process was performed) and the characteristic EC3 (where both the first-stage ultraviolet irradiation process and the first phase of the second-stage ultraviolet irradiation process were performed). When the ultraviolet (UV light Lb or UV light Lc) irradiation time was 80 seconds, the initial resistance value (approximately 20 MΩ/m$^2$) was reduced to approximately half (10 MΩ/m$^2$) in the characteristic EC2, in the same manner as in FIG. 7, and the initial resistance value (approximately 20 MΩ/m$^2$) was reduced to approximately 1/4 (5 MΩ)/m$^2$) in the characteristic EC3. Based on the results of the second preliminary experiment, in order to efficiently reduce, in a room temperature (or a temperature less than 100° C.) environment, the resistance value of the thin film formed of ITO nanoparticles deposited using mist deposition on the substrate P, it is favorable to perform, in parallel, the first-stage ultraviolet irradiation process and the second-stage ultraviolet irradiation process (both the first phase and the second phase). Furthermore, if it is possible to set the substrate P to a high temperature (e.g. 100° C. or more), when the substrate P is heated during the performance of the second phase of the second-stage ultraviolet irradiation process, a further decrease in the resistance of the ITO thin film can be expected from the results of the characteristic CC2 shown in FIG. 8 above.

The mist deposition apparatus according to the present embodiment shown in FIGS. 1 to 5 is configured based on the results obtained from the first preliminary experiment and the second preliminary experiment described above, and in the configuration shown in FIG. 1, the first-stage ultraviolet irradiation process is performed by the mist modifying section 20 and the second phase of the second-stage ultraviolet irradiation process is performed by the UV irradiation unit 60. In FIGS. 1 and 2, a configuration is used in which the surface of the substrate P positioned directly below the air guiding member 31 is in a horizontal state that is parallel to the XY-plane and the substrate P is fed in the +X-direction, but the feeding unit 5, which includes the belt 5C, the support table 5D, and the like shown in FIG. 2, the mist spouting section 30, the air guiding member 31, and the mist recovering section 32 may be arranged integrally to rotate on the Y-axis, in a manner to incline the surface of the substrate P within a range of 30 degrees to 60 degrees relative to the XY-plane. The benefits of performing the mist deposition in a state where the substrate P is inclined relative to the feeding direction (longitudinal direction) in this manner are disclosed in International Publication WO 2015/159983, for example.

According to the present embodiment described above, it is possible to obtain a mist generation apparatus that, in order to deposit a layer (thin film) made of a material substance (e.g. ITO) on the surface of a processing target object (substrate P), sprays a carrier gas (CGS) containing a mist (Mst) of a solution containing fine particles or molecules of the material substance onto the surface of the processing target object, the mist generation apparatus comprising a mist generating section (14) that atomizes the solution to send out the carrier gas containing the mist, and an ultraviolet radiating section (UV light source unit 20B in a mist modifying section 20) that is provided corresponding to a flow path up to where the carrier gas (CGS) from the mist generating section (14) is sprayed toward the surface of the processing target object and that irradiates mist that is floating and flowing within the carrier gas (CGS) with ultraviolet light (UV light Lb) having a wavelength of 400 nm or less, wherein the mist generation apparatus generates the carrier gas (CGS) for mist deposition from which impurity molecules and the like of organic substances that have adhered to the surface of the nanoparticles or been contained within the mist particles have been efficiently decomposed/removed.

Furthermore, according to the present embodiment, it is possible to obtain a mist deposition apparatus that sprays mist of a solution containing fine particles or molecules made of a material substance onto the surface of a processing target substrate (P) to form a layer made of the material substance on the surface of the processing target substrate (P), the mist deposition apparatus comprising a mist generating section (14) that sends out a carrier gas (CGS) containing the mist (Mst) generated by atomizing the solution; a mist spouting section (30) that spouts the carrier gas (CGS) toward the surface of the processing target substrate (P); a moving mechanism (feeding unit 5 including a belt 5C) that moves the processing target substrate (P) and the mist spouting section (30) relative to each other in a direction along the surface of the processing target substrate (P); a flow path forming section (flow path section 20A formed by quartz pipes 201A, 201B, and 201C) that includes surrounding wall surfaces that form a flow path of the carrier gas (CGS) leading to the mist spouting section (30) from the mist generating section (14), with at least a portion of these wall surfaces being formed by a light-transmitting member (quartz or the like); and a first light irradiation section (UV light source unit 20B) that radiates ultraviolet light (UV light Lb) having a wavelength of 400 nm or less toward the carrier gas (CGS) flowing inside the flow path forming section (20A), via the light-transmitting member of the flow path forming section (20A), wherein it is possible to increase a characteristic of a layer (thin film) made of the material substance deposited on the processing target object by the mist deposition realized by the above.

Second Embodiment

Figure 11:
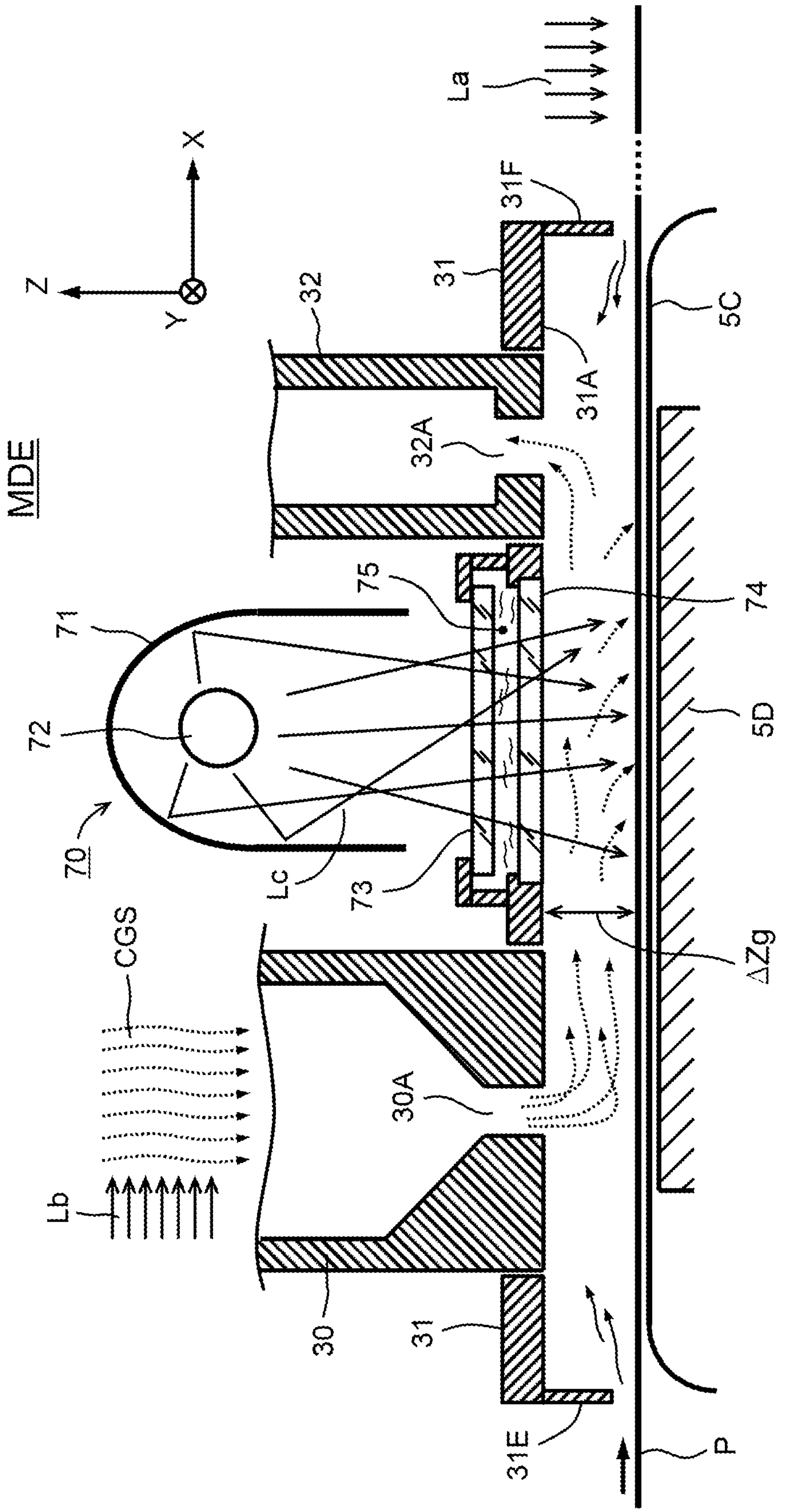
FIG. 11 is a partial cross-sectional view of the main portions of the mist deposition apparatus MDE according to a second embodiment.

FIG. 11 is a partial cross-sectional view of a mist depositing section according to the second embodiment, which follows the configuration of the mist depositing section of the mist deposition apparatus MDE shown in FIGS. 1 to 5 above, and in FIG. 11, components that are the same as those shown in FIGS. 1 to 5 are given the same reference numerals. Furthermore, the XYZ orthogonal coordinate system of FIG. 11 is set in the same manner as in FIGS. 1 to 5.

In the present embodiment, based on the second preliminary experiment described above, a UV irradiation unit 70, which radiates ultraviolet rays toward the substrate P during the mist deposition (during the period when mist is adhered to the substrate P) as well, is provided above the air guiding member 31 between the mist spouting section 30 and the mist recovering section 32. Based on the second preliminary experiment (FIG. 10), the first-stage ultraviolet irradiation process (irradiating the carrier gas CGS containing the mist with the UV light Lb) is performed by the same mist modifying section 20 as in FIGS. 1 to 5 above, and the first phase of the second-stage ultraviolet irradiation process, in the present embodiment, is performed by a process of radiating the UV light Lc from the UV irradiation unit 70 of FIG. 11 (corresponding to the UV light Lc irradiation process using the UV light source 92B in FIG. 9).

In FIG. 11, the UV irradiation unit 70 is formed by a reflective member 71 that includes a concave cylindrical reflective surface that has a generatrix extending in the Y-direction; a rod-shaped long arc low-pressure mercury discharge lamp (UV light source) 72 arranged extending in the Y-direction at the focal position of the concave cylindrical reflective surface or a position intentionally shifted from this focal position; two quartz boards 73 and 74 arranged in parallel to the XY plane (parallel to the substrate P), and above the substrate P with a prescribed gap 75 therebetween in the Z-direction; and pure water (coolant liquid) or gas for cooling (for temperature adjustment) filling the gap 75. The bottom surface (wall surface defining the flow path of the carrier gas CGS containing the mist) of the quartz board 74 is provided to be flush with the bottom surface 31A of the air guiding member 31, and is surface-treated to be liquid-repellent to the mist (pure water) in the same manner as the bottom surface 31A. In the present embodiment as well, the increase in the temperature of the quartz board 74 caused by the radiant heat from the UV light source 72 is restricted by filling the gap 75 between the top surface of the quartz board 74 and the bottom surface of the quartz board 73 with the coolant liquid (pure water) or the gas and causing this coolant liquid (pure water) or gas to flow at a prescribed flow rate.

In the present embodiment, as shown in FIG. 11, side boards 31E and 31F, which extend downward (−Z-direction), are provided at the respective X-direction (feeding direction of the substrate P) end portions of the air guiding member 31. In a case where the Z-direction interval ΔZg between the bottom surface 31A of the air guiding member 31 and the substrate P becomes relatively large (e.g. 5 mm or more), it is possible to increase the effect of making the pressure inside of the flow path of the carrier gas CGS surrounded by the substrate P and the air guiding member 31 (bottom surface 31A and side boards 31B, 31C, 31E, and 31F) slightly lower than the outside in order to restrict the flow of the carrier gas CGS to the outside, by narrowing the Z-direction interval between the surface of the substrate P and the edges (extending in the Y-direction) of the bottom end portions of the side boards 31E and 31F. Furthermore, in the present embodiment, in the same manner as in the first embodiment (FIG. 1) described above, it is possible to further irradiate the substrate P after the mist deposition with the UV light La from the UV irradiation unit 60, to reduce the resistance value of the deposited ITO thin film in a short time.

First Modification

The following describes a first modification applied to the first embodiment or the second embodiment, based on FIGS.

Figure 12:
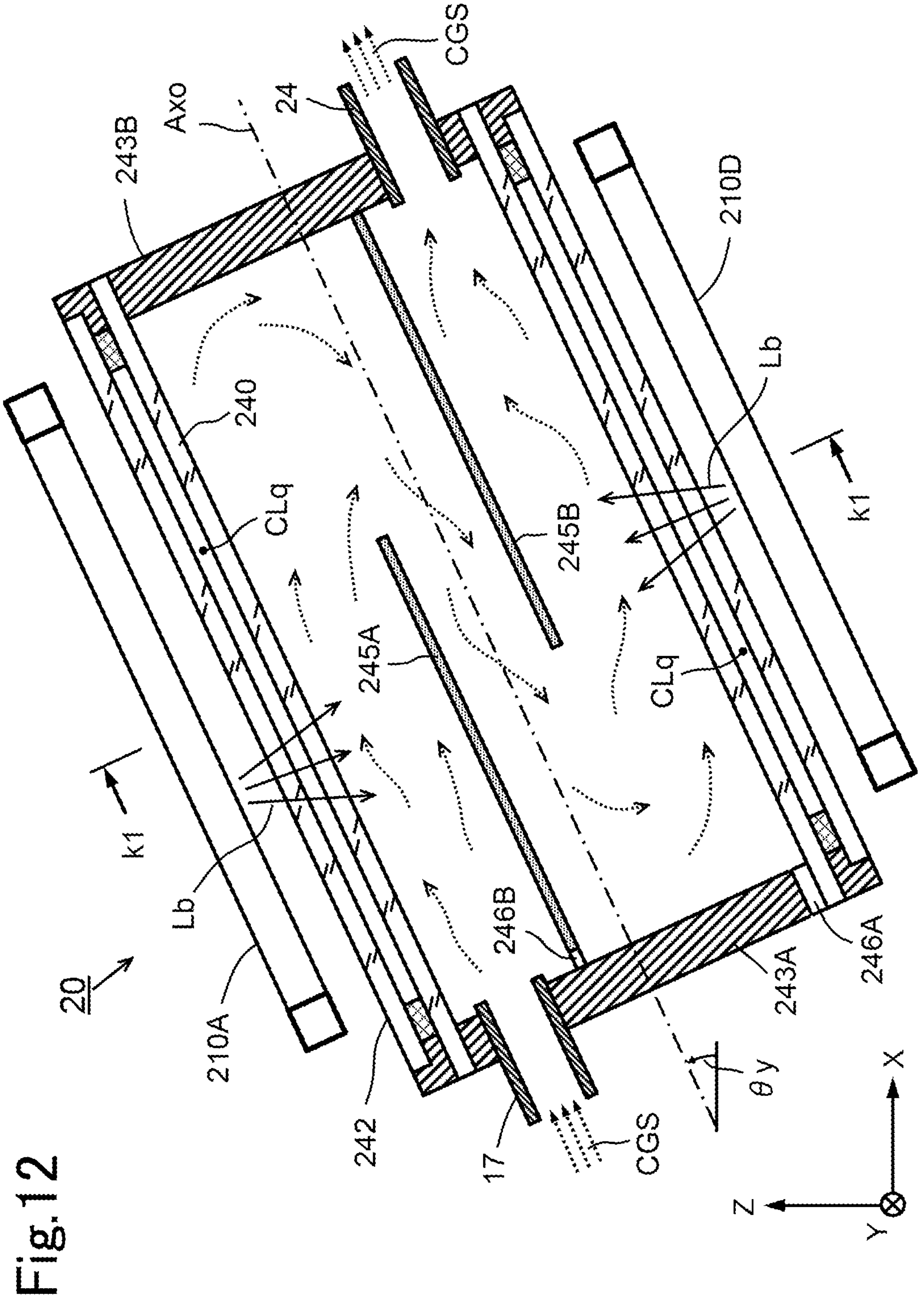
FIG. 12 is a cross-sectional view of a configuration of a first modification of the mist modifying section 20 applied to the first embodiment or the second embodiment.
Figure 13:
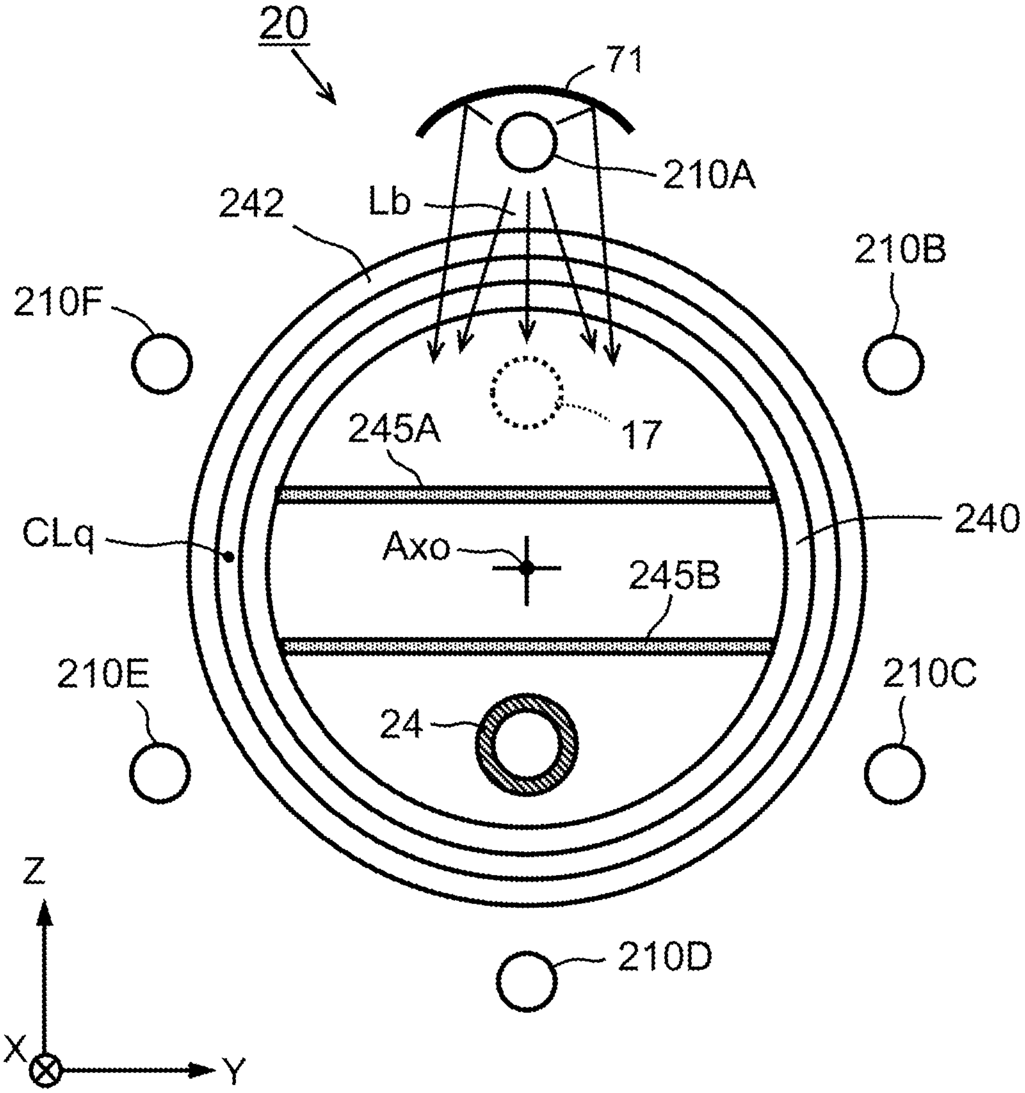
FIG. 13 shows a cross section, seen over the arrow k1-k1, of the mist modifying section 20 according to the first modification of FIG. 12.

12 and 13. FIGS. 12 and 13 show a modification of the mist modifying section 20 shown in FIG. 5, and the XYZ orthogonal coordinate system is set in the same manner as described above, with the Z-direction being the direction of gravity (vertical direction) and the XY-plane being the horizontal plane. FIG. 12 shows a cross section when the mist modifying section 20 is cut along a plane parallel to the XZ-plane, and FIG. 13 shows a cross section seen over the arrow k1-k1 of FIG. 12. The mist modifying section 20 according to the present modification is configured to reduce the pressure loss caused by the flow path being folded back and forth a plurality of times due to the flow path forming section 20A (quartz pipes 201A to 201C and U-shaped pipes 17A and 17B) such as shown in FIG. 5. Therefore, the flow path forming section of the present modification is formed by a quartz pipe (inner wall pipe) 240 that is on the inside and has a large diameter from the center line Axo; an outer quartz pipe (also referred to as an outer wall pipe) 242 that is on the outside and surrounds the inner wall pipe 240; disc-shaped end portion sealing members 243A and 243B that seal both end portions of the inner wall pipe 240 and an outer wall pipe 242 in the direction in which the center line Axo extends; and rectifier boards 245A and 245B provided inside the inner wall pipe 240. The inner wall pipe 240 is a circular pipe with an inner diameter of approximately 12 cm to 20 cm and a thickness of several millimeters or less, the inner diameter of the outer wall pipe 242 is set to be at least several millimeters larger than the outer diameter of the inner wall pipe 240, and a gap of approximately 1 mm to several millimeters in the radial direction is formed uniformly between the outer circumferential surface of the inner wall pipe 240 and the inner circumferential surface of the outer wall pipe 242. The gap between the outer circumferential surface of the inner wall pipe 240 and the inner circumferential surface of the outer wall pipe 242 is filled with the coolant (pure water) CLq that has been temperature-adjusted such as described in FIG. 5. Although not shown in FIG. 13, parts of the end portion sealing members 243A and 243B are provided with a supply port section and a discharge port section allowing the coolant (pure water) CLq to flow.

Furthermore, in the present modification, the pipe 17 for introducing the carrier gas CGS from the mist generating section 14 in FIG. 1 is connected at a position distanced upward in the Z-direction from the center line Axo of the end portion sealing member 243A, and the pipe 24 for discharging the carrier gas CGS toward the mist spouting section 30 in FIG. 1 is connected at a position distanced downward in the Z-direction from the center line Axo of the end portion sealing member 243B. Furthermore, when viewed from the Y-direction, the rectifier board 245A attached to the end portion sealing member 243A side parallel to the center line Axo and the rectifier board 245B attached to the end portion sealing member 243B side parallel to the center line Axo are provided inside the inner wall pipe 240. The rectifier boards 245A and 245B form the flow path of the carrier gas CGS, and these rectifier boards 245A and 245B are arranged with an interval therebetween in the Z-direction (direction perpendicular to the center line Axo), as shown in FIG. 13, so that the carrier gas CGS that contains the mist and that has flowed into the inner wall pipe 240 via the pipe 17 travels inside the inner wall pipe 240 while the flow thereof is folded back by the rectifier boards 245A and 245B, to be discharged from the pipe 24. The rectifier boards 245A and 245B may be any material that has a high resistance to ultraviolet rays and high water resistance, without any particular concern about the amount of transmittance for ultraviolet rays, but are preferably quartz boards. Furthermore, the inner circumferential surface of the inner wall pipe 240, the surfaces of the rectifier boards 245A and 245B, and the inner surfaces of the end portion sealing members 243A and 243B are each surface-processed to realize a high liquid-repellent state (e.g. a state where the contact angle when droplets are formed and adhered thereto is 90 degrees or more).

As shown in FIGS. 12 and 13, the six rod-shaped UV light sources (low-pressure mercury discharge lamps) 210A, 210B, 210C, 210D, 210E, and 210F are arranged around the outer wall pipe 242 so as to be approximately parallel to the center line Axo and provided at angular intervals of approximately 60 degrees centered on the center line Axo. The UV light Lb generated from the six UV light sources 210A to 210F (including spectra having wavelengths of 254 nm and 185 nm) is transmitted through the outer wall pipe 242, the coolant (pure water) CLq layer, and the inner wall pipe 240 to irradiate the mist floating along with the carrier gas CGS flowing inside the inner wall pipe 240, from a plurality of directions simultaneously. Therefore, the first-stage ultraviolet irradiation process (process of cleaning organic impurities and the like other than the nanoparticles of the material substance contained in the mist) is completed efficiently in a short time. In the present modification as well, in the same manner as the mist modifying section 20 of FIG. 5, even though the six UV light sources 210A to 210F are brought as close as possible to the outer circumferential surface of the outer wall pipe 242 in order to increase the amount of UV light Lb irradiating the carrier gas CGS (mist), the region around the inner wall pipe 240 storing the carrier gas CGS is adjusted to be within a prescribed temperature range by the coolant (pure water) CLq, and therefore a temperature increase of the carrier gas CGS caused by the radiant heat from the UV light sources 210A to 210F is prevented. If a concave cylindrical reflective member 71, similar to that shown in FIG. 11, is provided for each of the UV light sources 210A to 210F on the side opposite the outer wall pipe 242, it is possible to further increase the amount of UV light Lb irradiating the carrier gas CGS (mist).

Furthermore, as shown in FIG. 12, in the present modification, the entire mist modifying section 20 is arranged at an incline with the end portion sealing member 243A positioned at the bottom such that the center line Axo thereof is inclined at an angle θy in a range of 30 degrees to 60 degrees relative to the XY-plane. This is so that, in a case where the temperatures of the inner circumferential surface of the inner wall pipe 240, the inner surfaces of the end portion sealing members 243A and 243B, and the like are slightly lower than the temperature of the carrier gas CGS flowing in from the pipe 17, and when the mist condenses and forms droplets (size on the order of millimeters) in those surfaces, these droplets are efficiently recovered. In the present modification, if the mist condenses to form droplets and adheres to any of the inner circumferential surface of the inner wall pipe 240, the inner surfaces of the end portion sealing members 243A and 243B, and the surfaces of the rectifier boards 245A and 245B, when the diameters of these droplets become large, the droplets flow as far downward as possible in the direction of gravity along the respective surfaces.

Therefore, in the present modification, as shown in FIG. 12, an opening 246A for recovering the droplets is provided at the same position as the inner circumferential surface of the inner wall pipe 240 at the bottom of the end portion sealing member 243A that is farthest downward in the direction of gravity, and a recovery pipe can be connected to this opening 246A. The opening 246A may have a size allowing the droplets (diameters of several millimeters) to pass through, and the inner circumferential surface (inner wall surface) of the opening 246A may be made lyophilic so that the contact angle is 20 degrees or less. Furthermore, since droplets also gather and pool at the bonding portion between the rectifier board 245A and the end portion sealing member 243A if the mist modifying section 20 is inclined at the angle θy as shown in FIG. 12, a notch 246B is partially or discretely formed in a Y-direction part of the attachment portion where the rectifier board 245A is attached to the end portion sealing member 243A, so that the droplets flow to the opening 246A across the inner surface of the end portion sealing member 243A. The liquid obtained from the opening 246A via the recovery pipe may be returned to the solution tank 10 shown in FIG. 1 above.

In FIGS. 12 and 13, the entire mist modifying section 20 may be installed in a state realized by rotating the mist modifying section 20 by 90 degrees on the center line Axo from the state shown in the drawings. In such a case, the opening 246A is provided at a position rotated approximately 90 degrees (a position at the bottommost portion of the end portion sealing member 243A in the Z-direction). On the other hand, since the rectifier boards 245A and 245B are in a vertical state, pooling does not occur at the bonding portion between the rectifier board 245A and the end portion sealing member 243A and the bonding portion between the rectifier board 245B and the end portion sealing member 243B, and therefore the notch 246B does not need to be provided. Furthermore, since the coolant CLq filling the gap between the outer circumferential surface of the inner wall pipe 240 and the inner circumferential surface of the outer wall pipe 242 transmits the UV light Lb (including a spectrum with a wavelength of 200 nm or less), pure water is preferable, but a temperature-controlled gas is also acceptable. In such a case, the temperature-controlled gas should flow with a high flow velocity between the outer circumferential surface of the inner wall pipe 240 and the inner circumferential surface of the outer wall pipe 242.

Second Modification

Figure 14:
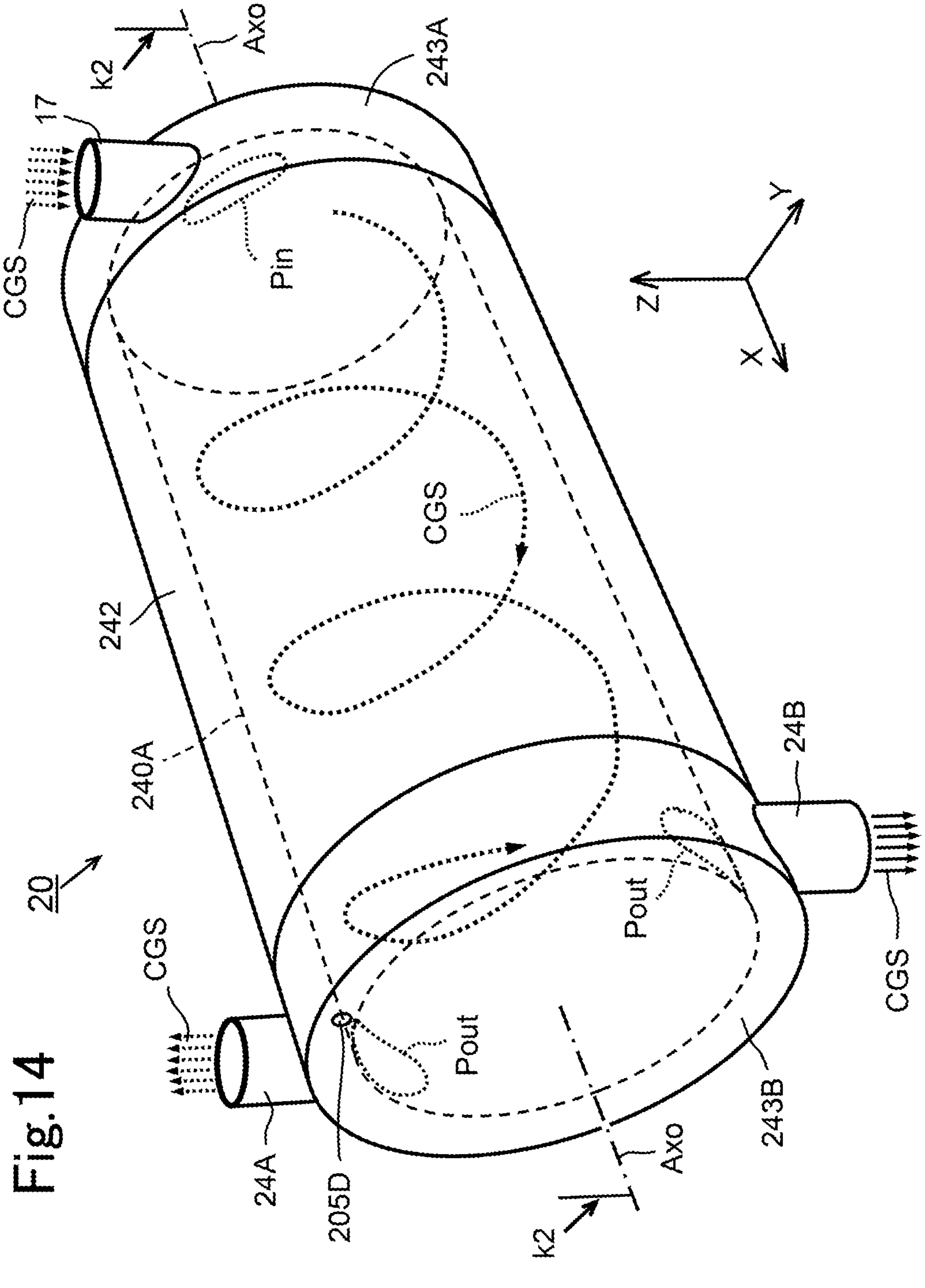
FIG. 14 is a cross-sectional view of a configuration of a second modification of the mist modifying section 20 applied to the first embodiment or the second embodiment.
Figure 15:
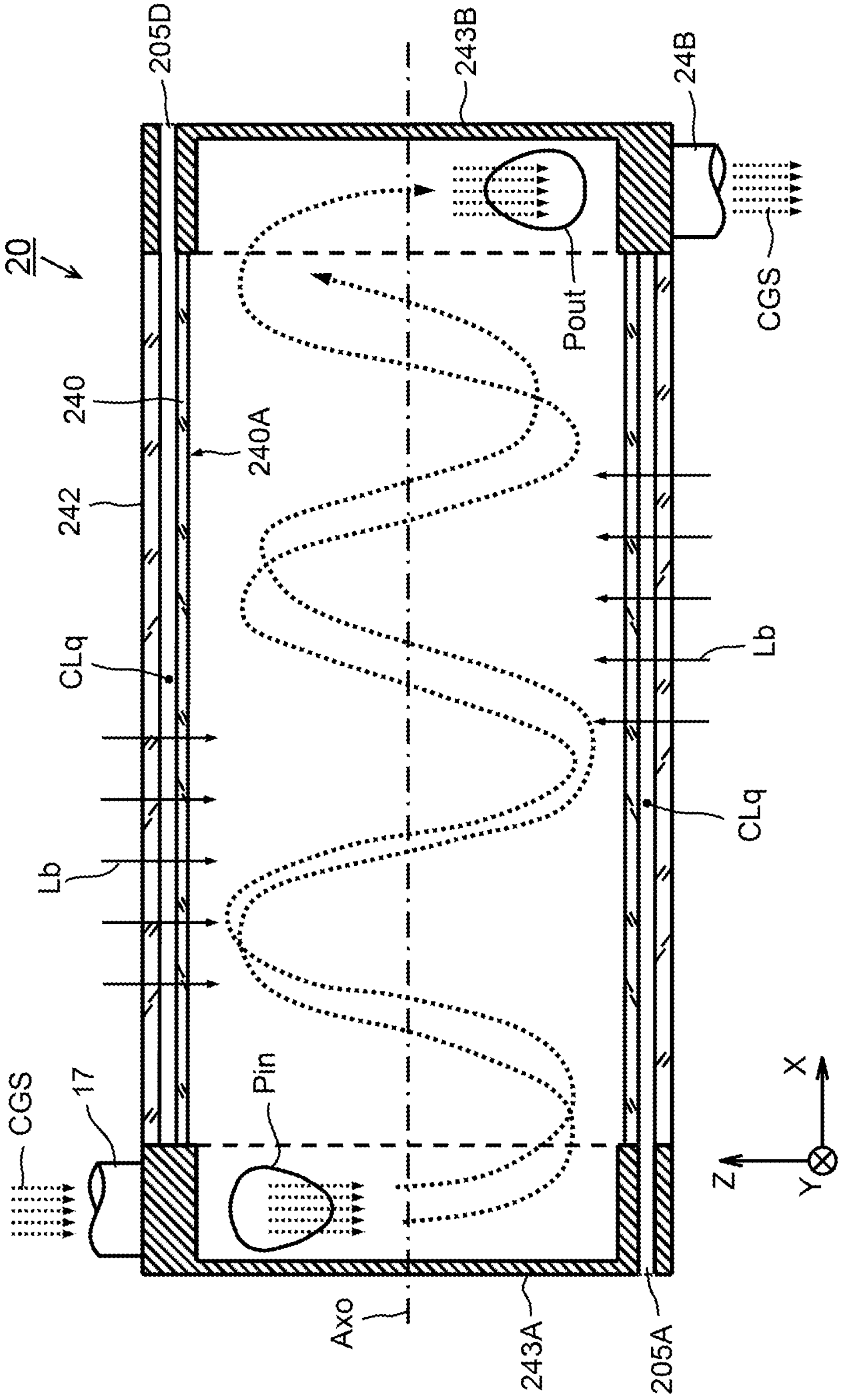
FIG. 15 shows a cross section, seen over the arrow k2-k2, of the mist modifying section 20 according to the second modification of FIG. 14.

The following describes a second modification applied to the first embodiment or the second embodiment, based on FIGS. 14 and 15. FIGS. 14 and 15 show a modification of the mist modifying section 20 shown in FIG. 5, and the XYZ orthogonal coordinate system is set in the same manner as described above, with the Z-direction being the direction of gravity (vertical direction) and the XY-plane being the horizontal plane. FIG. 14 is a perspective view of the outer appearance of the mist modifying section 20 according to the second modification, and FIG. 15 shows a cross section seen over the arrow k2-k2 of FIG. 14. The mist modifying section 20 according to the present modification is formed by a quartz pipe (inner wall pipe) 240 that is on the inside and has a large diameter from the center line Axo; an outer quartz pipe (outer wall pipe) 242 that is on the outside and surrounds the inner wall pipe 240; and end portion sealing members 243A and 243B that seal both end portions of the inner wall pipe 240 and the outer wall pipe 242 in the direction in which the center line Axo extends, in the same manner as the first modification of FIGS. 12 and 13 above. However, in the present modification, the end portion sealing members 243A and 243B are not formed in simple disc shapes, but are instead formed in cylindrical shapes that have a certain width in the direction of the center line Axo, as shown in FIG. 15. The end portion sealing members 243A and 243B are formed of a material (e.g. stainless steel or ceramics) that has a high resistance to ultraviolet rays and experiences little corrosion from liquid (mist).

As shown in FIGS. 14 and 15, the carrier gas CGS containing the mist supplied from the mist generating section 14 shown in FIG. 1 is spouted from a suction port (opening) Pin formed in the cylindrical inner circumferential surface of the end portion sealing member 243A, via the pipe 17, into the internal space of the inner wall pipe 240 along the circumferential direction (tangential direction) of an inner circumferential surface 240A of the inner wall pipe 240. The carrier gas CGS spouted from the suction port Pin flows toward the end portion sealing member 243B on the opposite side, while gently swirling in the internal space of the inner wall pipe 240 in an approximately spiral shape (tornado shape). Two pipes 24A and 24B connected to the mist spouting section 30 shown in FIG. 2, for example, are bonded to the cylindrical outer circumferential surface of the end portion sealing member 243B, with an interval of approximately 180 degrees around the center line Axo between these pipes 24A and 24B. An exhaust port (opening) Pout, which is in communication with each of the pipes 24A and 24B, is formed in the cylindrical inner circumferential surface of the end portion sealing member 243B, and the carrier gas CGS that has reached the end portion sealing member 243B while swirling in a spiral shape is supplied to the pipes 24A and 24B via the exhaust port Pout. Accordingly, in the present modification, the flow path forming section is formed such that the carrier gas CGS flows in a spiral shape (tornado shape or cyclone shape), due to the arrangement of the suction port Pin that sets the spouting direction of the carrier gas CGS supplied to the internal space of the inner wall pipe 240 that has a simple circular pipe shape or to the arrangement of the exhaust port Pout.

Furthermore, as shown in FIG. 15, in the present modification as well, a certain gap is set between the outer circumferential surface of the inner wall pipe 240 and the inner circumferential surface of the outer wall pipe 242, and this gap is filled with the coolant (pure water or gas) CLq. The coolant CLq is supplied to the gap between the inner wall pipe 240 and the outer wall pipe 242 from the supply port 205A formed at the outer end of the end portion sealing member 243A, and is discharged from the discharge port 205D formed in the outer end of the end portion sealing member 243B. The inner circumferential surface 240A of the inner wall pipe 240 is set, by the coolant (pure water) CLq, to the same temperature as the carrier gas CGS that flows in through the suction port Pin or to a temperature (e.g. 1° C. to several degrees Celsius) slightly higher than the temperature of the carrier gas CGS. This is because it becomes easy for condensation to occur when the temperature of the inner circumferential surface 240A of the inner wall pipe 240 is constantly lower than the temperature of the carrier gas CGS. In order to make such temperature adjustment (temperature management) easy, the thickness of the inner wall pipe 240 is preferable thin, such as approximately 1 mm to several millimeters, which is the same as in the first modification of FIG. 12. Furthermore, in a case where it is difficult to form the inner wall pipe 240 with quartz having such a thickness, an ultra-thin glass plate that is bendable and has such a thickness of 1 mm or less, such as disclosed in International Publication WO 2005/010596 or Japanese Laid-Open Patent Publication No. 2007-315922, for example, may be rolled into a cylinder and molded. The inner circumferential surface 240A of the inner wall pipe 240 and the inner surfaces of the end portion sealing members 243A and 243B are each surface-processed to realize high liquid-repellence whereby the contact angle when droplets are adhered thereto is 90 degrees or more (preferably 120 degrees or more).

Furthermore, although not shown in FIGS. 14 and 15, in the same manner as in the first modification, a plurality of rod-shaped low-pressure mercury discharge lamps (UV light sources) 210A to 210D are arranged around the outer wall pipe 242, and the first-stage ultraviolet irradiation process is performed on the mist that is floating along with the carrier gas CGS flowing in the approximately spiral shape inside the inner wall pipe 240. In the first modification (FIG. 12) above, the flow path of the carrier gas CGS passing through the inner wall pipe 240 was folded back using the rectifier boards 245A and 245B to increase the time of the first-stage ultraviolet irradiation process, but in the present modification, the time of the first-stage ultraviolet irradiation process can be increased by controlling the carrier gas CGS to flow in an approximately spiral shape inside the inner wall pipe 240. Furthermore, in the present modification, since barrier members such as the rectifier boards 245A and 245B are not present inside the inner wall pipe 240, there is a decrease in the rate of mist gathering to form droplets and also in the rate of droplets gathering to pool. Therefore, the mist concentration of the carrier gas CGS discharged to the pipes 24A and 24B is not significantly decreased compared to the mist concentration of the carrier gas CGS supplied from the pipe 17, and it is possible to perform the first-stage ultraviolet irradiation process in an efficient state where the decrease in the mist concentration is restricted. In the present modification as well, in the same manner as in the first modification above, the entire mist modifying section 20 may be arranged at an incline such that the center line Axo is inclined at the angle θy of 30 degrees to 60 degrees relative to the XY-plane (horizontal plane), and the end portion sealing member 243A (or 243B) may be provided with an opening (corresponding to 246A in FIG. 12) allowing the droplets and pools that have been formed in the inner wall pipe 240 to escape. Furthermore, the mist modifying section 20 of the present modification may be installed with a vertical orientation in a state where the center line Axo is parallel to the Z-axis or slightly inclined (in a range from 0 degrees to 45 degrees) relative to the Z-axis, in FIG. 14 or 15. In this case, the pipe 17 through which the carrier gas CGS flows may be set on the −Z-direction side and the pipes 24A and 24B through which the carrier gas CGS is discharged may be set on the +Z-direction side, or the reverse of this arrangement may be used.

Third Embodiment

Figure 16:
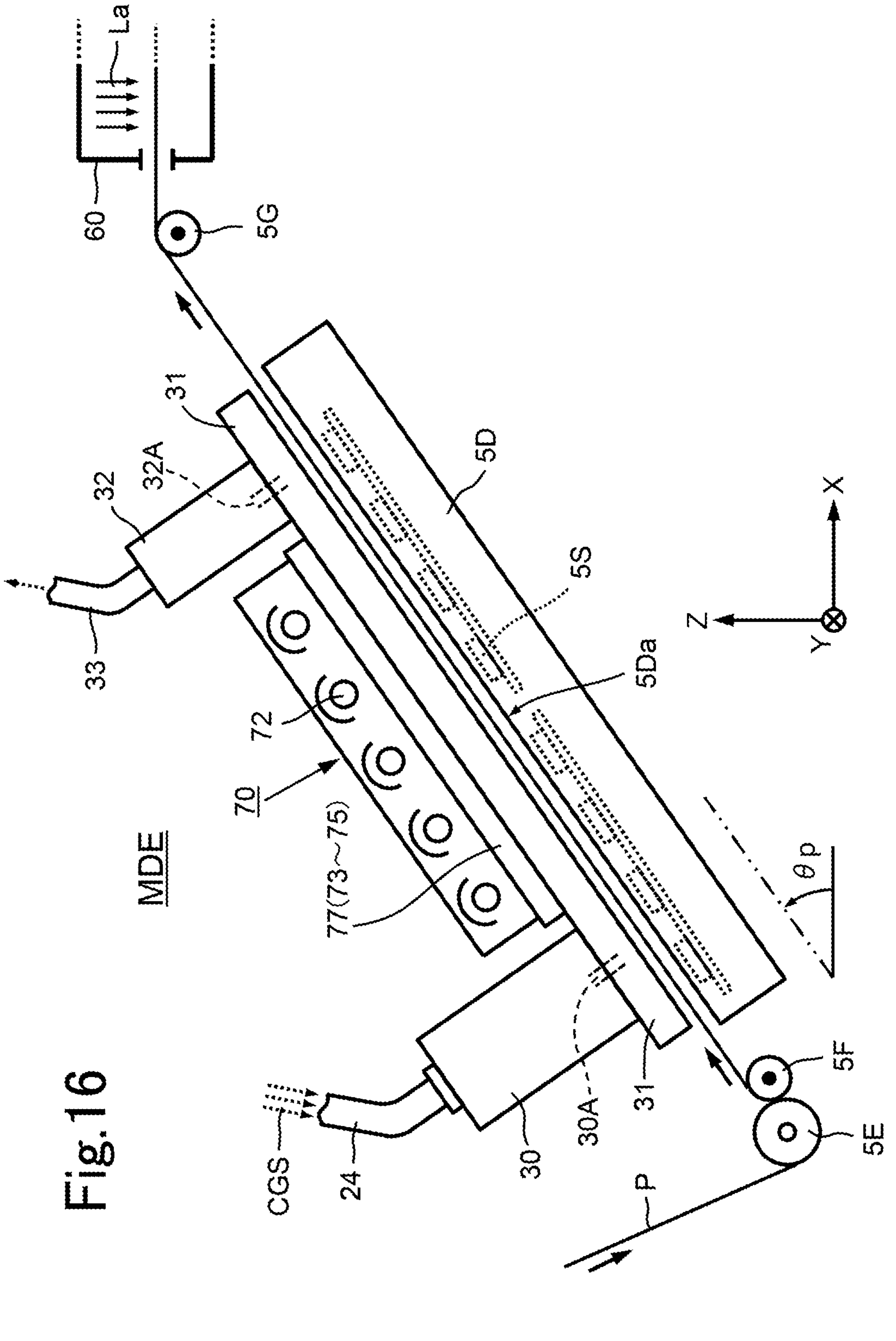
FIG. 16 is a front view showing the schematic configuration of the main portions of the mist deposition apparatus MDE according to a third embodiment.

FIG. 16 is a front view of a mist depositing section according to the third embodiment, which follows the configuration of the mist depositing section of the mist deposition apparatus MDE shown in FIG. 11 above, and in FIG. 16, components that are the same as those shown in FIG. 1 to 5 or 11 are given the same reference numerals. Furthermore, the XYZ orthogonal coordinate system of FIG. 16 is set in the same manner as in FIGS. 1 to 5 and 11. In the present embodiment, as disclosed in International Publication WO 2016/133131 and International Publication WO 2017/154937, the linear feeding path of the substrate P in the mist depositing section of the mist deposition apparatus MDE is inclined at an angle θp relative to the horizontal plane (XY-plane). The angle θp is set in a range from 30 degrees to 60 degrees, and the entire mist depositing section is inclined at this angle θp. The substrate P is fed in a state of being sandwiched by a roller 5E and a roller 5F that form a nip roller and of being applied with a prescribed tension in the longitudinal direction from upstream, and passes between the air guiding member 31 of the mist depositing section and the support table 5D that is a portion of the feeding unit 5. The substrate P that has exited the mist depositing section is bent back to be approximately horizontal by a roller 5G and sent to the UV irradiation unit 60 that is the same as in the first embodiment (FIG. 1). Since the substrate P is inclined at the angle θp relative to the feeding direction, the Z-direction position of the roller 5G on the downstream side is set to be higher than the Z-direction position of the roller 5F on the upstream side.

Furthermore, in the present embodiment, in the same manner as in the second embodiment (FIG. 11) above, the air guiding member (flow path forming member) 31 is provided to form the flow path (mist spraying flow path) of the carrier gas CGS from the nozzle section 30A of the mist spouting section 30 to the recovery port section 32A of the mist recovering section 32, and the UV irradiation unit 70 is provided between the mist spouting section 30 and the mist recovering section 32 to perform the step (first phase of the second-stage ultraviolet irradiation process) of radiating the UV light Lc toward the substrate P during the mist deposition. The UV irradiation unit 70 in the present embodiment includes a plurality of rod-shaped UV light sources (low-pressure mercury discharge lamps) 72 lined up along the feeding direction of the substrate P, and a thermal insulation member 77 that prevents the substrate P and the carrier gas CGS flowing between the air guiding member 31 and the substrate P from being heated by the radiant heat from the UV light source 72.

The thermal insulation member 77 is configured to include the two quartz boards 73 and 74 arranged facing and parallel to each other with a certain gap 75 therebetween and to have this gap 75 filled with the coolant (pure water or gas) CLq, in the same manner as in FIG. 11, but if a configuration is used that provides insulation such that the temperature of the members and portions (inner wall surface of the air guiding member 31, the substrate P, and the like) contacting the flow path of the carrier gas CGS during the mist deposition is not increased more than needed, a configuration may be adopted in which the coolant (pure water or gas) CLq is not used. The thermal insulating mechanism having a configuration that does not use the coolant CLq can be used in the same manner as in the second embodiment of FIG. 11. In the present embodiment as well, the mist depositing mechanism is formed by the mist spouting section 30, the air guiding member 31, and the mist recovering section 32.

In the present embodiment, the substrate P is fed between the roller 5F and the roller 5G in a state where a prescribed tension is applied thereto in the longitudinal direction, and a flat support surface 5Da of the support table 5D is configured to directly support the back surface of the substrate P via a gas layer using an air bearing (Bernoulli) method. Furthermore, in the present embodiment, a plurality of actuators 5S, which are provided embedded at positions near the support surface 5Da of the support table 5D, apply thermal energy or kinetic energy for applying a chemical or physical effect on the liquid film (nanoparticles) coating the surface of the substrate P with the mist, from the back surface of the substrate P. In a case where the base material of the substrate P is a material that is resistant to relatively high temperatures (e.g. 200° C. or more), it is possible to form the actuators 5S of ceramics or the like to irradiate the liquid film on the surface of the substrate P with the UV light Lc from the UV irradiation unit 70 while keeping the substrate P at a high temperature. In this case, the evaporation drying of the liquid film (pure water) is performed simultaneously. Furthermore, the actuators 5S may be board-shaped or sheet-shaped oscillators, and may apply vibrational waves to the substrate P from the back surface side of the substrate P. In this case, the substrate P vibrates physically (mechanically) in the up-down direction on the order of microns and kinetic energy is applied to the nanoparticles in the applied liquid film, and therefore it is possible to disperse the nanoparticles, which have partially clumped on the substrate P, throughout the liquid film.

Figure 17A:
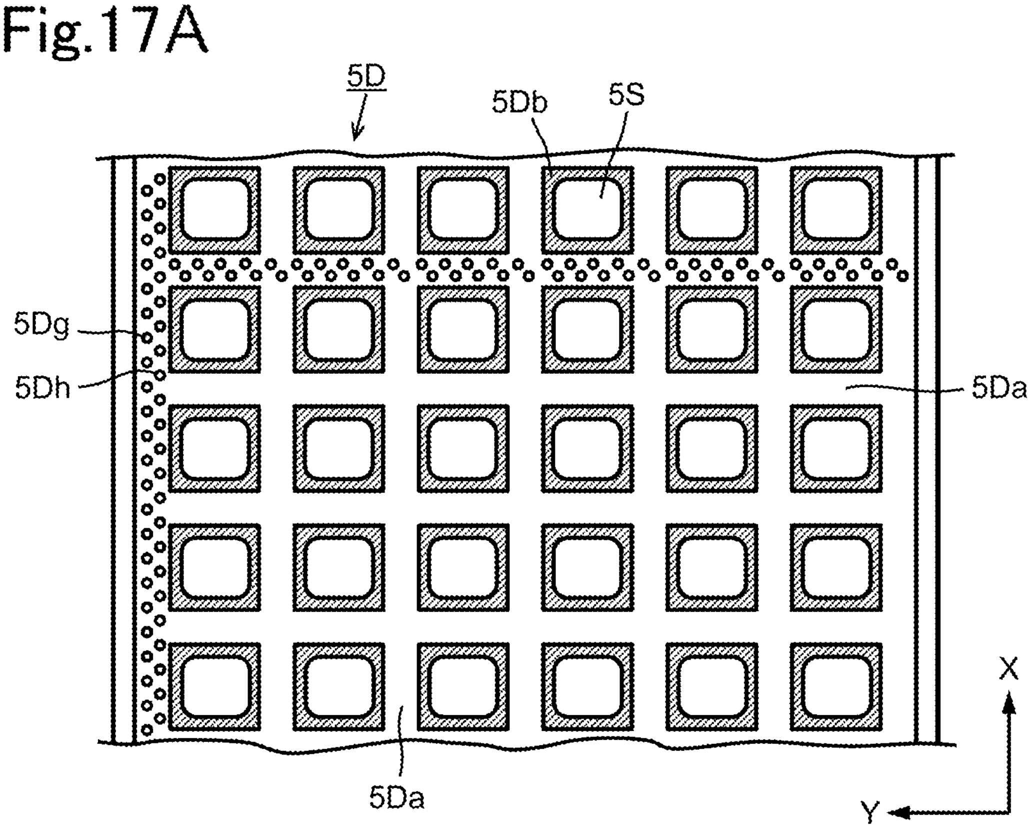
FIG. 17A is an overhead view of a configuration of a support table 5D of the mist deposition apparatus MDE of FIG. 16.
Figure 17B:
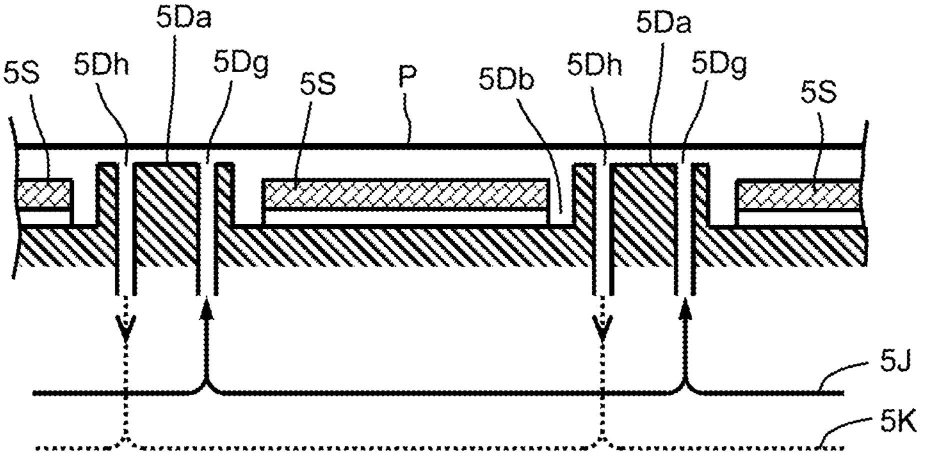
FIG. 17B is a partial cross-sectional view obtained by cutting a portion of the support table 5D.

FIGS. 17A and 17B show installations of the actuators 5S embedded in the support surface 5Da of the support table 5D in FIG. 16, FIG. 17A is a planar view of a portion of the support table 5D, and FIG. 17B is a cross-sectional view of a portion of the support table 5D. As shown in FIGS. 17A and 17B, the actuators 5S are spread out and arranged respectively in a plurality of rectangular depressions 5Db formed by depressing the flat support surface 5Da of the support table 5D. The depressions 5Db are arranged two-dimensionally with prescribed intervals therebetween along the support surface 5Da, and many gas spouting holes 5Dg for forming the gas layer using the air bearing (Bernoulli) method on the back surface side of the substrate P and many gas suction holes 5Dh for sucking in gas are formed in the flat support surface 5Da outside the depressions 5Db. Each of the many gas spouting holes 5Dg is connected to a pressurized gas flow path 5J formed inside the support table 5D, and each of the many gas suction holes 5Dh is connected to a decompression (vacuum) flow path 5K formed inside the support table 5D. The feeding direction of the substrate P moving along the support surface 5Da is the X-direction in FIG. 17A.

As shown in FIG. 17B, the top surfaces of the actuators 5S provided respectively in the plurality of depressions 5Db are arranged facing the back surface of the substrate P with a prescribed gap therebetween, and the back surface of the substrate P is prevented from frictionally contacting the actuators 5S. In a case where the actuators 5S are ceramic heaters, the radiant heat from the actuators 5S serving as heating sources is applied directly to the substrate P. In a case where the actuators 5S are oscillators (oscillating members or oscillating mechanisms), the sound waves created by the minute vibrations in the up-down direction of the top surfaces of the actuators 5S are propagated to the back surface of the substrate P via the gas layer (air) forming the gap on the back surface side of the substrate P, thereby causing minute vibrations in the substrate P. The frequency of this vibration may be the same for all of the plurality of actuators 5S (oscillators), or the actuators 5S may be driven with several different frequencies (e.g. two to four types of frequencies). The vibrational frequency is set to be in a frequency band that causes the nanoparticles in the liquid film to move minutely. Furthermore the vibrational amplitude of the substrate P is set to be within ±several micrometers, in consideration of the particle size of the nanoparticles, the thickness of the liquid film, and the viscosity of the liquid film.

In FIG. 17A, the depressions 5Db that are rectangular (square) are formed in the plane with a constant pitch in the X- and Y-directions, and the plurality of depressions 5Db (actuators 5S) lined up along the feeding direction (X-direction) of the substrate P may be arranged to be lined up in the X-direction inclined in a direction diagonal to the X-direction in the support surface 5Da. This is because, when the plurality of depressions 5Db (actuators 5S) are arranged parallel to the X-axis, as shown in FIG. 17A, in the portion (support surface 5Da) between the plurality of depressions 5Db (actuators 5S) lined up in the Y-direction, the thermal energy and kinetic energy applied to the back surface of the substrate P decreases continuously along the X-direction. Furthermore, in the present embodiment, the feeding path of the substrate P and the entire mist depositing section of the mist deposition apparatus MDE are inclined at the angle θp (30 degrees to 60 degrees) relative to the feeding direction, as shown in FIG. 16, but in a case where the actuators 5S are oscillators, the substrate P may be fed horizontally (angle θp=0), as in the first embodiment and the second embodiment. Furthermore, in a case where the actuators 5S are oscillators, the size and shape of each oscillator may be different.

Furthermore, in addition to the UV light source that irradiates the substrate P with the UV light La, an infrared lamp, ceramic heater, hot air fan, or the like may be provided in the UV irradiation unit 60 shown in FIG. 16 to efficiently evaporate the liquid film adhered to the surface of the substrate P by heating the substrate P to a temperature (e.g. 80 degrees or less) that is lower than the glass transition temperature. The technique of applying minute vibrations to the substrate P and the liquid film on the substrate P using the actuators 5S before drying the liquid film is not limited to the coating mechanism using the mist deposition method, as in the present embodiment, and this technique can be applied in the same manner to a substrate P deposited using other coating methods such as a well-known printing mechanism (slit coat printing, silk printing, gravure printing, offset printing, inkjet printing, and the like) that transfers an ink material containing nanoparticles such as silver, copper, or carbon, for example, to the substrate P. At this time, in a case where a volatile organic solvent is used as the solvent for the ink material, it is preferable to use a weakly volatile organic solvent, the evaporation of which is not completed during the time during which the minute vibrations are applied to the ink liquid film on the substrate P.

Third Modification

Figure 18:
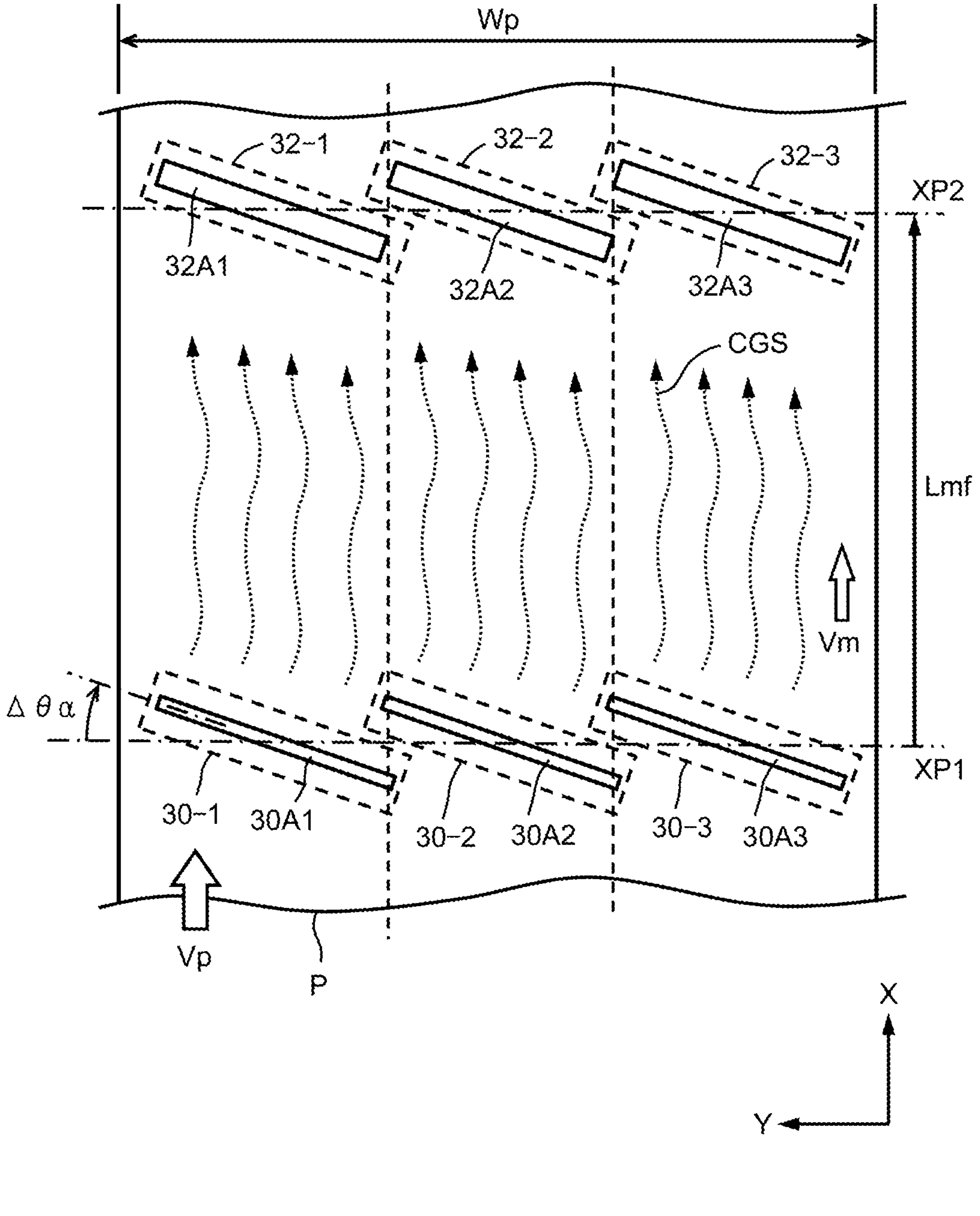
FIG. 18 is an overhead view of an arrangement state of the mist spouting section 30 and a mist recovering section 32 of the mist deposition apparatus MDE according to a third modification.

FIG. 18 is an overhead view of a modification of the arrangement of the mist spouting section 30 and the mist recovering section 32 in the mist deposition apparatus MDE, and the XYZ orthogonal coordinate system is set in the same manner as described in FIG. 1 to 5, 11, or 16. In the present modification, in order to adapt to a case in which the width dimension Wp in the Y-direction (transverse direction of the substrate P) orthogonal to the feeding direction (X-direction) of the substrate P is increased, the set of the mist spouting section 30 and the mist recovering section 32 is arranged in plurality (three sets in FIG. 18) in the Y-direction. As shown in FIGS. 3 and 4 above, the carrier gas CGS containing the mist is spouted from the slit-shaped nozzle 30A of the mist spouting section 30. At this time, the mist concentration and flow velocity of the carrier gas CGS in the longitudinal direction of the nozzle section 30A (transverse direction of the substrate P) preferably have distributions that are as uniform as possible. However, as the longitudinal-direction dimension of the nozzle section 30A increases, the uniformity of the distribution becomes worse, and there are cases where unevenness occurs in the transverse direction (Y-direction) in the distribution of nanoparticles and the distribution of thickness of the liquid film deposited on the substrate P.

Therefore, as an example in the present modification, as shown in FIG. 18, a set of a mist spouting section 30-1 and a mist recovering section 32-1, a set of a mist spouting section 30-2 and a mist recovering section 32-2, and a set of a mist spouting section 30-3 and a mist recovering section 32-3 are arranged respectively in three regions into which the width dimension Wp of the substrate P is divided in the Y-direction. The mist spouting sections 30-1, 30-2, and 30-3 are arranged such that the center lines in the longitudinal direction of respective nozzle sections 30A1, 30A2, and 30A3 are inclined at an angle of $\Delta\theta\alpha$ relative to the Y-axis in the XY plane, in order to make the nozzle sections 30A1, 30A2, and 30A3 continuous without gaps in the Y-direction while avoiding spatial interference (physical contact) within the arrangement. Similarly, the mist recovering sections 32-1, 32-2, and 32-3 are also arranged such that the center lines in the longitudinal direction of respective recovery port sections 32A1, 32A2, and 32A3 are inclined at the angle $\Delta\theta\alpha$ relative to the Y-axis in the XY-plane, in order to avoid spatial interference (physical contact) within the arrangement. With XP1 being the X-direction position of the center point of each of the nozzle sections 30A1, 30A2, and 30A3 arranged on the upstream side in the feeding direction of the substrate P and XP2 being the X-direction position of the center point of each of the recovery port sections 32A1, 32A2, and 32A3 arranged on the downstream side in the feeding direction of the substrate P, the mist deposition is performed while the substrate P is moving at a velocity Vp across the distance Lmf from the position XP1 to the position XP2.

Since the sides and the space above the substrate P are surrounded by the air guiding member 31 such as shown in FIG. 2, 3, or 16 from the position XP1 to the position XP2, the carrier gas CGS containing the mist flows with a flow velocity Vm from the position XP1 toward the position XP2 in a state where the Y-direction flow velocity distribution (mist concentration) is uniform across the width dimension Wp of the substrate P. The flow velocity Vm of the carrier gas CGS is set according to the balance between the flow rate of the carrier gas CGS adjusted by the flow rate adjusting valve 15 shown in FIG. 1 and the flow rate (exhaust pressure or negative pressure) of the carrier gas CGS to be recovered at the recovery port section 32A of the mist recovering section 32. The velocity Vp of the substrate P and the flow rate Vm of the carrier gas CGS flowing along the surface of the substrate P may be set to be the same (Vm=Vp) and in the same direction (+X-direction), but it is also possible to set Vm>Vp or Vm<Vp according to the progress of the deposition during the mist deposition. Furthermore, the relationship between the flow velocity Vm and the velocity Vp can be set also according to the thickness of the thin film of nanoparticles to be ultimately deposited. In a case where the distance Lmf is sufficiently long, a single recovery port section that extends linearly in the Y-direction across the width dimension Wp of the substrate P may be used, instead of using the three recovery port sections 32A1, 32A2, and 32A3 divided as shown in FIG. 18.

Fourth Modification

In the mist modifying section 20 according to each of the embodiments and modifications above, the mist floating along with the carrier gas CGS is irradiated directly with the UV light Lb, and therefore a configuration was used in which the carrier gas CGS passes through the inside of the quartz pipes or the like that have high transmittance with respect to the UV light Lb (including spectra with wavelengths of 200 nm or less). Therefore, the inner wall surfaces of the quartz pipes undergo surface processing to be liquid repellent (fluorine-based or silicon-based liquid-repellent film coating processing). Even so, when the mist modifying section 20 is used for a long time, the nanoparticles contained in the mist gradually adhere to the inner walls of the quartz pipes, causing clouding on the inner walls of the quartz pipes over time and lowering the transmittance for the UV light Lb.

Figure 19:
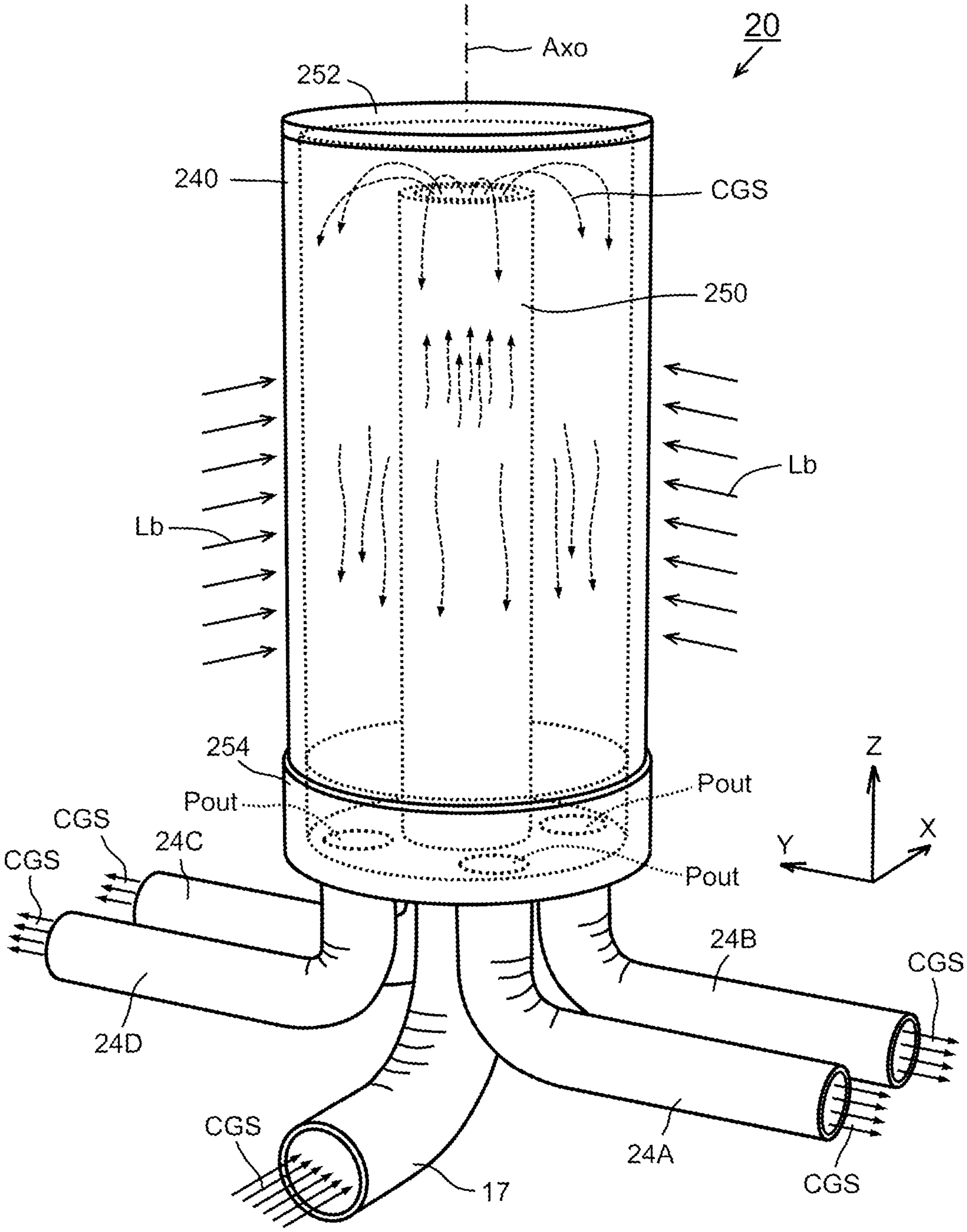
FIG. 19 is a perspective view schematically showing an outer appearance of the mist modifying section 20 of a fourth modification and an internal structure thereof.
Figure 20:
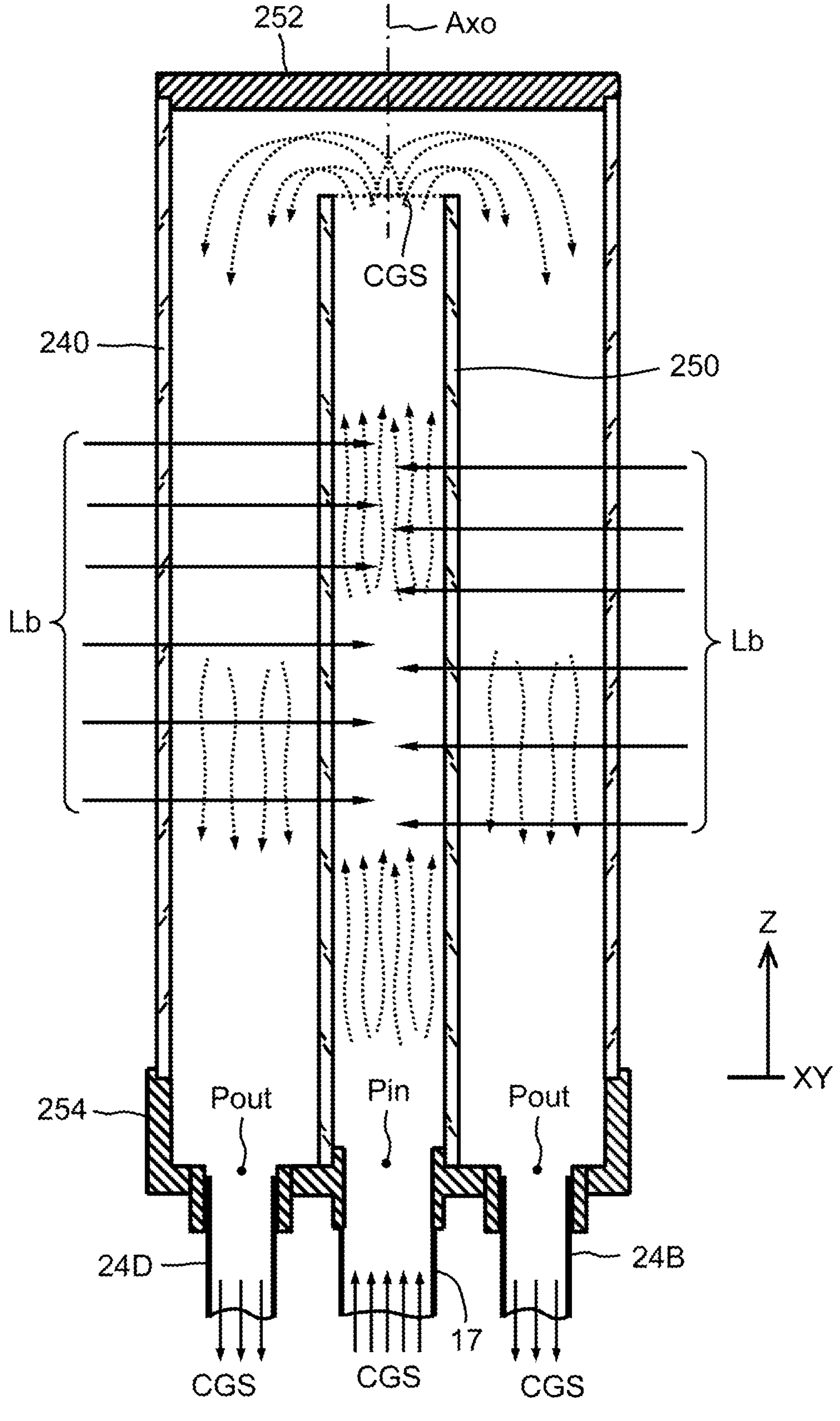
FIG. 20 is a cross-sectional view of the mist modifying section 20 of FIG. 19, obtained by cutting along a plane including the center axis Axo.

Therefore, in the present modification, the mist modifying section 20 is configured as shown in FIGS. 19 and 20, making it possible to easily clean the clouding or the like caused by adhered nanoparticles. FIG. 19 is a perspective view schematically showing the outer appearance of, in particular, a flow path forming section 20A of the mist modifying section 20 according to the present modification, and the internal structure thereof, with the direction of each coordinate axis in the XYZ orthogonal coordinate system being set in the same manner as in FIG. 1, 11, or 16 above. FIG. 20 shows the cross-sectional structure when the mist modifying section 20 of FIG. 19 is cut along a plane including the center line Axo. In FIGS. 19 and 20, components having the same function as components described in the embodiments and modifications above are given the same reference numerals. In FIGS. 19 and 20, the UV light source unit (ultraviolet irradiation section) 20B forming a portion of the mist modifying section 20 is not shown in the drawings.

In the present modification, as shown in FIGS. 19 and 20, the flow path of the carrier gas CGS containing the mist is formed by two cylindrical quartz pipes 240 and 250, which are arranged with a vertical orientation to be approximately coaxial with the center line Axo parallel to the Z-axis and which transmit the UV light Lb from the UV light source unit (low-pressure mercury discharge lamp) (not shown in the drawings). The quartz pipe 250 is arranged inside the quartz pipe 240, and with the inner diameter (diameter of the inner circumferential surface) of the outer quartz pipe 240 being $\varphi a$ and the outer diameter (diameter of the outer circumferential surface) of the inner quartz pipe 250 being $\varphi b$, the ratio $\varphi a/\varphi b$ is set to be approximately 1.5 to 3.5. A disc-shaped top sealing member 252 for sealing the inside of the quartz pipe 240 is provided at the top (+Z-direction) end portion of the outer quartz pipe 240. The top end portion of the inner quartz pipe 250 is set at a height position (Z-direction position) forming a certain gap between this top end portion and the bottom surface of the top sealing member 252, so as to be opened within the outer quartz pipe 240. The material of the top sealing member 252 may be quartz glass, or may be a material (ceramics, metal, carbon composite, or the like) that does not easily deteriorate due to the UV light Lb and the adhesion of mist.

A cup-shaped bottom sealing member 254, which seals the inside of the quartz pipe 240 and has a floor portion that is parallel to the XY-plane and is provided with a plurality of exhaust ports (openings) Pout that discharge the carrier gas CGS to each of the pipes 24A, 24B, 24C, and 24D, is provided on the bottom end portion (−Z-direction) of the outer quartz pipe 240. With the above configuration, each of the inner circumferential surface of the quartz pipe 240, the inner and outer circumferential surfaces of the quartz pipe 250, the inner wall surface at the bottom of the top sealing member 252, and the inner wall surface of the bottom sealing member 254 that contact the carrier gas CGS (mist) undergo liquid-repellent surface processing for restricting the adhesion of mist and promoting the flow in the −Z direction (direction of gravity) when droplets are formed.

When the circular floor portion of the bottom sealing member 254 is viewed in the XY-plane, the four circular exhaust ports Pout are arranged along the edge of the floor portion at angular intervals of approximately 90 degrees around the center line Axo. Furthermore, the center of the floor portion of the bottom sealing member 254 is attached with the bottom end portion of the inner quartz pipe 250 and is provided with a suction port (opening) Pin which allows the carrier gas CGS supplied from the pipe 17 to pass through the inside of the inner quartz pipe 250. In the present modification, the carrier gas CGS supplied from the bottom end portion of the inner quartz pipe 250 from the pipe 17 via the suction port Pin rises up though the inside of the quartz pipe 250 to the top end portion, changes its flow to a downward flow near the bottom surface of the top sealing member 252, falls in the −Z direction in the space surrounded by the outer circumferential surface of the quartz pipe 250 and the inner circumferential surface of the quartz pipe 240, and is sent out to each of the pipes 24A, 24B, 24C, and 24D via the respective exhaust ports Pout at four locations in the floor portion of the bottom sealing member 254. Accordingly, in the present modification, the flow path forming section is formed by the outer quartz pipe 240 and the inner quartz pipe 250, which are arranged coaxially, and the top sealing member 252 and the bottom sealing member 254.

In the same manner as in the configuration shown in FIGS. 12 and 13 above, in the present modification as well, a plurality of rod-shaped low-pressure mercury discharge lamps, arranged parallel to the center line Axo, are provided around the outer quartz pipe 240 as the UV light source unit 20B. The UV light Lb from the low-pressure mercury discharge lamps passes through the thermal insulation structure (having a transmittance of at least tens of percent with respect to the UV light Lb) that prevents a temperature increase due to radiant heat of the quartz pipe 240 and the quartz pipe 250, to irradiate the mist floating along with the carrier gas CGS in the internal space of the outer quartz pipe 240 and the internal space of the inner quartz pipe 250. Due to this, the organic impurity components that have adhered to the surface of the mist itself and to the surfaces of the nanoparticles contained in the mist are cleansed. In the same manner as in FIGS. 12 to 15 above, the thermal insulation structure can have a configuration in which a third quartz pipe is provided that further surrounds the outer circumferential surface of the outer quartz pipe 240, and the space between the outer circumferential surface of the quartz pipe 240 and the inner circumferential surface of the third quartz pipe is filled with the temperature-controlled pure water or gas as the coolant CLq.

In the configuration such as in FIGS. 19 and 20 above, the outer quartz pipe 240, the inner quartz pipe 250, the top sealing member 252, and the bottom sealing member 254 are each connected in a manner to be easily disassembled. Accordingly, when the mist modifying section 20 is used for a long time and clouding occurs due to nanoparticles adhering to the inner circumferential surface of the quartz pipe 240 and the inner and outer circumferential surfaces of the quartz pipe 250 or nanoparticles are deposited on the inner wall surfaces or the like of the top sealing member 252 and the bottom sealing member 254, operation of the mist modifying section 20 can be suspended and each component can be disassembled and cleaned (the nanoparticles can be recovered). Specifically, the top sealing member 252 is separated in the +Z-direction from the outer quartz pipe 240, the outer quartz pipe 240 is separated in the +Z-direction from the bottom sealing member 254, and after this, the inner quartz pipe 250 is separated in the +Z-direction from the bottom sealing member 254. The bottom sealing member 254 can be taken out by removing the pipes 17, 24A, 24B, 24C, and 24D connected thereto.

Each member that has been disassembled is cleaned using a specialized cleaning tool or chemical solution (acidic etching solution or the like), and the adhered nanoparticles are recovered. Furthermore, in the present modification, if replacement parts for the quartz pipe 240 and the quartz pipe 250 are prepared in advance in case that the intensity of the UV light Lb irradiating the mist decreases due to clouding of the quartz pipe 240 and the quartz pipe 250, it is possible to easily replace the pipes with the replacement parts in a short time. With the mist modifying section 20 according to the present modification, it is possible to acquire the carrier gas CGS containing the mist with approximately the same flow rate from each of the four pipes 24A, 24B, 24C, and 24D. Therefore, the present modification is suitable for a mist deposition apparatus provided with a plurality of mist spouting sections 30 that are individually supplied with the carrier gas CGS, as in the third modification of FIG. 18 above, for example. A configuration in which the mist modifying section 20 can be easily divided, such as in the present modification, can be adopted in the same manner as the mist modifying section 20 shown in FIG. 12 or 14 above, and makes it possible to recover the nanoparticles while cleaning the clouding caused by nanoparticles adhered to the wall surfaces (inner circumferential surface of the quartz pipe 240, inner surfaces of the end portion sealing members 243A and 243B, and rectifier boards 245A and 245B) defining the internal space of the mist modifying section 20. With the configuration of the mist modifying section 20 shown in FIG. 5 above as well, if a configuration is used in which the straight quartz pipes 201A to 201C and the U-shaped pipes 17A and 17B can be easily detached, it is possible to clean the clouding of the quartz pipes 201A to 201C and recover the nanoparticles.

In the configuration of the present modification as well, since droplets (drops) formed of gathered mist and pools formed of gathered droplets can occur on the inner wall surfaces of the floor portion of the bottom sealing member 254, the opening 246A for discharging droplets and pools may be formed in the floor portion of the bottom sealing member 254 and the liquid containing the nanoparticles may be returned to the solution tank 10 shown in FIG. 1 above, via the recovery pipe connected to this opening 246A, as shown in FIG. 12. Furthermore, the entire mist modifying section 20 of FIG. 19 may be arranged reversed in the up-down direction (Z-direction), and the center line Axo can be arranged inclined relative to the Z-axis or arranged horizontally to be parallel to the XY-plane.

Fifth Modification

Figure 21:
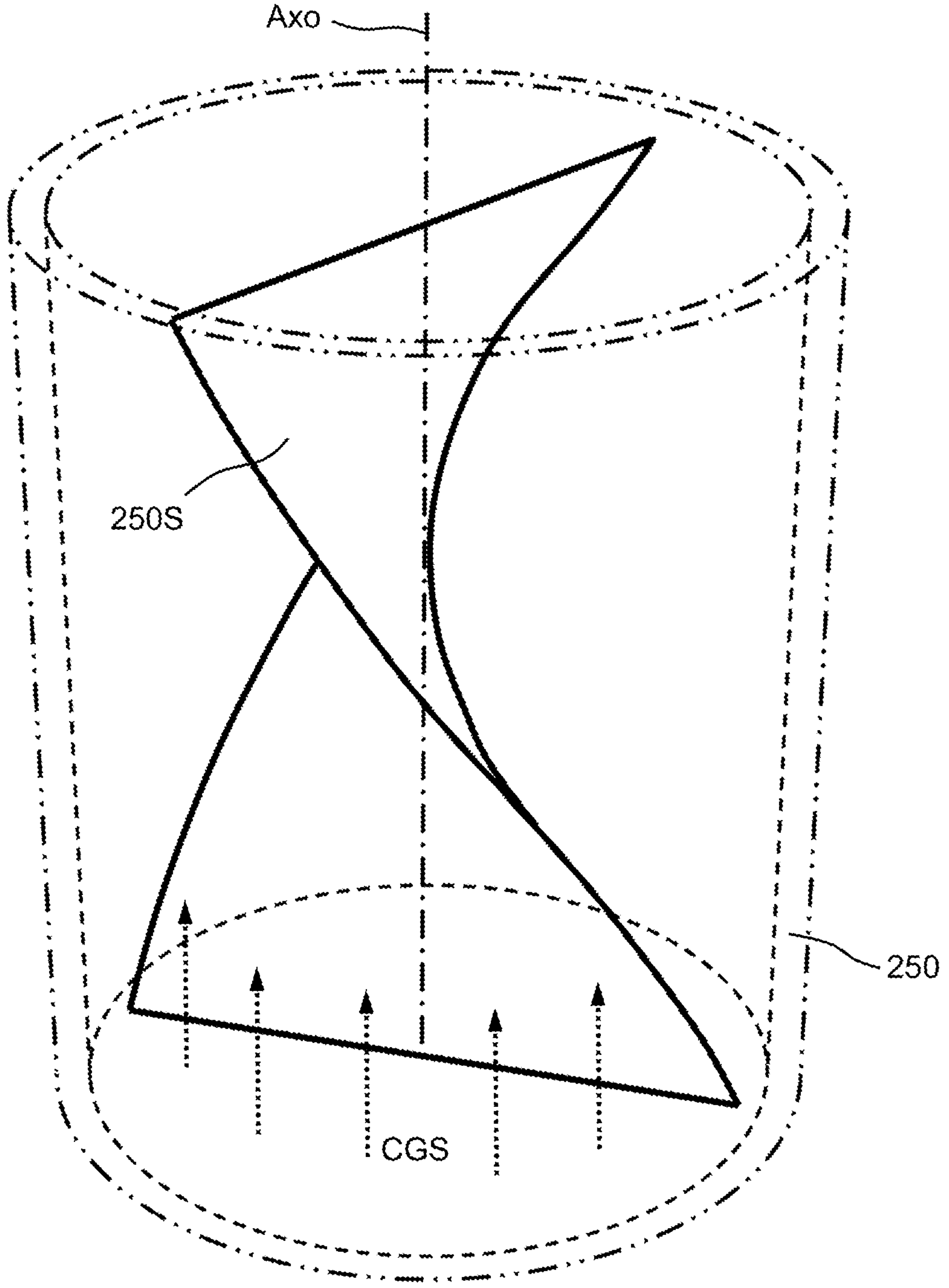

FIG. 21 is a perspective view of a partial internal configuration of the quartz pipe 250 as a fifth modification applied to the fourth modification of FIGS. 19 and 20. As shown in FIG. 20, since the carrier gas CGS containing the mist is supplied straight to the inside of the quartz pipe 250 from the pipe 17, there are cases where the distribution of the mist concentration in the carrier gas CGS near the top end portion of the quartz pipe 250 is not uniform when viewed in a plane (plane parallel to the XY-plane) orthogonal to the center line Axo. Therefore, as shown in FIG. 21, a thin plate (fin) 250S having a width that is approximately the same as the inner diameter of the quartz pipe 250 is arranged twisted around the center line Axo, at a suitable height position (Z-direction position) in the quartz pipe 250, preferably near the bottom end portion (position above the suction port Pin)

of the quartz pipe 250. Due to the thin plate (fin) 250S being twisted by a suitable amount across the length of the thin plate (fin) 250S in the center line Axo direction (Z-direction), the carrier gas CGS proceeds swirling in a spiral shape inside the quartz pipe 250, and the mist concentration in the carrier gas CGS spouted from the top end portion of the quartz pipe 250 becomes uniform when viewed in the XY-plane. The thin plate (fin) 250S is preferably made of a material that does not deteriorate due to the irradiation with the UV light Lb and the adhesion of the mist (pure water) and that is surface-processed to be liquid-repellent, but if made of a material that can deteriorate over time, it may be configured to be replaceable (as a consumable component).

Furthermore, the thin plate (fin) 250S such as shown in the present modification is also provided inside each of the quartz pipes 201A to 201C of the mist modifying section 20 in the first embodiment shown in FIG. 5, and it is therefore possible to improve the straightness of the flow of the carrier gas CGS and to realize a uniform mist concentration in the carrier gas CGS sent out to the pipe 24 by making the carrier gas CGS flow inside the quartz pipes 201A to 201C in a vortex shape. In the case of the present modification, the thin plate (fin) 250S functions as a member of the flow path forming section.

Sixth Modification

In each of the UV light source unit (UV irradiation unit) 20B provided to the mist modifying section 20 and irradiating the mist (carrier gas CGS) with the UV light Lb, the UV irradiation unit 60 radiating the UV light La toward the surface of the substrate P after mist deposition, and the UV irradiation unit 70 radiating the UV light Lc toward the substrate P while the nanoparticles are being deposited during mist deposition, long arc (rod-shaped) low-pressure mercury discharge lamps (72 and 210A to 210F) were used as the UV light sources, but other UV light sources can be used in the same manner, as long as these light sources generate UV light (so-called vacuum ultraviolet light) containing strong spectra with wavelengths of 200 nm or less. For example, in a case where a short arc low-pressure mercury discharge lamp is used, since the interval between the discharge electrodes is narrow and the emission point of the UV light is almost point-shaped, a concave spherical mirror, an ellipsoidal mirror, or the like that efficiently collects UV light spread in all directions from the light emission point is provided. Furthermore, a long pipe-shaped excimer discharge lamp such as disclosed in Japanese Laid-Open Patent Publication No. 2006-269189, for example, may be used as the rod-shaped UV light source. The excimer discharge lamp has a noble gas such as xenon gas sealed in the discharge tube, and therefore efficiently radiates UV light (vacuum ultraviolet light) having a bright line spectrum at a wavelength of 172 nm. As another possibility, a vacuum ultraviolet flash lamp that has sealed gas including xenon gas sealed inside the light emitting tube at three pressures and generates ultraviolet light having a relatively strong spectrum distribution across the vacuum ultraviolet wavelength range (100 nm to 200 nm), such as disclosed in Japanese Laid-Open Patent Publication No. 2016-024904, may be used. In a case where an excimer discharge lamp or a vacuum ultraviolet flash lamp is used as well, it is necessary to use a thermal insulation mechanism (coolant CLq) or a thermal insulation member 77 for restricting the temperature increase of the carrier gas CGS (and mist) passing through the flow path forming section.

As another possibility, although the size is large as the light source apparatus, an ArF (argon fluoride) excimer laser light source that generates UV pulse light with a wavelength of 193 nm using, as the laser medium, a mixed gas of argon (Ar) serving as a noble gas, and fluorine ($F_2$) serving as halogen, or an $F_2$ excimer laser light source that generates UV pulse light with a wavelength of 157 nm using fluorine molecule gas as the laser medium may be used. Furthermore, a relatively compact fiber amplifier laser light source may be used as the light source apparatus. The fiber amplifier laser light source generates UV pulse light (deep ultraviolet light) with a wavelength of 195.9 nm at high output, by causing seed light (seed light pulse) in the infrared wavelength range to by amplified by a fiber amplifier and to then pass through a plurality of wavelength-converting optical elements (harmonic generators), such as disclosed in International Publication WO 2013/133279, for example. In a case where UV pulse light from the ArF excimer laser light source or the fiber amplifier laser light source is used, this UV pulse light can be distributed with a suitable intensity ratio to the respective UV light Lb for the UV light source unit 20B, the UV light La for the UV irradiation unit 60, and the UV light Lc for the UV irradiation unit 70, by using a beam distributor, a multi-mode fiber bundle, or the like.

Figure 22:
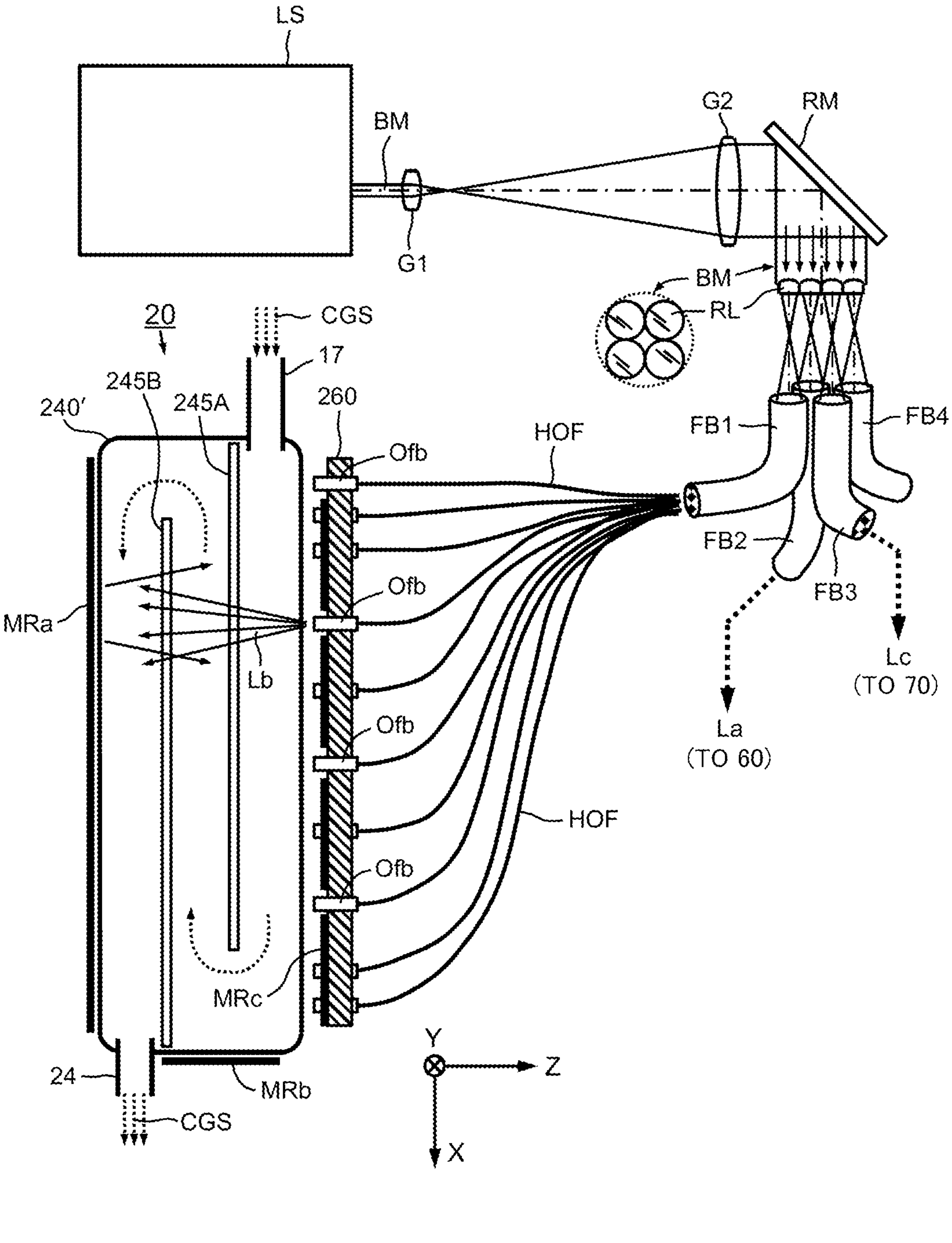
FIG. 22 shows a schematic configuration of an illumination optical system using a UV light beam BM from a deep ultraviolet laser light source LS, along with the mist modifying section 20 in a sixth modification.

FIG. 22 shows a schematic configuration of an illumination optical system using a UV light beam BM from a deep ultraviolet laser light source LS such as the above fiber amplifier laser light source for each of the UV lights La, Lb, and Lc above, along with the mist modifying section 20 using the UV light Lb, in the sixth modification. Since the diameter of the cross section of the beam BM emitted as a parallel light flux from the deep ultraviolet laser light source (laser light source) LS is several millimeters or less (e.g. approximately 1 mm), the diameter of this beam is expanded to be approximately tens of millimeters by the beam expander system formed by the two lenses G1 and G2. The expanded beam BM is reflected by a flat mirror RM and enters four lens elements RL arranged densely in the expanded diameter of the beam BM. The beam BM having entered each lens element RL diverges at a predetermined numerical aperture (NA) after being focused as a beam waist, and is projected onto the input ends of respective fiber bundles FB1, FB2, FB3, and FB4. The flat mirror RM is provided for convenience in the drawing, but is not absolutely necessary. Furthermore, the lenses G1 and G2 and the lens elements RL may be composite quartz obtained by doping quartz (SiO2) with fluorine, so as to have a high transmittance (80% or more) with respect to UV light (deep ultraviolet) having a wavelength of approximately 180 nm.

Each of the fiber bundles FB1 to FB4 is a bundle of a large number of hollow optical fiber lines HOF that are not significantly attenuated by UV light having a wavelength of approximately 180 nm and have good transmission characteristics. Those disclosed in Japanese Laid-Open Patent Publication No. 2006-243306 or Japanese Laid-Open Patent Publication No. 2011-164318, for example, can be used as the hollow optical fiber lines HOF. Here, the beam BM distributed to the fiber bundle FB1 is used as the UV light Lb by the mist modifying section 20. In the present modification, the beam BM, i.e. the UV light Lb, projected from the output ends Ofb of the large number of hollow optical fiber lines (referred to below simply as fiber lines) HOF forming the fiber bundle FB1, is radiated uniformly inside the container 240' serving as the flow path forming section and made of quartz in a rectangular parallelepiped shape. Therefore, a holding board 260 that holds the output end Ofb of each fiber line HOF is provided near the container 240', such that the output ends Ofb of the respective fiber lines HOF are arranged two-dimensionally at prescribed intervals along one side wall (the side wall serving as the ceiling from the setting of the XYZ coordinate system in FIG. 22) of the container 240'.

The container 240' is a modification of the quartz pipe 240 used in the mist modifying section 20 of FIG. 12 above into a rectangular parallelepiped shape, and in FIG. 22, the Z-direction height dimension of the container 240' is set to be approximately three times the Y-direction width dimension thereof. Two rectifier boards (quartz boards) 245A and 245B such as shown in FIG. 12 are provided inside the container 240', and the flow path forming section is formed by the rectangular parallelepiped container 240' and the rectifier boards 245A and 245B therein. The carrier gas CGS containing the mist supplied from the pipe 17 flows through the inside the container 240' in order of the +X-direction, the −Z-direction, the −X-direction, the −Z-direction, and the +X-direction due to the rectifier boards 245A and 245B, to be discharged to the pipe 24. Furthermore, a reflective layer MRa, which reflects the UV light Lb projected from the output end Ofb and having passed through the inside of the container 240', is formed on almost the entire outer wall surface of the side wall (floor surface side) of the container 240' opposite the side wall (ceiling side) on the holding board 260 side. In the same manner, a similar reflective layer MRb is formed on almost the entire other outer wall surface of the side wall of the container 240' that is not on the ceiling side. Furthermore, a similar reflective layer MRc is formed on the surface of the holding board 260 on the side facing the side wall on the ceiling side of the container 240', except for on the output end Ofb of each fiber line HOF. The reflective layers MRa, MRb, and MRc are each formed by a dielectric multilayer film in which thin films made of materials with different refractive indexes are alternately and repeatedly layered, to have a high reflectivity (80% or more) with respect to the vacuum ultraviolet rays having a wavelength of approximately 180 nm.

In this configuration such as shown in FIG. 22, the UV light Lb projected from the individual output ends Ofb has angular characteristics (spread angle) corresponding to the numerical aperture (NA) determined by the focal distance of the lens element RL, and therefore, inside the container 240', the UV light Lb reflected by the respective reflective layers MRa, MRb, and MRc and the UV light Lb emitted from the output ends Ofb of the large number of fiber lines HOF irradiate the mist in the carrier gas CGS with various angular characteristics. The output end Ofb fixed at one location on the holding board 260 may be the output end Ofb of one fiber line HOF, or may be an output end Ofb formed by bundling a plurality (e.g. several to tens) of the fiber lines HOF. Accordingly, in a case where ten fiber lines HOF are bundled as an output end Ofb fixed at one location on the holding board 260 and such output ends Ofb are arranged at 20 discrete locations on the holding board 260, for example, the total number of hollow optical fiber lines HOF forming the fiber bundle FB1 is 200.

The other fiber bundles FB2, FB3, and FB4 shown in FIG. 22 are formed in the same manner as the fiber bundle FB1 and, as an example, the beam BM guided by the fiber bundle FB2 is used as the UV light La in the UV irradiation unit 60 shown in FIG. 1 or 16, and the beam BM guided by the fiber bundle FB3 is used as the UV light Lc in the UV irradiation unit 70 shown in FIG. 11 or 16. As in the present modification, in a case where the beam BM in the vacuum ultraviolet region from the deep ultraviolet laser light source LS is supplied to the mist modifying section 20 and the UV irradiation units 60 and 70 via the illumination optical system formed by the lenses G1 and G2, the lens elements RL, and the fiber bundles FB1 to FB4, the radiant heat of the light source does not directly act on the carrier gas CGS (mist) and the substrate P, and therefore there is no need to provide the thermal insulation layer, the thermal insulation structure, the thermal insulation member 77, or the like using the temperature-adjusted pure water or gas as the coolant.

In the configuration of the sixth modification of FIG. 22 above, the beam BM guided by the fiber bundle FB4 can be used for ultraviolet cleaning of other structural portions inside the mist deposition apparatus MDE, preliminary cleaning (making lyophilic) of the surface of the substrate P before the mist deposition, or the like. In a case where a film made of nanoparticles with a uniform film thickness is to be formed on the surface of the substrate P, it is preferable for the surface of the substrate P to be lyophilic with respect to the mist (pure water). In a case where the surface of the substrate P is liquid-repellent with a high contact angle for droplets, the liquid film formed by the sprayed mist and covering the surface of the substrate P gathers locally to create portions where the liquid film is thick and portions where the liquid film is extremely thin, uneven thickness occurs in the film layer formed by the nanoparticles, and portions where nanoparticles have yet to be deposited occur spottily. In order to avoid such situations, the surface of the substrate P is irradiated with ultraviolet rays (UV light in the vacuum ultraviolet range) before the mist deposition, and a process (substrate modifying process) of modifying the surface of the substrate P from being liquid-repellent to being lyophilic is performed. In the present modification, it is possible to set the ultraviolet rays used at this time to be the beam BM guided by the fiber bundle FB4.

Seventh Modification

In each embodiment and each modification above, the carrier gas CGS (mist gas) containing the mist is sprayed downward (−Z-direction) from the slit-shaped nozzle section (slit opening) 30A of the mist spouting section 30 arranged above (+Z-direction) the substrate P, toward the surface of the substrate P, as shown in FIGS. 1 to 4, 11, and 16. Therefore, when the mist deposition is performed for a long time, there is a possibility that, due to the effect of gravity, the droplets formed on the wall surface of the internal space of the mist spouting section 30 flow along the wall surface to the edge portion of the nozzle section 30A and fall onto the surface of the substrate P from the edge portion. Therefore, in the present modification, as shown in FIGS. 23 and 24, a mechanism for trapping (recovering) the droplets (or pools) formed on the inner wall surface of the mist spouting section 30 and the droplets (drops) that can fall from the nozzle section 30A is provided.

Figure 23:
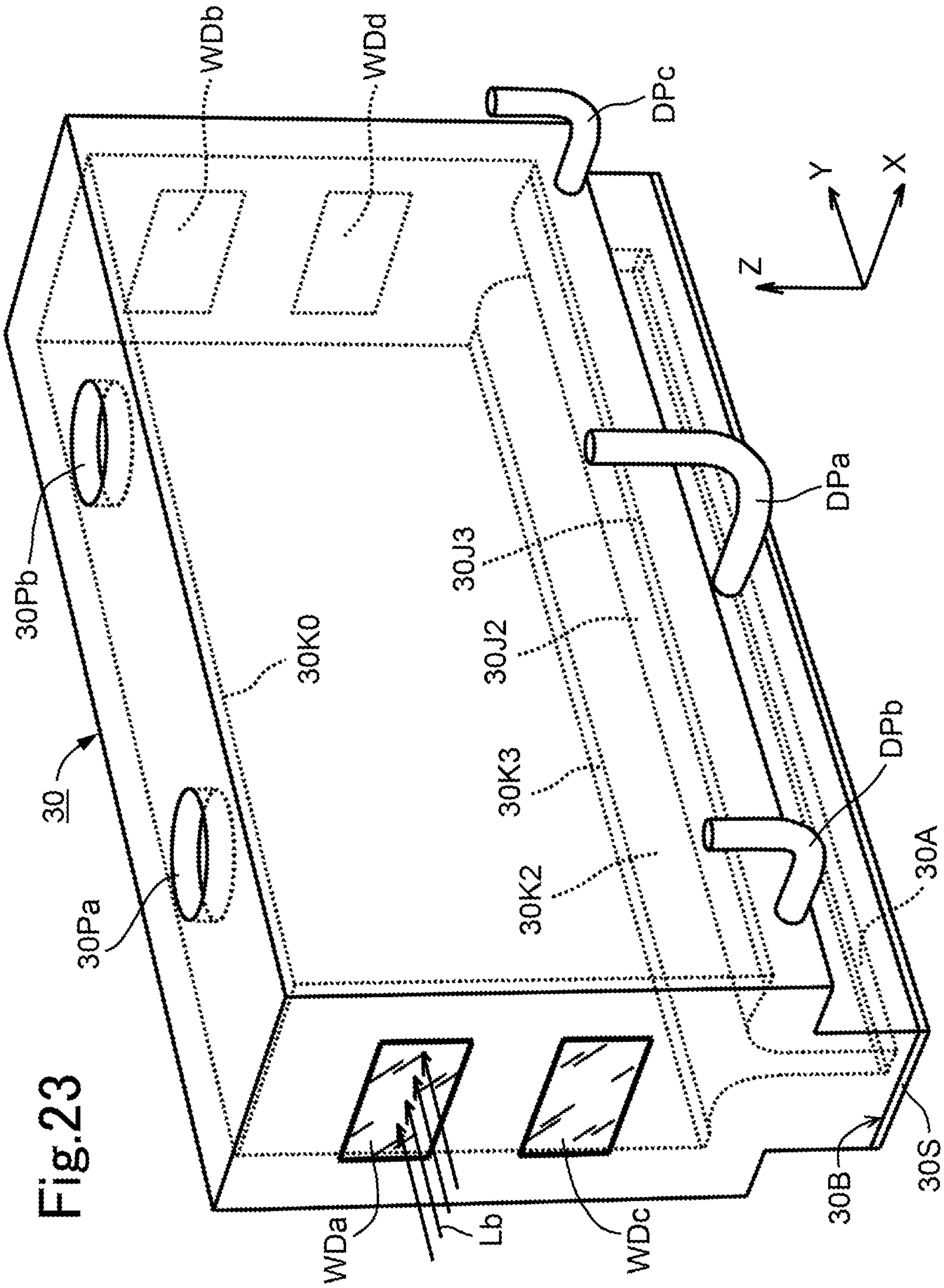
FIG. 23 is a perspective view of a schematic outer shape of the mist spouting section 30 of the mist deposition apparatus MDE according to a seventh modification.
Figure 24:
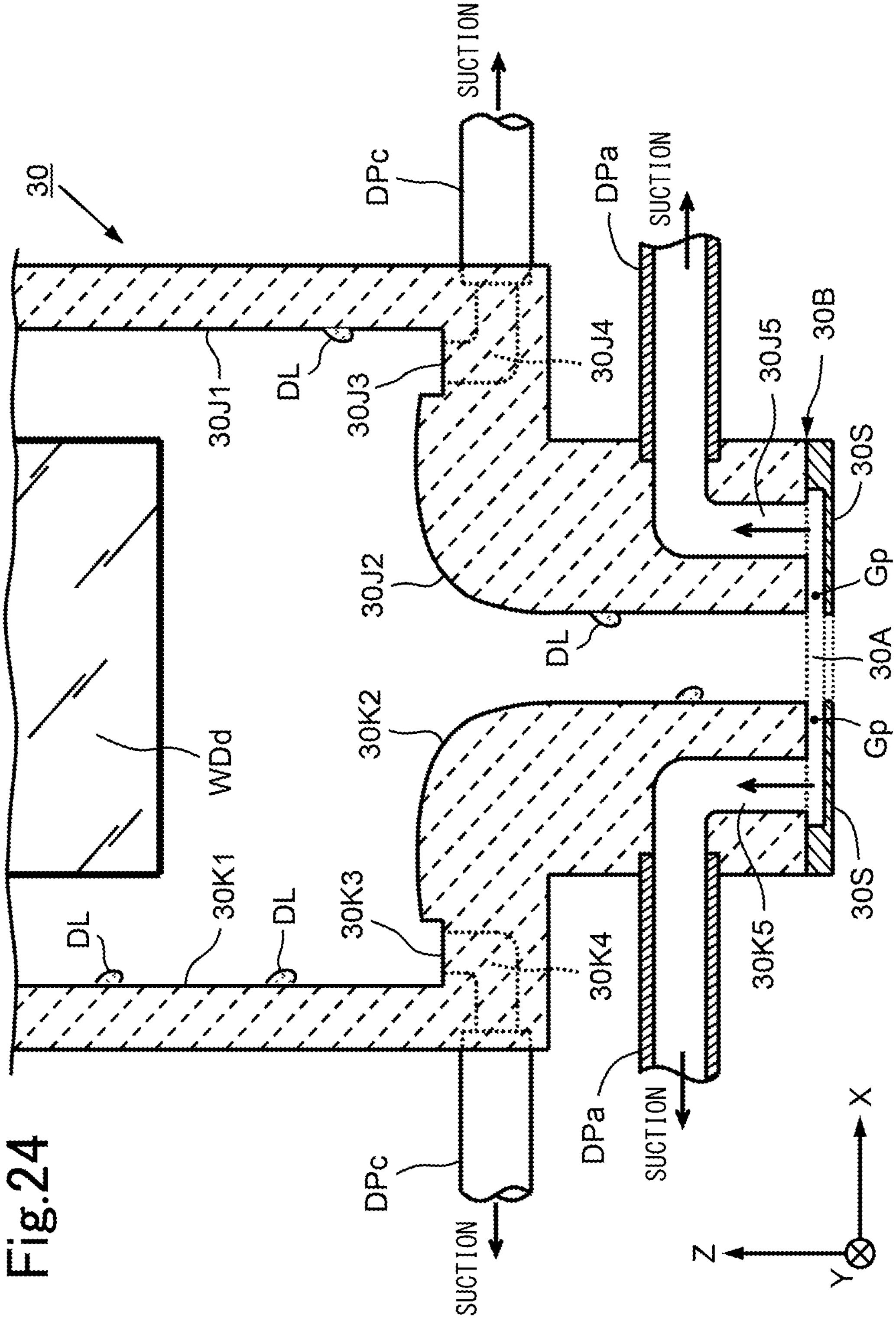
FIG. 24 is a partial cross-sectional view obtained by cutting the mist spouting section 30 of FIG. 23 near the longitudinal-direction (Y-direction) center thereof.

FIG. 23 is a perspective view showing an outer appearance of the mist spouting section 30 according to the seventh modification, and the shape of the overall outer appearance is approximately the same as that of the mist spouting section 30 of the first embodiment shown in FIGS. 2 to 4, with each coordinate axis of the XYZ orthogonal coordinate system being set in the same manner as in FIGS. 2 to 4. FIG. 24 is a cross-sectional view obtained by cutting the mist spouting section 30 of FIG. 23 near the Y-direction center thereof, along a plane (parallel to the XZ-plane) that is perpendicular to the Y-axis. In FIGS. 23 and 24, components having the same function as components of FIGS. 2 to 4 are given the same reference numerals. Furthermore, windows (window portions) WDa and WDc which are formed of quartz glass and into which the UV light Lb for mist modification (cleaning) can enter, via the illumination optical system formed by the fiber bundle FB4 described in the sixth modification of FIG. 22, for example, are provided in the −Y-direction-side wall surface of the mist spouting section 30 of the present modification, and windows (window portions) WDb and WDd which are formed of quartz glass and into which the UV light Lb can enter are similarly provided in the +Y-direction-side wall surface of the mist spouting section 30.

In a case where the UV light Lb is guided inside the mist spouting section 30 such as in the present modification, the UV light Lb is shaped into a parallel light flux collimated by the lens system, with the beam width thereof in the X direction being slightly smaller than the width of the window WDa. The UV light Lb incident in the +Y-direction from the window WDa positioned on the top side in the Z-direction is configured to be emitted from the window WDb on the opposite side without directly irradiating the inner wall of the mist spouting section 30. It is also possible to guide the UV light Lb similarly shaped into a parallel light flux to the pair of windows WDc and WDd provided downward in the Z-direction from the windows WDa and WDb, but the UV light Lb is configured to be incident from the window WDd toward the −Y-direction and emitted from the window WDc. In this way, in a case where the UV light Lb is guided inside the mist spouting section 30, the barrier walls of the chassis (container body) defining the internal space of the mist spouting section 30 are preferably made of a material that has light shielding properties with respect to the UV light Lb and is resistant to deterioration due to being irradiated with the UV light Lb, e.g. metal such as stainless steel or duralumin, ceramics, and the like. However, in a case where the region around the mist spouting section 30 is covered by light-shielding boards (light-shielding bodies or light-shielding paint) that block light in the wavelength range of the UV light Lb, the barrier walls of the chassis (container body) of the mist spouting section 30 itself do not need to have light-shielding properties.

In FIG. 4 above, the inner wall surfaces 30K2 and 30J2 connecting to the edge portions defining the slit-shaped opening of the nozzle section 30A formed in the bottom portion of the mist spouting section 30 are flat inclined surfaces that are inclined to become lower toward the nozzle section 30A side, as shown in FIG. 4 (or FIG. 11), but in the present modification, these inner wall surfaces are cylindrical curved surfaces that are curved in arc shapes as shown in FIG. 23. As described in detail with reference to FIG. 24, in order to temporarily hold the droplets that flow and fall along the vertical inner wall surfaces parallel to the YZ-plane (or XZ-plane) among the inner wall surfaces of the mist spouting section 30, depressions 30K3 and 30J3, which are shaped as slits extending in the Y-direction, are formed between the inner wall surface perpendicular to the YZ-plane and respective curved inner wall surfaces 30K2 and 30J2. The liquid resulting from the gathering of the droplets that have fallen into the depressions 30K3 and 30J3 are recovered (or disposed of) via discharge tubes DPb and DPc. Furthermore, in the present modification, a thin trap board 30S that captures the droplets flowing along the curved inner wall surfaces 30K2 and 30J2 and falling into the nozzle section 30A, using a capillary phenomenon, is provided in the bottom surface portion 30B of the mist spouting section 30. The droplets (liquid) captured by the trap board 30S are recovered (or disposed of) via a discharge tube DPa.

FIG. 24 is a cross section, seen from the +Y-direction side, of an end surface of the mist spouting section 30 cut along a plane parallel to the XZ-plane at a position of the discharge tube Dpa provided near the Y-direction center of the mist spouting section 30 in FIG. 23, and only the cross section of the lower half of the window WDd (WDc) in the Z-direction is shown here. When droplets DL flow down along the vertical inner wall surfaces 30K1 and 30J1 of the mist spouting section 30, these droplets DL are stored inside the slit-shaped depressions 30K3 and 30J3. The slit-shaped depressions 30K3 and 30J3 are each connected to the discharge tube DPc (same for the DPb) via respective flow paths 30K4 and 30J4 formed therein, and the discharge tube DPc (DPb) is connected to a decompression source (precision pump or the like) for suction. The suction operation via the discharge tube DPc (DPb) is performed for a prescribed time, at time intervals at which the droplets DL fall inside the depressions 30K3 and 30J3 to gather and pool inside the depressions 30K3 and 30J3. In this way, a droplet falling restriction mechanism is formed by the slit-shaped depressions 30K3 and 30J3 and the discharge tube DPc (DPb).

As shown in FIG. 24, the droplets DL that flow along the curved inner wall surfaces 30K2 and 30J2 and fall vertically toward the nozzle section 30A are sucked, by the capillary phenomenon, into the narrow gap Gp between the bottom surface portion 30B and the top surface of the thin trap board 30S provided on the bottom surface portion 30B of the mist spouting section 30. The trap board 30S has a silt-shaped opening with a shape and dimensions approximately the same as those of the nozzle section 30A, when viewed in the XY-plane, and is fixed to the bottom surface portion 30B such that the gap Gp is approximately 0.5 mm to 2 mm. The gap Gp is connected to the discharge tube DPa via flow paths 30K5 and 30J5 formed therein. The discharge tube DPa is connected to a decompression source (precision pump or the like) for suction, and the suction operation via the discharge tube DPa is performed for a prescribed time at time intervals at which the captured droplets come to be stored in the gap Gp. In this way, the trap board 30S and the discharge tube DPa function as a droplet falling restriction mechanism. In a case where plasma assistance is performed, electrode holding members 51A and 51B that hold the electrode rods 50A and 50B shown in FIG. 4 may be provided directly below the trap board 30S (in the −Z-direction). In such a case, the trap board 30S is also formed of a thin board with high insulation (plastic, acrylic, glass, or the like). In a case where plasma assistance is not performed, the trap board 30S may be a metal (stainless steel, duralumin, or the like) that is resistant to corrosion from the liquid of the mist.

In the configuration of the present modification described above, the inner wall surfaces 30K1, 30K2, 30J1, and 30J2 of the mist spouting section 30, the inner surfaces of the windows WDa, WDb, WDc, and WDd, and the inner surfaces of the depressions 30K3 and 30J3 are surface-processed to be in a highly liquid-repellent state (contact angle of 90 degrees or more). Meanwhile, the flat bottom surface of the bottom surface portion 30B of the mist spouting section 30 and the flat top surface of the trap board 30S are surface-processed to be strongly lyophilic (e.g. to have a contact angle of 10 degrees or less) in order for the droplets to be sucked easily into the gap Gp by the capillary phenomenon. Furthermore, the flat bottom surface (surface opposing the substrate P) of the trap board 30S is surface-processed to be strongly liquid repellent (e.g. to have a contact angle of 120 degrees or less) in order to restrict the adhesion of the mist in the carrier gas CGS. Furthermore, at least one of the droplet falling restriction mechanism formed by the slit-shaped depressions 30K3 and 30J3, the flow paths 30K4 and 30J4, and the discharge tubes DPc and DPb and the droplet falling restriction mechanism formed by the trap board 30S, the flow paths 30K5 and 30J5, and the discharge tube DPa can also be provided in the same manner to the mist spouting section shown in each of FIGS. 1 to 3, 11, and 16 above, and can also be provided in the same manner to the mist recovering section 32.

Since the carrier gas CGS containing the mist flows along the wall surfaces defining the internal space of the mist recovering section 32 as well, droplets DL can be formed on these wall surfaces. These droplets can flow along the wall surfaces and drop to the slit-shaped open edges of the recovery port section 32A (see FIG. 3) to drip onto the substrate P. As shown in FIGS. 23 and 24, if the droplet falling restriction mechanism is also provided inside the mist recovering section 32, the falling of the droplets onto the substrate P is restricted. Furthermore, the droplet falling restriction mechanism provided around the nozzle section 30A of the mist spouting section 30 (or the recovery port section 32A of the mist recovering section 32) may be a passive droplet suction mechanism in which a sheet material containing water-absorbent polymer or the like with high liquid absorption is installed to be replaceable in the bottom surface portion 30B of the mist spouting section 30, instead of using the trap board 30S of the active droplet suction mechanism realized by the trap board 30S and the discharge tube DPa.

Furthermore, as shown in the present modification (FIGS. 23 and 24) and FIGS. 4 and 11 above, in a case where the nozzle section 30A of the mist spouting section 30 is pointed downward (−Z-direction), there is a possibility of mist gathering and adhering as droplets near the openings of the supply ports 30Pa and 30Pb and the ceiling inner wall surface 30K0 of the mist spouting section 30, and of these droplets passing through the inside of the nozzle section 30A to fall directly onto the substrate P. Therefore, as described in FIG. 16 above, a configuration may be used in which the entire mist spouting section 30 is rotated (inclined) around the Y-axis to be inclined at a prescribed angle relative to the Z-axis in the XZ-plane. By doing this, even if the droplets adhered near the openings of the supply ports 30Pa and 30Pb and the ceiling inner wall surface 30K0 of the mist spouting section 30 fall in the −Z-direction (vertical direction), these droplets fall somewhere on the inner wall surface of the mist spouting section 30. As shown in FIG. 24, the droplets that have fallen somewhere on the inner wall surface fall along the inner wall surface and are ultimately sucked in by the droplet falling restriction mechanism (trap board 30S or the like) provided around the nozzle section 30A of the mist spouting section 30.

Eighth Modification

Figure 25:
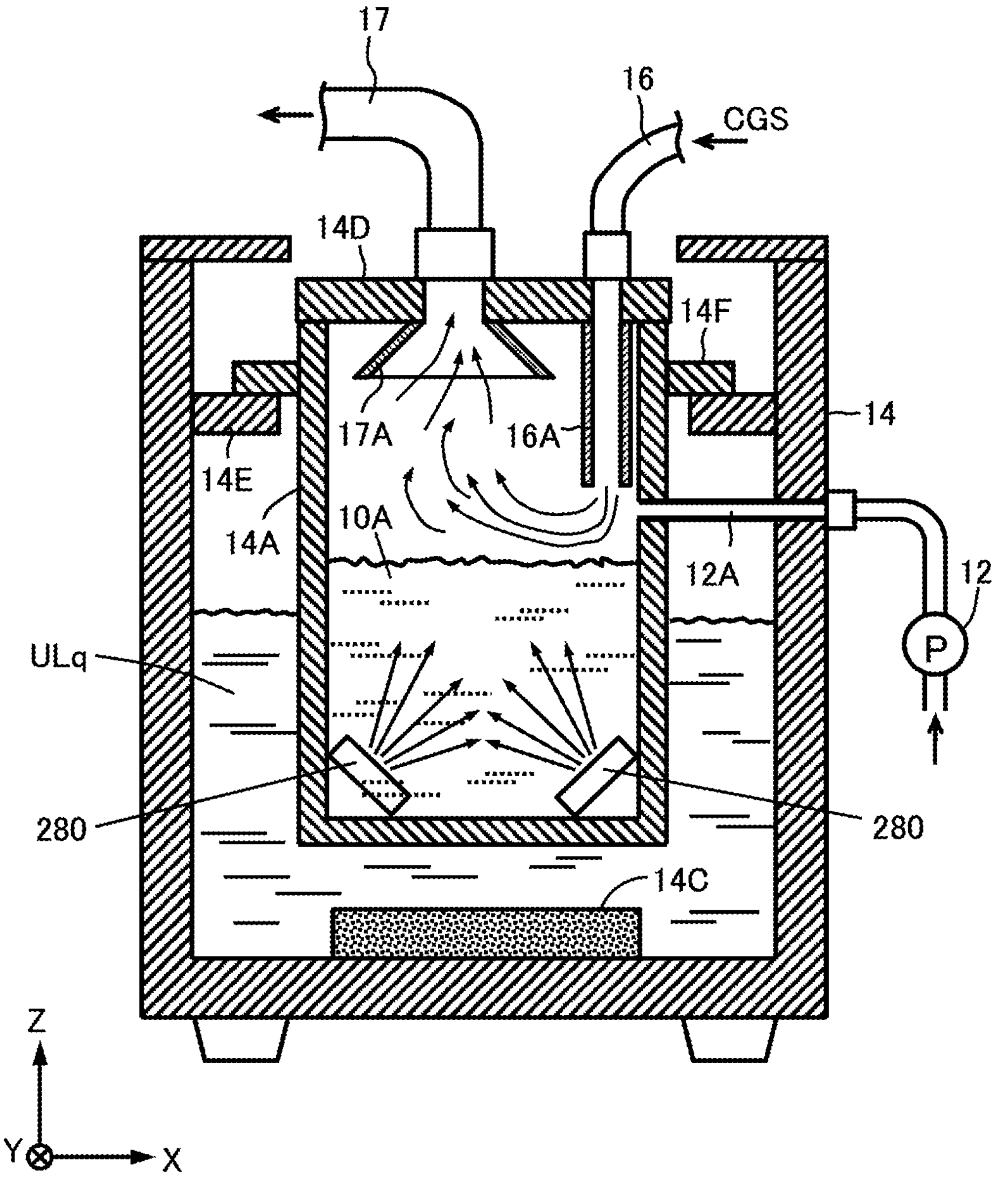
FIG. 25 is a partial cross-sectional view showing a schematic configuration of a mist generating section 14 of the mist deposition apparatus MDE according to an eighth modification.

In each of the embodiments and modifications described above, the carrier gas CGS (mist gas) containing the mist is irradiated with UV light having a vacuum ultraviolet wavelength (deep ultraviolet wavelength) of 200 nm or less, which has an ultraviolet cleaning effect. In the present modification, UV light having an ultraviolet cleaning effect is also radiated toward the solution inside an inner container (cup) 14A in the mist generating section 14 shown in FIG. 1. FIG. 25 is a partial cross section showing a schematic configuration of the mist generating section 14 according to the present modification, and components that have the same function as components inside or connected to the mist generating section 14 of FIG. 1 are given the same reference numerals.

The cylindrical outer container, which is the chassis of the mist generating section 14, is filled with pure water ULq in which the inner container 14A is submerged to a prescribed depth, and an ultrasonic oscillator 14C, for generating the mist from a solution 10A inside the inner container 14A, is provided at the bottom portion of the outer container. The outer container and the inner container 14A are connected by flange portions 14E and 14F, via an elastic member (rubber or the like). The solution 10A in which the nanoparticles are dispersed is supplied from the precision pump 12, shown in FIG. 1 as well, to the inside of the inner container 14A through a pipe 12A, either intermittently or continuously. With the inside of the inner container 14A being sealed by a ceiling board member 14D, the mist generated from the liquid surface of the solution 10A by the ultrasonic oscillator 14C travels with the carrier gas CGS supplied through the pipe 16 attached to the ceiling board member 14D to be discharged from the pipe 17 attached to the ceiling board member 14D.

In order for the Z-direction interval (spatial distance) between the liquid surface of the solution 10A in the inner container 14A and the ceiling board member 14D to be approximately constant, the precision pump 12 supplies the solution 10A based on a detection signal from a liquid surface sensor (not shown in the drawings), to maintain the height of the liquid surface of the solution 10A inside the inner container 14A at an approximately constant level. The bottom surface of the ceiling board member 14D is provided with a duct portion 16A that guides the carrier gas CGS from the pipe 16 to a region near the liquid surface of the solution 10A, and a funnel portion 17A that efficiently collects the carrier gas CGS containing the mist and having risen up, and sends this carrier gas CGS to the pipe 17.

In the present modification, one or more waterproof solid UV light sources 280 are provided submerged in the solution 10A in the inner container 14A. The solid UV light source 280 is an LED light source that generates ultraviolet light with a wavelength of 200 nm to 400 nm, and can be a waterproof UV-LED module or the like that is sold commercially from LG Innotek, for sterilizing bacteria or the like generated in the water purifier. In this way, by irradiating the solution 10A with ultraviolet rays, it is possible to decompose and clean the impurities (organic substances) contained in the solution 10A before the solution becomes a mist. In a case where the inner container 14A is formed of quartz or the like that has high transmittance with respect to ultraviolet rays, the solid UV light source 280 may be arranged within the pure water ULq filling the outer container, which is outside the inner counter 14A, and the solution 10A may be irradiated with the ultraviolet rays through the side wall surface of the inner container 14A.

Other Modifications

In each of the embodiments and modifications described above, the surface of the substrate P serving as the deposition target for the mist deposition is preferably surface-processed to be lyophilic with respect to the mist. However, in a case where a region on the surface of the substrate P where mist deposition is not to be intentionally performed is set, a superhydrophobic film may be formed or a cover layer that can be easily removed in a later step may be formed on the surface of this region by selective patterning. As an example of this, as disclosed in International Publication WO 2013/176222, the mist deposition may be performed after coating the surface of the substrate P with a photosensitive silane coupling agent having nitrobenzyl with a fluorine group with a liquid-repellent property, and exposing a photosensitive layer formed of the photosensitive silane coupling agent in a pattern of an electronic device or the like with an exposure apparatus using ultraviolet rays (i rays) having a wavelength of 365 nm so that the surface of the substrate P has lyophilic/lyophobic properties corresponding to the pattern.

In each of the embodiments and modifications above, the mist deposition is performed while feeding the substrate P, which is a long sheet substrate, in the longitudinal direction in a flat state, but, as disclosed in International Publication WO 2016/133131, for example, a configuration may be used in which the mist is sprayed from the mist spouting section 30 toward the surface of the substrate P supported in a cylindrical shape by the outer circumferential surface of a rotating drum, while the long substrate P is being fed in the longitudinal direction in a state of being wrapped around the cylindrical outer circumferential surface of the rotating drum. Furthermore, a plurality of the mist spouting sections 30 may be lined up along the feeding direction of the substrate P.

In each of the configurations shown in FIGS. 1 to 4, 11, and 16, the carrier gas CGS traveling from the nozzle section 30A of the mist spouting section 30 toward the substrate P is sprayed from a direction perpendicular to the surface of the substrate P, but this spraying direction may be inclined around the Y-axis in a prescribed angular range (e.g. 10 degrees to 45 degrees) from being perpendicular to the surface of the substrate P.

As described above, while the mist deposition is performed for a long time, nanoparticles are adhered to or deposited on the inner circumferential surfaces and outer circumferential surfaces of the quartz pipes 240 and 250 forming the flow path section 20A of the mist modifying section 20 shown in FIGS. 12, 14, and 19. Therefore, a mechanism may be provided in which a wiper member that periodically wipes away the adhered nanoparticles is movable inside the quartz pipe 240 and the quartz pipe 250.

The mist deposition apparatus MDE shown in FIGS. 11 and 16 is configured to radiate the UV light Lc while performing the mist deposition on the substrate P in the space covered by the air guiding member 31, but since the bottom surface of the quartz board 74 (window passing the UV light Lc) serving as the thermal insulation member 77 arranged between the substrate P and the UV irradiation unit (UV light source unit) 70 is constantly exposed to the mist, nanoparticles can become adhered thereto or deposited thereon gradually over time. Therefore, it is possible to provide a configuration in which it is possible to easily replace the entire thermal insulation member 77 or the quartz board 74, or to provide a wiper member or cleaning mechanism that removes (wipes away) nanoparticles adhered to the quartz board 74 serving as the thermal insulation member 77.

Furthermore, the low-pressure mercury discharge lamps 210A to 210F and 72 used as the light sources that emit the UV light having an ultraviolet cleaning effect and a vacuum ultraviolet wavelength (deep ultraviolet wavelength) of 200 nm or less may be types other than rod-shaped types, such as U-shaped tube types or surface irradiation types. Yet further, the cleaning effect can be strengthened by causing the UV light irradiating the mist in the carrier gas CGS and the surface of the substrate P to be a spectral component in the vacuum ultraviolet wavelength range having a wavelength of 200 nm or less, but depending on the material and particle size of the nanoparticles contained in the mist, the cleaning effect (modifying effect) can be further strengthened by changing the UV light to ultraviolet rays of a spectral component with a wavelength between 200 nm and 400 nm, or radiating both ultraviolet rays of a spectral component with a wavelength between 200 nm and 400 nm and ultraviolet rays of a spectral component in the vacuum ultraviolet wavelength range with a wavelength of 200 nm or less. Also, the irradiation of the mist gas CGS with the UV light in the vacuum ultraviolet wavelength range with a wavelength of 200 nm or less realizing the ultraviolet cleaning effect may be performed on the mist immediately after the mist is generated inside the mist generating section 14 shown in FIG. 1 or 25.

The nanoparticles capable of being deposited by the mist deposition apparatus MDE can be, in addition to the ITO particles used in the above examples, nanoparticles of various materials (conductive materials, insulating materials, or semiconductor materials). Nanoparticles are usually particles that have sizes less than 100 nm, but in the mist deposition, the nanoparticle size only needs to be less than the mist particles size (several micrometers to a dozen micrometers), to be able to be captured inside the mist and float along with the carrier gas CGS. Such nanoparticles can be, among metal types, gold nanoparticles, platinum nanoparticles, silver nanoparticles, copper nanoparticles, carbon nanorods refined into good conductors, and the like; among oxide types, iron oxide nanoparticles, zinc oxide nanoparticles, silicon oxide (silica) nanoparticles, and the like; and among nitride types, silicon nitride nanoparticles, aluminum nitride nanoparticles, and the like. Furthermore, carbon nanorods, silicon nanoparticles, and the like refined into semiconductors can also be used as semiconductor types. The silicon nanoparticles may be silicon nanoparticles terminated with hydrocarbon molecules and formed (coated) on the surface of a semiconductor layer forming a pn-junction solar cell to improve efficiency, such as disclosed in International Publication WO 2016/185978, for example.

The mist generating section 14 shown in FIG. 1 employs the ultrasonic atomization method using the ultrasonic oscillator 14C, but in a case where the temperature of the mist (carrier gas CGS) sprayed onto the substrate P may be increased, a heating atomization method may be used in which a solution (pure water or the like) containing fine particles is heated with a heater to generate the mist from the liquid surface of the solution. In the opposite manner, in a case where there is a desire to lower the temperature of the mist (carrier gas CGS) sprayed onto the substrate P, an atomization method may be used in which granularly crushed dry ice is added to a solution (pure water or the like) containing fine particles at appropriate time intervals to generate the mist from the liquid surface of the solution. In such a case, in a process in which the dry ice grains melt, cold carbon dioxide gas ($CO_2$) is generated and becomes the carrier gas CGS that carries the mist. Since the carbon dioxide gas has a higher specific gravity than air and is cold, this gas easily flows along the surface of the substrate P, and it is possible to increase the adhesion rate of the mist to the substrate P.

Fourth Embodiment

Figure 26:
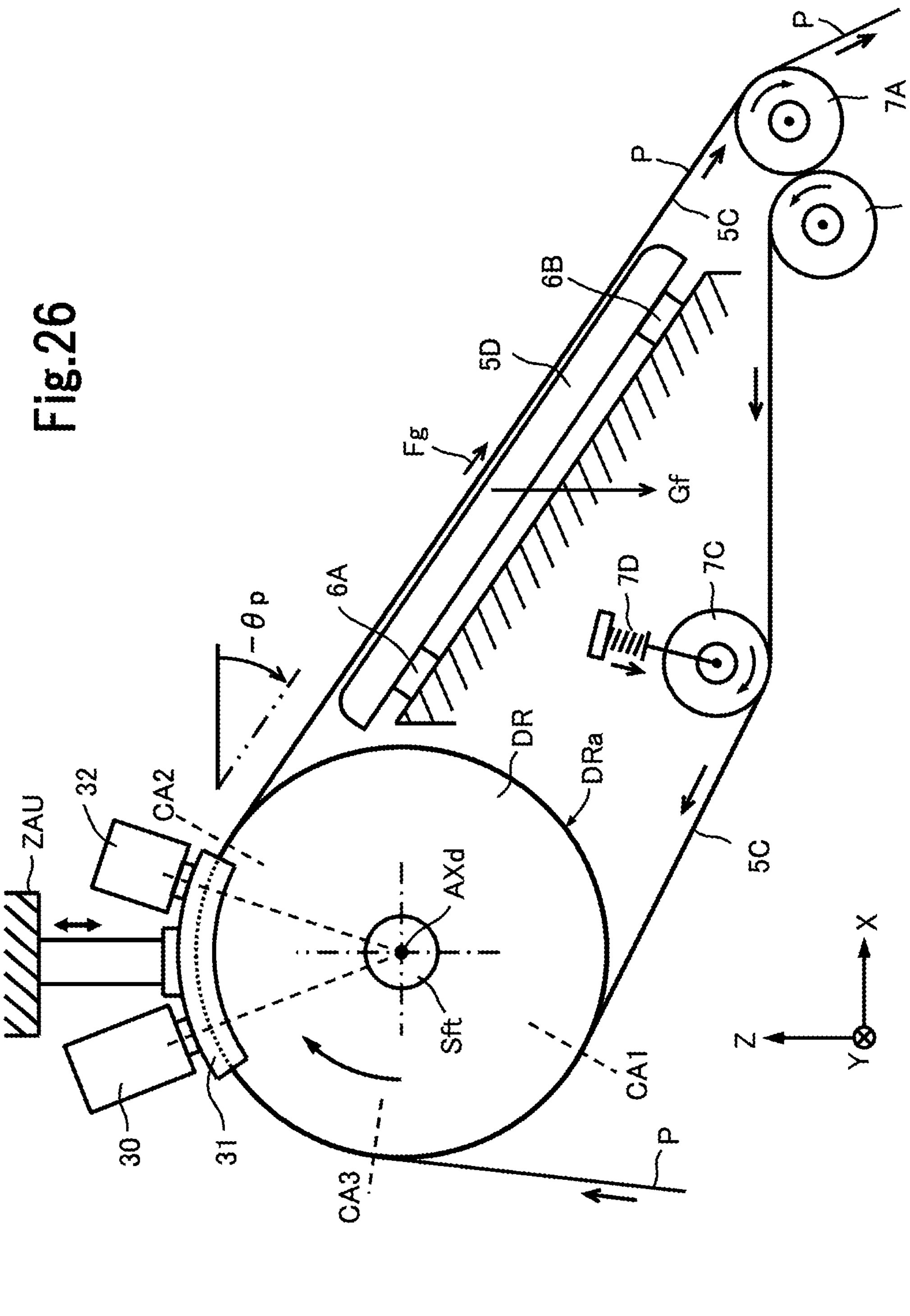
FIG. 26 is a front view showing the schematic configuration of the main portions of the mist deposition apparatus MDE according to a fourth embodiment.

FIG. 26 shows a schematic configuration of the mist deposition apparatus MDE shown in FIG. 1 above, in a case where a rolling method is applied, and the XYZ orthogonal coordinate system is set with the same orientation as in FIG.

1. In the present embodiment, the long sheet-shaped substrate P is fed in the longitudinal direction by a cylindrical rotating drum DR having a diameter of 20 cm to 60 cm. As shown in FIGS. 2, 11, and 16 above, in a case where the flexible sheet-shaped substrate P is supported in a flat state over a certain length in the longitudinal direction, the substrate P is fed in a state where a prescribed tension is applied thereto in the longitudinal direction so that the substrate P is stretched in a flat state. At this time, there is a concern that wrinkles (vertical wrinkles causing unevenness) extending in the longitudinal direction will occur on the substrate P at several locations in the width direction intersecting the longitudinal direction. When such wrinkles occur, unevenness in the thickness beyond the tolerable range can occur in the thin film layer formed by the fine particles mist-deposited on the surface of the substrate P. In contrast to this, in a case where the rotating drum DR is used, it is possible to feed the substrate P in the longitudinal direction using the rotation of the rotating drum DR, in a state where the back surface of the substrate P is supported in close contact on the outer circumferential surface of the rotating drum DR, i.e. a state where the surface of the substrate P is supported while being bent into a stable cylindrical shape.

In FIG. 26, the rotating drum DR bends in a cylindrical shape with a constant radius from the center axis AXd set parallel to the Y direction, and has an outer circumferential surface DRa that is longer than the width of the substrate P in the Y-direction. Shafts Sft that are coaxial with the center axis AXd are provided at both Y-direction end portions of the rotating drum DR, and the shafts Sft are axially supported by ball bearings or air bearings to be rotatable with respect to the apparatus body. The radius of the rotating drum DR from the center axis AXd is preferably in a range of 10 cm to 30 cm when the Y-direction width of the substrate P is 1 m or less. Furthermore, in the present embodiment, a pair of nip rollers 7A and 7B and one tension roller 7C, which have rotational center lines set parallel to the center axis AXd of the rotating drum DR, are arranged on the +X-direction side of the rotating drum DR. The endless belt 5C made of metal, such as shown in FIG. 2, is provided wrapped around each of the rotating drum DR, the pair of nip rollers 7A and 7B, and the tension roller 7C. In the present embodiment, the movement mechanism (feeding mechanism) that moves the substrate P in the longitudinal direction is formed by the rotating drum DR, the pair of nip rollers 7A and 7B, and the belt 5C.

In the XZ-plane, the rotating drum DR rotates clockwise centered on the center axis AXd, and the belt 5C is disposed in a manner to contact the outer circumferential surface DRa from an approach position CA1 in the circumferential direction of the outer circumferential surface DRa of the rotating drum DR and move away from the outer circumferential surface DRa at a separation position CA2 approximately half a lap ahead. The surface of the belt 5C travelling toward the nip roller 7A from the separation position CA2 is set to be inclined at an angle −θp relative to the XY-plane. The angle θp is set to be approximately 30 degrees to 60 degrees. The pair of nip rollers 7A and 7B are rotationally driven to feed the belt 5C at a constant velocity, by torque from a rotational motor, while gripping the front surface and back surface of the belt 5C with a prescribed nip pressure. The belt 5C that has passed through the nip rollers 7A and 7B is sent to the outer circumferential surface DRa of the rotating drum DR after contacting the tension roller 7C. The tension roller 7C applies a force, using a tension applying mechanism 7D, to the belt 5C between the nip roller 7B and the approach position CA1 of the rotating drum DR, so as to bias the belt 5C toward the outside of the endless orbit. Instead of causing one of the nip rollers 7A and 7B in the pair to be a driven roller that is rotated by the rotational motor, the rotating drum DR may be caused to rotate by the torque from the rotational motor.

The substrate P starts contacting the surface of the belt 5C, which is bent into a cylindrical shape, at the approach position CA3 downstream in the rotational direction from the approach position CA1 where the belt 5C approaches the rotating drum DR, is fed to a position of the nip roller 7A while firmly contacting the belt 5C, and is then fed to be separated from the belt 5C at the location of the nip roller 7A. Although not shown in the drawings, the substrate P is fed in the longitudinal direction at a velocity synchronized with the belt 5C, by the substrate feeding mechanism, with a prescribed tension being applied thereto in the longitudinal direction (feeding direction).

In the present embodiment, the air guiding member 31 shown in each of FIGS. 2, 11, and 16 above is molded to bend into an arc shape along the feeding direction of the substrate P in a manner to match the outer diameter (radius) of the outer circumferential surface DRa of the rotating drum DR, and is arranged to cover a portion of the outer circumferential surface DRa of the rotating drum DR on the +Z-direction side. The mist spouting section 30 is provided upstream from the air guiding member 31 in the rotating direction of the rotating drum DR, and the mist recovering section 32 is provided downstream from the air guiding member 31 in the rotating direction of the rotating drum DR. In the present embodiment as well, the carrier gas CGS containing the mist is spouted from the nozzle section 30A of the mist spouting section 30 toward the substrate P, flows through the internal space surrounded by the air guiding member 31 and the substrate P in the same direction as the rotating direction of the rotating drum DR, and is recovered at the recovery port section 32A of the mist recovering section 32. A pair of electrode rods 50A and 50B for plasma assistance may be arranged near the nozzle section 30A of the mist spouting section 30, in the same manner as in FIG. 3 above.

Furthermore, in the present embodiment, a drive mechanism ZAU that moves, in the Z-direction (up-down direction), the air guiding member 31 (mist deposition mechanism) integrally attached with the mist spouting section 30 and the mist recovering section 32 is provided for the work of mounting (threading) the substrate P along the belt 5C disposed around the outer circumferential surface DRa of the rotating drum DR, the work of cleaning the belt 5C and the rotating drum DR, the work of replacing the belt 5C, and the like. Furthermore, since the substrate P and the belt 5C are fed integrally in a flat state inclined at an angle −θp, from the separation position CA2 on the outer circumferential surface DRa of the rotating drum DR to the position of the nip roller 7A, it is possible to provide the support table 5D having the same configuration as shown in FIGS. 16 and 17 above. In such a case, the flat top surface (support surface 5Da on which a gas layer of an air bearing is formed) of the support table 5D is provided inclined at the angle −θp relative to the horizontal plane (XY plane), so as to face the back surface of the belt 5C in parallel thereto. The inclination angle −θp of the support table 5D is adjusted by the plurality of actuators 6A and 6B using piezoelectric elements or the like that expand and contract in response to voltage. An actuator 5S having the same configuration as shown in FIG. 17 above may be provided to the support surface 5Da of the support table 5D, to heat the substrate P along with the belt 5C and provide minute vibrations to the substrate P along with the belt 5C.

The present embodiment is configured such that the mist deposition is performed on the surface of the substrate P that has been bent into a cylindrical shape following the outer circumferential surface DRa (belt 5C) of the rotating drum DR. Therefore, it is possible to stabilize the feeding velocity of the substrate P in the mist deposition region (region covered by the air guiding member 31) to be a target value by controlling the rotational velocity of the rotating drum DR (belt 5C), and to easily reduce unevenness in the feeding velocity of the substrate P. Furthermore, the substrate P immediately after the mist deposition on the rotating drum DR is fed in a flat state over a certain length at the inclination angle −θp (θp=30 degrees to 60 degrees) relative to the horizontal plane. Therefore, due to the gravitational force Gf acting in the −Z-direction, a component force Fg directed diagonally downward along the surface of the substrate P acts on the entire liquid film adhered with a uniform thickness on the surface of the substrate P immediately after the deposition. Due to the effect of this component force Fg, while the liquid film gradually dries, it is possible to restrict the occurrence of drying unevenness whereby portions of the liquid film on the surface of the substrate P that have been completely dried (evaporated) and portions of the liquid film that remain as a liquid film are temporarily mixed together.

Such an effect can be obtained in the same manner with the configuration of the mist deposition apparatus shown in FIG. 16 above as well. The inclination angle −θp shown in FIG. 26 or the inclination angle θp shown in FIG. 16 is set to have a value whereby the liquid film immediately after deposition does not flow down the surface of the substrate P due to the effect of the component force Fg, by taking into consideration the degree of lyophilicity of the surface of the substrate P. Accordingly, for example, in a case where the surface of the substrate P is highly lyophilic and the liquid film is strongly adhered thereto, the absolute value of the inclination angle θp can be set to be 60 degrees or more.

The invention claimed is:

1. A mist deposition apparatus comprising:
- a mist generating section configured to generate mist that contains fine particles or molecules of a material substance;
- a mist spouting section through which the mist generated at the mist generating section flows, the mist spouting section being provided with a nozzle section through which the mist is supplied to an upper side of a substrate;
- a mist recovering section to recover at least a portion of the mist; and
- a first light irradiation section configured to irradiate the mist with first light
- wherein the mist spouting section is provided with an opening through which droplets of the mist that has been liquefied on an inner wall of the mist spouting section is discharged from the mist spouting section into the mist recovering section, and
- wherein the mist irradiated with the first light is supplied to the upper side of the substrate through the nozzle section.

2. The mist deposition apparatus according to claim 1, further comprising:
- an opposing member disposed above the substrate and having an opposing surface that opposes the surface of the substrate,
- wherein the nozzle section is configured to guide the mist irradiated with the first light, to a space between the surface of the substrate and the opposing surface.

3. The mist deposition apparatus according to claim 2, wherein the nozzle section of the mist spouting section is provided in the opposing member.

4. The mist deposition apparatus according to claim 1, wherein the first light irradiation section irradiates the mist inside the mist spouting section, with the first light.

5. The mist deposition apparatus according to claim 4, wherein:
- at least a portion of the mist spouting section is a light-transmitting member; and
- the first light irradiation section irradiates the light-transmitting member with the first light.

6. The mist deposition apparatus according to claim 1, wherein the mist spouting section allows a carrier gas containing the mist to pass therethrough alternately from a first direction to a second direction and from the second direction to the first direction.

7. The mist deposition apparatus according to claim 6, wherein the mist spouting section has a winding structure.

8. The mist deposition apparatus according to claim 1, wherein the mist spouting section is provided with a thermal insulation section configured to prevent a temperature change of the mist spouting section.

9. The mist deposition apparatus according to claim 1, wherein the mist spouting section is provided with a temperature adjusting section configured to adjust a temperature of the mist spouting section.

10. The mist deposition apparatus according to claim 1, wherein the mist spouting section has a wall surface made of quartz and shaped as a circular pipe or a flat surface.

11. The mist deposition apparatus according to claim 1, wherein a contact angle of the droplets of the mist relative to at least a portion of the inner wall of the mist spouting section is 90 degrees or more.

12. The mist deposition apparatus according to claim 1, wherein the first light is light having a wavelength of 400 nm or less.

13. The mist deposition apparatus according to claim 12, wherein the first light is light having a wavelength of 200 nm or less.

14. The mist deposition apparatus according to claim 1, further comprising a feeding section configured to feed the substrate.

15. The mist deposition apparatus according to claim 14, further comprising:
- a second light irradiation section configured to irradiate the surface of the substrate that is fed by the feeding section and is supplied with the mist, with second light.

16. The mist deposition apparatus according to claim 15, wherein the second light is light having a wavelength of 400 nm or less.

17. The mist deposition apparatus according to claim 16, wherein the second light is light having a wavelength of 200 nm or less.

18. The mist deposition apparatus according to claim 15, wherein:
- the second light irradiation section includes a second light source configured to generate the second light irradiating the mist; and the second light source is a low-pressure mercury discharge lamp that has a plurality of bright line spectra between wavelengths of 180 nm and 400 nm, an excimer discharge lamp that has a bright line spectrum at a wavelength of 172 nm, or a vacuum ultraviolet flash lamp that has xenon gas sealed therein and has a spectral distribution at a wavelength of 200 nm or less.

19. The mist deposition apparatus according to claim 15, wherein:

the second light irradiation section includes a second light source configured to generate the second light irradiating the mist; and the second light source is a laser light source configured to emit laser light having a wavelength of 200 nm or less.

20. The mist deposition apparatus according to claim 1, wherein:

the first light irradiation section includes a first light source configured to generate the first light irradiating the mist; and the first light source is a low-pressure mercury discharge lamp that has a plurality of bright line spectra between wavelengths of 180 nm and 400 nm, an excimer discharge lamp that has a bright line spectrum at a wavelength of 172 nm, or a vacuum ultraviolet flash lamp that has xenon gas sealed therein and has a spectral distribution at a wavelength of 200 nm or less.

21. The mist deposition apparatus according to claim 1, wherein:

the first light irradiation section includes a first light source configured to generate the first light irradiating the mist; and the first light source is a laser light source configured to emit laser light having a wavelength of 200 nm or less.

22. The mist deposition apparatus according to claim 1, wherein the mist generating section includes:

a first container that houses a liquid containing the fine particles;

a first vibration source configured to apply, to the first container, vibration having a first frequency and generating the mist from the liquid inside the first container; and a second vibration source configured to apply, to the liquid, vibration having a second frequency lower than the first frequency.

23. The mist deposition apparatus according to claim 1, wherein the mist spouting section includes an inner wall surface forming an internal space where a carrier gas containing the mist is stored.

24. The mist deposition apparatus according to claim 23, wherein the mist spouting section is provided with a droplet recovering section configured to recover droplets of the mist that has been liquefied inside the internal space.

* * * * *